US012805205B2

(12) United States Patent
Goto et al.

(10) Patent No.: US 12,805,205 B2
(45) Date of Patent: Nov. 17, 2026

(54) ELECTRONIC CIRCUIT, CALCULATION DEVICE, AND METHOD FOR MANUFACTURING THE ELECTRONIC CIRCUIT

(71) Applicant: KABUSHIKI KAISHA TOSHIBA, Tokyo (JP)

(72) Inventors: Hayato Goto, Kawasaki Kanagawa (JP); Yinghao Ho, Kawasaki Kanagawa (JP)

(73) Assignee: KABUSHIKI KAISHA TOSHIBA, Kawasaki Kanagawa (JP)

( * ) Notice: Subject to any disclaimer, the term of this patent is extended or adjusted under 35 U.S.C. 154(b) by 1097 days.

(21) Appl. No.: 17/860,055

(22) Filed: Jul. 7, 2022

(65) Prior Publication Data

US 2022/0376161 A1 Nov. 24, 2022

(30) Foreign Application Priority Data

Feb. 2, 2022 (JP) ................................ 2022-014637

(51) Int. Cl.
*H10N 60/80* (2023.01)
*G06N 10/40* (2022.01)
(Continued)

(52) U.S. Cl.
CPC ........... *H10N 60/805* (2023.02); *G06N 10/40* (2022.01); *H10N 60/0912* (2023.02); *H10N 60/12* (2023.02)

(58) Field of Classification Search
CPC .................................................... H10N 60/805
See application file for complete search history.

(56) References Cited

U.S. PATENT DOCUMENTS 10,424,712 B2 * 9/2019 Schoelkopf, III . H10N 60/0156
2010/0148853 A1 6/2010 Harris et al.
(Continued)

FOREIGN PATENT DOCUMENTS

CN 102378525 A 3/2012
CN 207678075 U 7/2018
(Continued)

OTHER PUBLICATIONS

Machine translation of JP 2018-11266 (Year: 2018).*
(Continued)

*Primary Examiner* — Paul A Wartalowicz
(74) *Attorney, Agent, or Firm* — Finnegan, Henderson, Farabow, Garrett & Dunner, LLP

(57) ABSTRACT

According to one embodiment, an electronic circuit includes a first nonlinear element, a second nonlinear element, and a third nonlinear element. The first nonlinear element includes a first element Josephson junction provided in a first region of a first surface including the first region and a second region. The second nonlinear element includes a second element Josephson junction provided in the second region. The third nonlinear element includes a Josephson junction circuit. At least a part of the Josephson junction circuit is provided on a second surface. The second surface is separated from the first surface in a first direction crossing the first surface. The second surface is along the first surface. The third nonlinear element is configured to be coupled with the first nonlinear element. The third nonlinear element is configured to be coupled with the second nonlinear element.

17 Claims, 28 Drawing Sheets

(51) Int. Cl.

| | |
|---|---|
| ***H10N 60/01*** | (2023.01) |
| ***H10N 60/12*** | (2023.01) |

(56) References Cited

U.S. PATENT DOCUMENTS

| | | | |
|---|---|---|---|
| 2015/0357550 | A1 | 12/2015 | Schoelkopf, III et al. |
| 2015/0372217 | A1 | 12/2015 | Schoelkopf, III et al. |
| 2017/0141286 | A1 | 5/2017 | Kerman |
| 2018/0019737 | A1 | 1/2018 | Goto |
| 2019/0019938 | A1 | 1/2019 | Braun |
| 2019/0214971 | A1 | 7/2019 | Keane |
| 2020/0229295 | A1 | 7/2020 | Keränen et al. |
| 2020/0403138 | A1 | 12/2020 | Chow et al. |
| 2022/0263467 | A1 | 8/2022 | Yamamoto et al. |

FOREIGN PATENT DOCUMENTS

| | | | |
|---|---|---|---|
| CN | 109784493 | A | 5/2019 |
| CN | 110268526 | A | 9/2019 |
| CN | 113273316 | A | 8/2021 |
| JP | 2016-511534 | A | 4/2016 |
| JP | 2018-11266 | A | 1/2018 |
| JP | 2021-511657 | A | 5/2021 |
| WO | WO 2021/014887 | A1 | 1/2021 |

OTHER PUBLICATIONS

J. Stehlik, et al., "Tunable Coupling Architecture for Fixed-Frequency Transmon Superconducting Qubits," Physical Review Letters 127, 080505, 6 pages (2021).

N. Moskalenko, et al., "Tunable coupling scheme for implementing two-qubit gates on fuxonium qubits," arXiv:2107.11550v2 [quant-ph], 14 pages (Sep. 26, 2021).

Japan Patent Office, Office Action in JP App. No. 2022-014637 (May 16, 2025).

J.E. Mooij et al., "Josephson Persistent-Current Qubit," Science, vol. 285, No. 5430, pp. 1036-1039, DOI: 10.1126/SCIENCE.285.5430.1036 (1999).

The State Intellectual Property Office of People's Republic of China, Office Action in CN App No. 202210897060.2 (Mar. 25, 2026).

Sha et al., "The Model of the Josephson Junction and its Applications in Superconductive Electronics," Journal of CAEIT, vol. 5, No. 5, p. 476-480 (2010).

* cited by examiner

ELECTRONIC CIRCUIT, CALCULATION DEVICE, AND METHOD FOR MANUFACTURING THE ELECTRONIC CIRCUIT

CROSS-REFERENCE TO RELATED APPLICATIONS

This application is based upon and claims the benefit of priority from Japanese Patent Application No. 2022-014637, filed on Feb. 2, 2022; the entire contents of which are incorporated herein by reference.

FIELD

Embodiments described herein relate generally to an electronic circuit, a calculation device, and a method for manufacturing the electronic circuit.

BACKGROUND

For example, an electronic circuit including multiple nonlinear elements is used in a calculation device. It is desired to improve the characteristics of the electronic circuit and the calculation device.

DETAILED DESCRIPTION

Figure 1A:
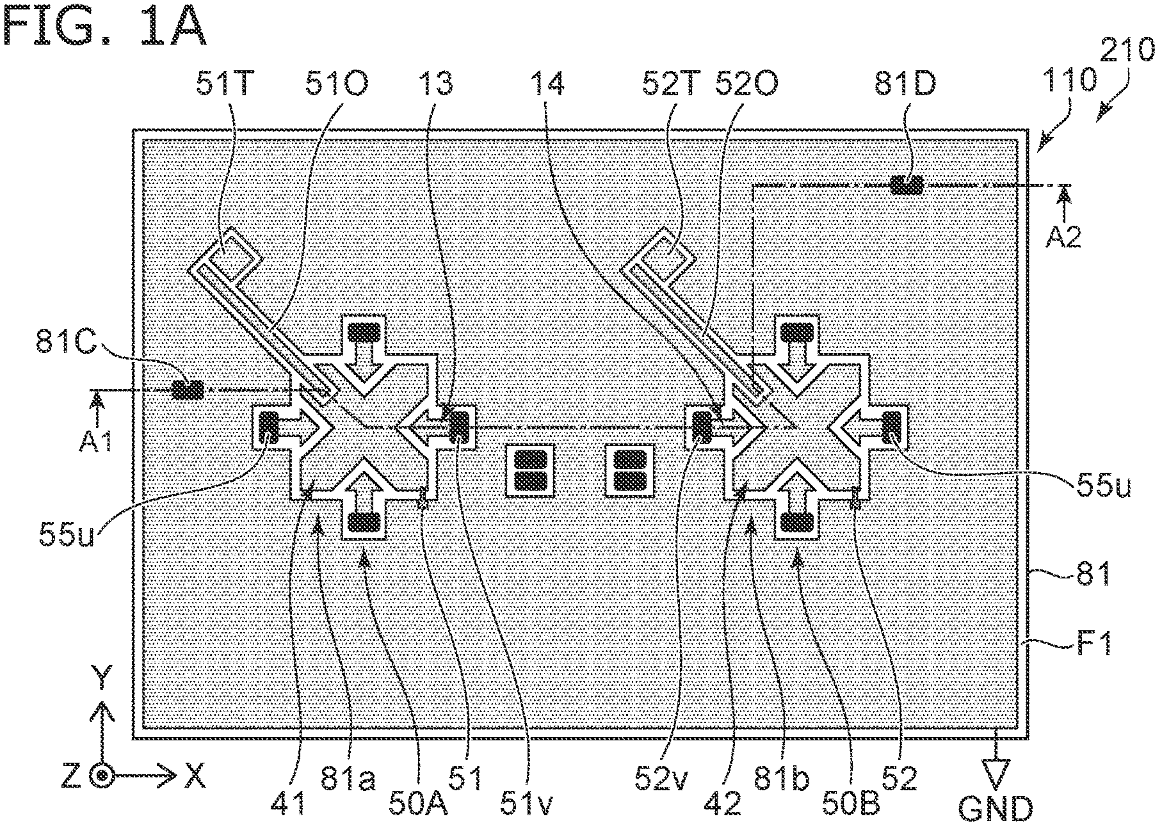
FIGS. 1A and 1B are schematic plan views illustrating an electronic circuit and a calculation device according to a first embodiment.

According to one embodiment, an electronic circuit includes a first nonlinear element, a second nonlinear element, and a third nonlinear element. The first nonlinear element includes a first element Josephson junction provided in a first region of a first surface including the first region and a second region. The second nonlinear element includes a second element Josephson junction provided in the second region. The third nonlinear element includes a Josephson junction circuit. At least a part of the Josephson junction circuit is provided on a second surface. The second surface is separated from the first surface in a first direction crossing the first surface. The second surface is along the first surface. The third nonlinear element is configured to be coupled with the first nonlinear element. The third nonlinear element is configured to be coupled with the second nonlinear element.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
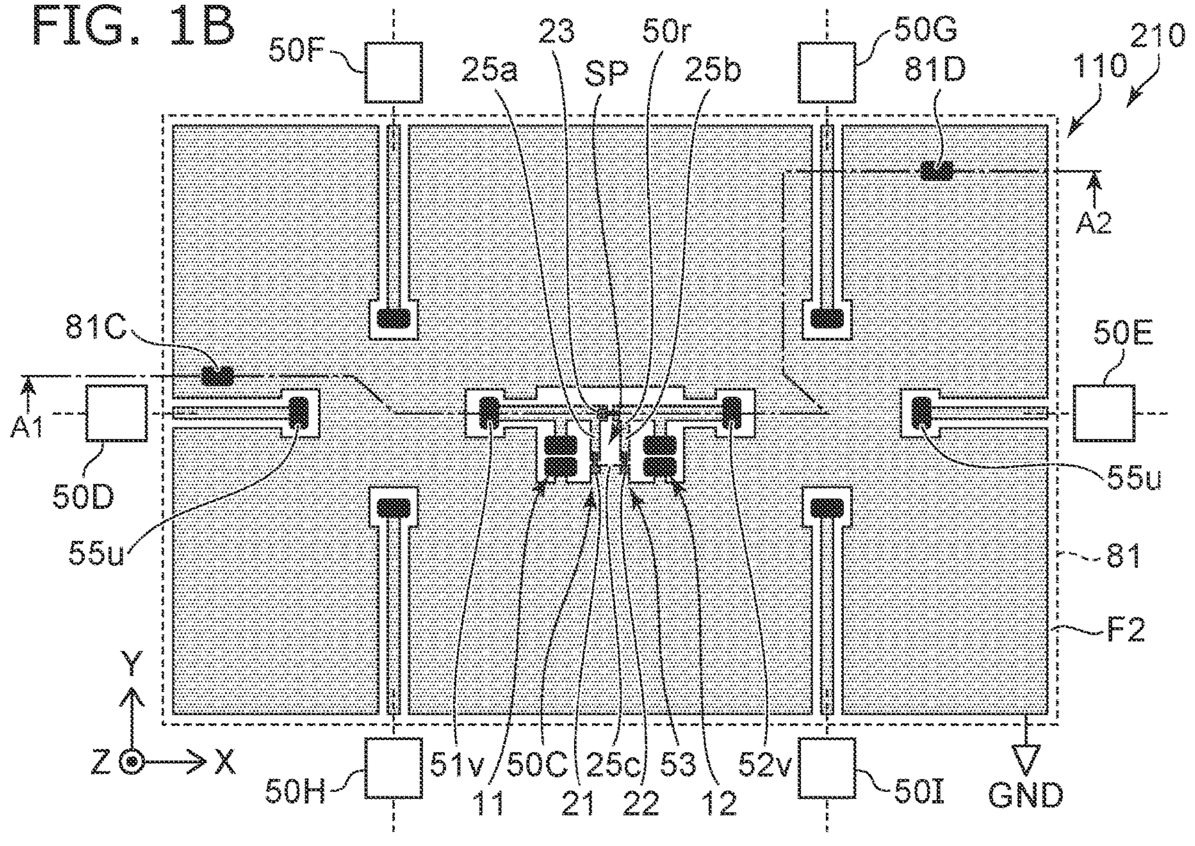

FIGS. 1A and 1B are schematic plan views illustrating an electronic circuit and a calculation device according to a first embodiment.

Figure 2:
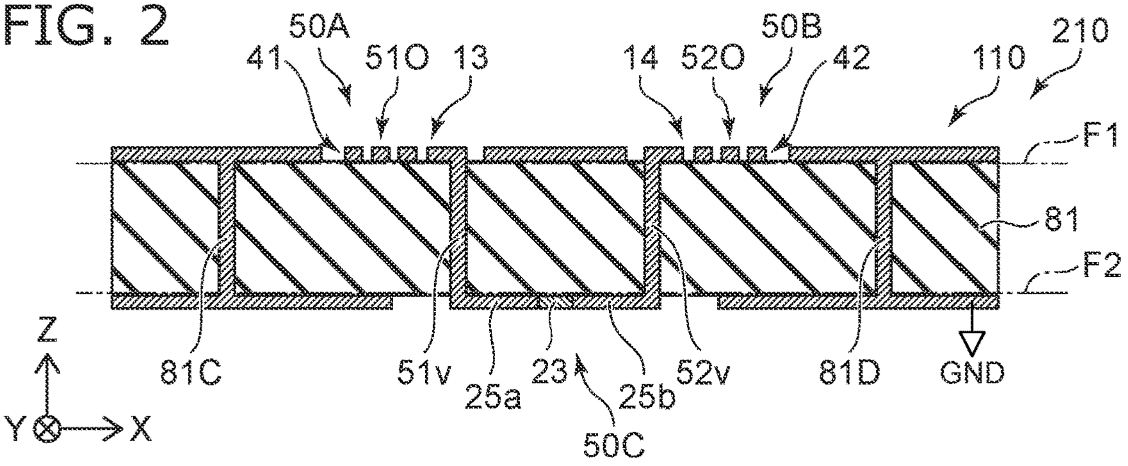
FIG. 2 is a schematic cross-sectional view illustrating the electronic circuit and the calculation device according to the first embodiment.

FIG. 2 is a schematic cross-sectional view illustrating the electronic circuit and the calculation device according to the first embodiment.

FIG. 2 is a cross-sectional view corresponding to lines A1-A2 of FIGS. 1A and 1B. In FIG. 2, the configuration of the cross section is conceptually illustrated, and a length in FIG. 2 does not necessarily match a length in FIGS. 1A and 1B.

As shown in FIGS. 1A, 1B and 2, an electronic circuit 110 according to the embodiment includes a first nonlinear element 50A, a second nonlinear element 50B and a third nonlinear element 50C. The electronic circuit 110 becomes at least a part of a calculation device 210.

At least a part of the first nonlinear element 50A is provided in a first region 81*a* of a first surface F1. At least a part of the second nonlinear element 50B is provided in a second region 81*b* of the first surface F1. At least a part of the third nonlinear element 50C is provided on a second surface F2.

The second surface F2 separates from the first surface F1 in a first direction. The second surface F2 is along the first surface F1. The second surface F2 is substantially parallel to the first surface F1. The first direction crosses the first surface F1.

In this example, the electronic circuit 110 includes the first substrate 81. The first surface F1 is one surface (for example, the upper surface) of the first substrate 81. The second surface F2 is another surface (for example, a lower surface) of the first substrate 81. FIG. 1B is a transmission plan view through which the first substrate 81 is transmitted.

A direction from the second surface F2 to the first surface F1 is defined as a Z-axis direction. One direction perpendicular to the Z-axis direction is defined as an X-axis direction. A direction perpendicular to the Z-axis direction and the X-axis direction is defined as a Y-axis direction. The first surface F1 and the second surface F2 are substantially parallel to an X-Y plane. The first direction described above corresponds to, for example, the Z-axis direction.

The first nonlinear element 50A includes a first element Josephson junction 51. The first element Josephson junction 51 is provided on the first surface F1. The second nonlinear element 50B includes a second element Josephson junction 52. The second element Josephson junction 52 is provided on the first surface F1. The above-mentioned at least a part of the first nonlinear element 50A includes, for example, the first element Josephson junction 51. The above-mentioned at least a part of the second nonlinear element 50B includes the second element Josephson junction 52.

The first nonlinear element 50A is one of multiple qubits provided in the calculation device 210. The second nonlinear element 50B is another one of the multiple qubits provided in the calculation device 210. These nonlinear elements are, for example, nonlinear resonators. The multiple qubits are, for example, transmon qubits.

The third nonlinear element 50C includes a Josephson junction circuit 53. At least a part of the Josephson junction circuit 53 is provided on the second surface F2. The above-mentioned at least a part of the third nonlinear element 50C includes, for example, the Josephson junction circuit 53.

The third nonlinear element 50C can be coupled with the first nonlinear element 50A. The third nonlinear element 50C can be coupled with the second nonlinear element 50B. The third nonlinear element 50C is, for example, a coupler. In the example of the electronic circuit 110, the third nonlinear element 50C can be coupled (for example, capacitive coupling) with the first nonlinear element 50A. The third nonlinear element 50C can be coupled (for example, capacitive coupling) with the second nonlinear element 50B.

In the embodiment, at least a part of the third nonlinear element 50C that functions as a coupler is provided on a surface different from the surface on which the first nonlinear element 50A and the second nonlinear element 50B that function as qubits are placed. For example, wiring between adjacent qubits may not be provided on the first surface F1. For example, wiring connection to a qubit becomes easy. For example, wiring between the qubits and the coupler may not be provided on the second surface F2. For example, it is easy to connect the wiring to the coupler. For example, crosstalk between wirings can be reduced. According to the embodiment, it is possible to provide an electronic circuit capable of improving extensibility. According to the embodiment, an electronic circuit and a calculation device capable of improving the characteristics can be provided.

For example, a reference example in which the qubits and the coupler are provided in the same surface can be considered. In this reference example, for example, access to the coupler may be difficult due to the qubits. In this reference example, access to the qubits may be difficult due to the coupler.

On the other hand, in the embodiment, the qubits and the coupler are provided on different surfaces. This makes, for example, access to the coupler and access to the qubits easier. Easy access stabilizes the qubit gate operation. For example, the stability of the qubits is improved. For example, it is easy to obtain a good idle state.

As shown in FIG. 1B, in this example, the Josephson junction circuit 53 includes a first Josephson junction 21, a second Josephson junction 22, and a third Josephson junction 23. The first Josephson junction 21, the second Josephson junction 22, and the third Josephson junction 23 are provided on the second surface F2. The third nonlinear element 50C further includes a first conductive member 25*a*, a second conductive member 25*b*, and a third conductive member 25*c*. The first conductive member 25*a* connects the first Josephson junction 21 with the third Josephson junction 23. The second conductive member 25*b* connects the second Josephson junction 22 with the third Josephson junction 23. The third conductive member 25*c* connects the first Josephson junction 21 with the second Josephson junction 22. These connections may be, for example, electrical connections. The first conductive member 25*a*, the second conductive member 25*b*, and the third conductive member 25*c* are, for example, superconductors.

The first Josephson junction 21, the second Josephson junction 22, the third Josephson junction 23, the first conductive member 25*a*, the second conductive member 25*b*, and the third conductive member 25*c* form a loop 50*r*. The first nonlinear element 50A can be coupled with the first conductive member 25*a*. The second nonlinear element 50B can be coupled with the second conductive member 25*b*. For example, the first nonlinear element 50A can be capacitively coupled with the first conductive member 25*a*. For example, the second nonlinear element 50B can be capacitively coupled with the second conductive member 25*b*.

Figure 3:
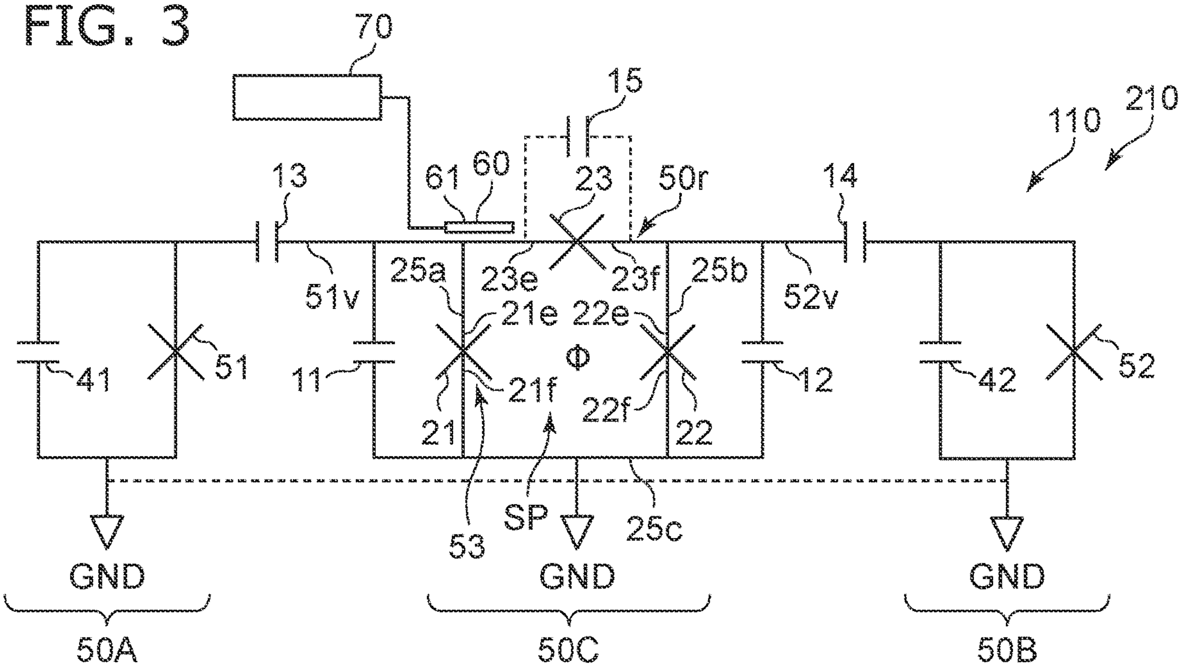
FIG. 3 is a schematic view illustrating the electronic circuit and the calculation device according to the first embodiment.

FIG. 3 is a schematic view illustrating the electronic circuit and the calculation device according to the first embodiment.

As shown in FIG. 3, the first conductive member 25*a* connects one end 21*e* of the first Josephson junction 21 to one end 23*e* of the third Josephson junction 23. The second conductive member 25*b* connects one end 22*e* of the second Josephson junction 22 to other end 23*f* of the third Josephson junction 23. The third conductive member 25*c* connects other end 21*f* of the first Josephson junction 21 to other end 22*f* of the second Josephson junction 22.

As shown in FIG. 3, in the electronic circuit 110, a first element capacitor 41 may be connected in parallel to the first element Josephson junction 51. A second element capacitor 42 may be connected in parallel to the second element Josephson junction 52.

A first capacitor 11 may be connected in parallel to the first Josephson junction 21. A second capacitor 12 may be connected in parallel to the second Josephson junction 22. For example, the first element Josephson junction 51 may be capacitively coupled with the first Josephson junction 21 and the third Josephson junction 23 via a third capacitor 13. For example, the second element Josephson junction 52 may be capacitively coupled with the second Josephson junction 22 and the third Josephson junction 23 via a fourth capacitor 14. A fifth capacitor 15 may be connected in parallel to the third Josephson junction 23.

As will be described later, the first Josephson junction 21 may be a first inductor. The second Josephson junction 22 may be a second inductor.

In this example, as shown in FIG. 1A, the third capacitor 13 and the fourth capacitor 14 are provided on the first surface F1. These capacitors are electrically connected to the conductive member provided on the second surface F2 by the via provided on the first substrate 81.

As shown in FIGS. 1A, 1B and 2, the electronic circuit 110 further includes a first element conductive portion 51*v* and a second element conductive portion 52*v*. The first element conductive portion 51*v* extends in the first substrate 81 in the first direction (Z-axis direction). The first element conductive portion 51*v* is electrically connected to the first nonlinear element 50A. Alternatively, the first element conductive portion 51*v* can be coupled (for example, capacitive coupling) with the first nonlinear element 50A. In this example, the first element conductive portion 51*v* is capacitively coupled with the first nonlinear element 50A via the third capacitor 13. The first element conductive portion 51*v* is electrically connected to the first conductive member 25*a*. Alternatively, the first element conductive portion 51*v* can be coupled (for example, capacitive coupling) with the first conductive member 25*a*. In this example, the first element conductive portion 51*v* is electrically connected to the first conductive member 25*a*.

The second element conductive portion 52*v* extends in the first substrate 81 in the first direction (Z-axis direction). The second element conductive portion 52*v* is electrically connected to the second nonlinear element 50B. Alternatively, the second element conductive portion 52*v* can be coupled (for example, capacitive coupling) with the second nonlinear element 50B. In this example, the second element conductive portion 52*v* is capacitively coupled with the second nonlinear element 50B via the fourth capacitor 14. The second element conductive portion 52*v* is electrically connected to the second conductive member 25*b*. Alternatively, the second element conductive portion 52*v* can be coupled (for example, capacitive coupling) with the second conductive member 25*b*. In this example, the second element conductive portion 52*v* is electrically connected to the second conductive member 25*b*.

The first element conductive portion 51*v* and the second element conductive portion 52*v* are, for example, TSVs (Through-Substrate Via). By connecting using TSVs, a high density and stable connection can be obtained.

Figure 4A:
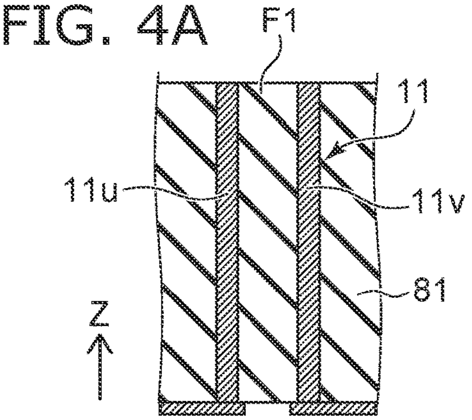
FIGS. 4A and 4B are schematic cross-sectional views illustrating a part of the electronic circuit according to the first embodiment.
Figure 4B:
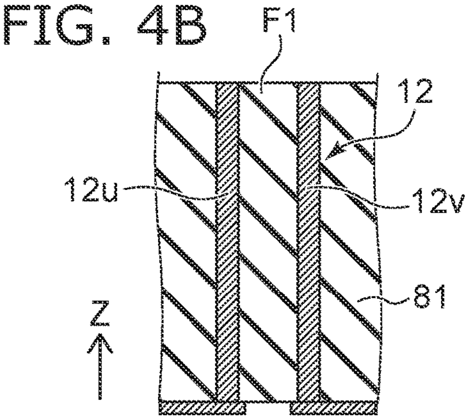

FIGS. 4A and 4B are schematic cross-sectional views illustrating a part of the electronic circuit according to the first embodiment.

FIG. 4A is a cross-sectional view of the first capacitor 11. FIG. 4B is a cross-sectional view of the second capacitor 12. As shown in FIG. 4A, the first capacitor 11 includes a conductive member 11*u* and a conductive member 11*v*. These conductive members extend in at least a part of the first substrate 81 along the first direction (Z-axis direction). As shown in FIG. 4B, the second capacitor 12 includes a conductive member 12*u* and a conductive member 12*v*. These conductive members extend in at least a part of the first substrate 81 along the first direction (Z-axis direction). By using these conductive members, a capacitor having a small area can be obtained. These conductive members may be TSVs.

As shown in FIG. 1A, in this example, the first element capacitor 41 and the second element capacitor 42 are provided on the first surface F1. These element capacitors may also be formed of a conductive member extending in the first substrate 81 in the Z-axis direction.

FIGS. 5A to 5E are schematic cross-sectional views illustrating a part of the electronic circuit according to the first embodiment.

Figure 5A:
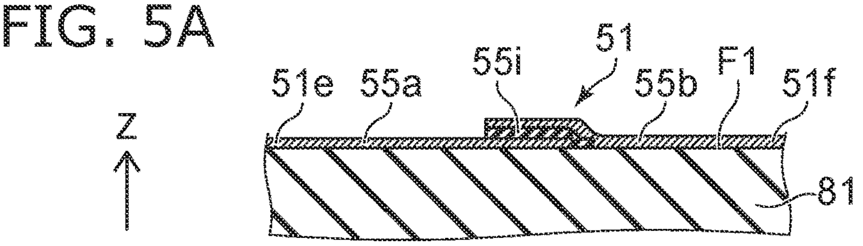
FIGS. 5A to 5E are schematic cross-sectional views illustrating a part of the electronic circuit according to the first embodiment.

As shown in FIG. 5A, the first element Josephson junction 51 includes, for example, a conductive film 55*a*, a conductive film 55*b*, and an insulating film 55*i*. The insulating film 55*i* is provided between a part of the conductive film 55*a* and a part of the conductive film 55*b*.

Figure 5B:
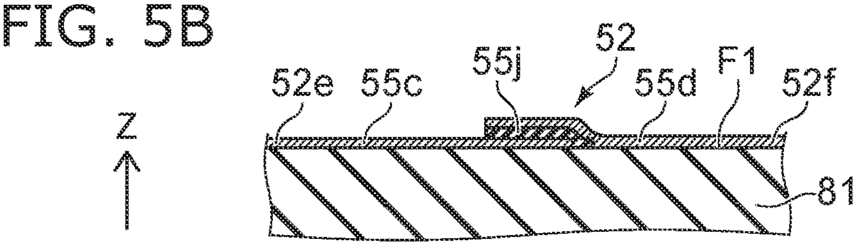

As shown in FIG. 5B, the second element Josephson junction 52 includes, for example, a conductive film 55*c*, a conductive film 55*d*, and an insulating film 55*j*. The insulating film 55*j* is provided between a part of the conductive film 55*c* and a part of the conductive film 55*d*.

Figure 5C:
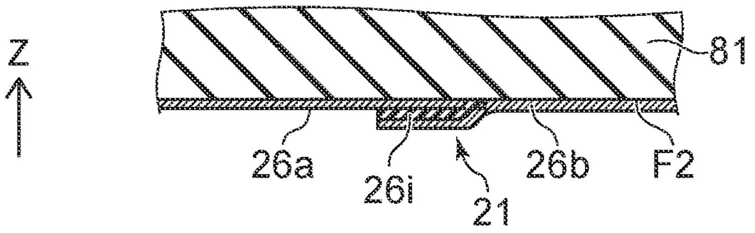

As shown in FIG. 5C, the first Josephson junction 21 includes, for example, a conductive film 26*a*, a conductive film 26*b*, and an insulating film 26*i*. The insulating film 26*i* is provided between a part of the conductive film 26*a* and a part of the conductive film 26*b*.

Figure 5D:
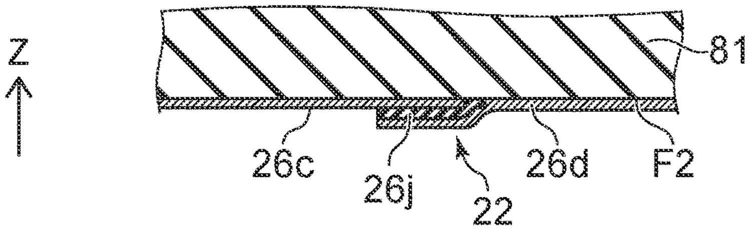

As shown in FIG. 5D, the second Josephson junction 22 includes, for example, a conductive film 26*c*, a conductive film 26*d*, and an insulating film 26*j*. The insulating film 26*j* is provided between a part of the conductive film 26*c* and a part of the conductive film 26*d*.

Figure 5E:
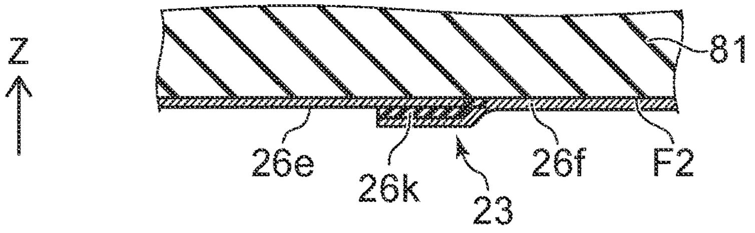

As shown in FIG. 5E, the third Josephson junction 23 includes, for example, a conductive film 26*e*, a conductive film 26*f*, and an insulating film 26*k*. The insulating film 26*k* is provided between a part of the conductive film 26*e* and a part of the conductive film 26*f*.

These conductive films include, for example, at least one selected from the group consisting of Al, Nb, NbN, TiN, NbTiN and Ta. These materials are superconducting materials. The insulating film includes, for example, at least one selected from the group consisting of $Al_2O_3$, $Nb_2O_5$, $NbO_2$, NbO and AlN. The first substrate 81 includes, for example, at least one selected from the group consisting of Si and sapphire. The first substrate 81 is, for example, insulating.

As shown in FIG. 1A, in this example, the electronic circuit 110 includes a first element resonator 510, a first element terminal 51T, a second element resonator 520, and a second element terminal 52T. The first element resonator

510 can be coupled (for example, capacitive coupling) with the first nonlinear element 50A. The first element terminal 51T can be coupled (for example, capacitive coupling) with the first element resonator 510. The second element resonator 520 can be coupled (for example, capacitive coupling) with the second nonlinear element 50B. The second element terminal 52T can be coupled (for example, capacitive coupling) with the second element resonator 520.

The state of the first nonlinear element 50A can be detected by the first element resonator 510 and the first element terminal 51T. A signal corresponding to the state of the first nonlinear element 50A can be acquired via the first element resonator 510 and the first element terminal 51T. The state of the second nonlinear element 50B can be detected by the second element resonator 520 and the second element terminal 52T. A signal corresponding to the state of the second nonlinear element 50B can be acquired via the second element resonator 520 and the second element terminal 52T. These element resonators and element terminals correspond to, for example, a read-out portion.

At least one of at least a part of the first element resonator 510, at least a part of the first element terminal 51T, at least a part of the second element resonator 520, or at least a part of the second element terminal 52T may be provided on the first surface F1.

As shown in FIG. 3, the electronic circuit 110 (calculation device 210) may include a magnetic flux controller 60. The magnetic flux controller 60 is configured to control a magnetic flux ϕ of the space SP in the loop 50*r*. For example, the magnetic flux controller 60 is configured to modulate the magnetic flux ϕ of the space SP.

As shown in FIG. 3, the calculation device 210 may include the electronic circuit 110 and a controller 70. The controller 70 is configured to control the magnetic flux controller 60. As a result, the controller 70 is configured to control the magnetic flux ϕ of the space SP.

In this example, the magnetic flux controller 60 includes a first control conductive member 61. The controller 70 is connected to the first control conductive member 61. A magnetic flux control signal is supplied from the controller 70 to the first control conductive member 61. A magnetic field corresponding to the magnetic flux control signal is generated from the first control conductive member 61. This magnetic field controls the magnetic flux ϕ of the space SP in the loop 50*r*. The first control conductive member 61 is an example of the magnetic flux controller 60. The controller 70 can change the magnetic flux ϕ by modulating the current supplied to the first control conductive member 61.

For example, the third nonlinear element 50C (coupler) has multiple modes (for example, two modes). In the embodiment, the resonant frequency of the multiple modes can be lowered. For example, it is easy to bring the resonant frequencies of the multiple modes close to the resonant frequencies of the first nonlinear element 50A and the resonant frequencies of the second nonlinear element 50B. This gives a strong coupling strength. According to the embodiment, controllability can be improved.

The coupling strength can be changed by controlling the magnetic flux ϕ. For example, the coupling strength can be made substantially zero, and the coupling can be decoupled (switched off). As will be described later, a two-qubit gate operation can be executed at high speed by controlling the third nonlinear element 50C (coupler). A coupler and a calculation device can be provided in which the controllability can be improved.

As shown in FIG. 1A, a conductive layer having a fixed potential (for example, ground potential GND) may be provided around the first nonlinear element 50A and the second nonlinear element 50B. As shown in FIG. 1B, a conductive layer having a fixed potential (for example, ground potential GND) may be provided around the third nonlinear element 50C.

As shown in FIG. 2, a conductive layer provided on the first surface F1 and set to a fixed potential (for example, ground potential GND) and a conductive layer provided on the second surface F2 and set to a fixed potential (for example, ground potential GND) may be electrically connected by a connection portion 81C and a connection portion 81D. These connection portions extend in the first substrate 81 along the Z-axis direction.

As shown in FIGS. 1A and 1B, the first nonlinear element 50A may be connected to another nonlinear element 50D via a conductive member 55*u*. As shown in FIGS. 1A and 1B, the second nonlinear element 50B may be connected to another nonlinear element 50E via a conductive member 55*v*. Another nonlinear element 50D and another nonlinear element 50E are, for example, couplers. Another nonlinear element 50D may be connected to yet another nonlinear element (not shown, another qubit). Another nonlinear element 50E may be connected to yet another nonlinear element (not shown, another qubit). The conductive member 55*u* and the conductive member 55*v* may extend, for example, in at least a part of the first substrate 81 in the Z-axis direction. These conductive members may be TSVs.

The first nonlinear element 50A may be connected to another nonlinear element 50F and another nonlinear element 50H. The second nonlinear element 50B may be connected to another nonlinear element 50G and another nonlinear element 50I. The nonlinear elements 50F, 50G, 50H and 501 are, for example, couplers. The nonlinear elements 50F, 50G, 50H and 501 may be connected to yet another nonlinear element (another qubit not shown).

The first nonlinear element 50A and the second nonlinear element 50B function as two qubits. Of multiple energy levels possessed by the first nonlinear element 50A and the second nonlinear element 50B, the two lowest levels of each nonlinear element can be used as the two states of the qubit. Of the multiple energy levels, the two lowest levels correspond to a ground state and a first excited state. The above two states of the qubits correspond to computational basis states. For example, the resonant frequency of the first nonlinear element 50A corresponds to a value of the energy difference between the two lowest states of the first nonlinear element 50A converted into a frequency. For example, the resonant frequency of the second nonlinear element 50B corresponds to a value of the energy difference between the two lowest states of the second nonlinear element 50B converted into a frequency. The energy can be converted into a frequency corresponding to the energy by dividing by Planck's constant.

As shown in FIG. 1, the third nonlinear element 50C (coupler 10) may include the first control conductive member 61. The first control conductive member 61 is configured to apply a magnetic field to the space SP (the loop 10*r*). For example, the magnetic field is generated by a current supplied to the first control conductive member 61. The magnetic field that is generated is applied to the space SP (the loop 10*r*). As described below, the coupling strength between the first nonlinear element 50A and the second nonlinear element 50B changes according to the magnetic flux ϕ in the space SP (the loop 10*r*) (the magnetic flux based on the magnetic field).

Figure 6:
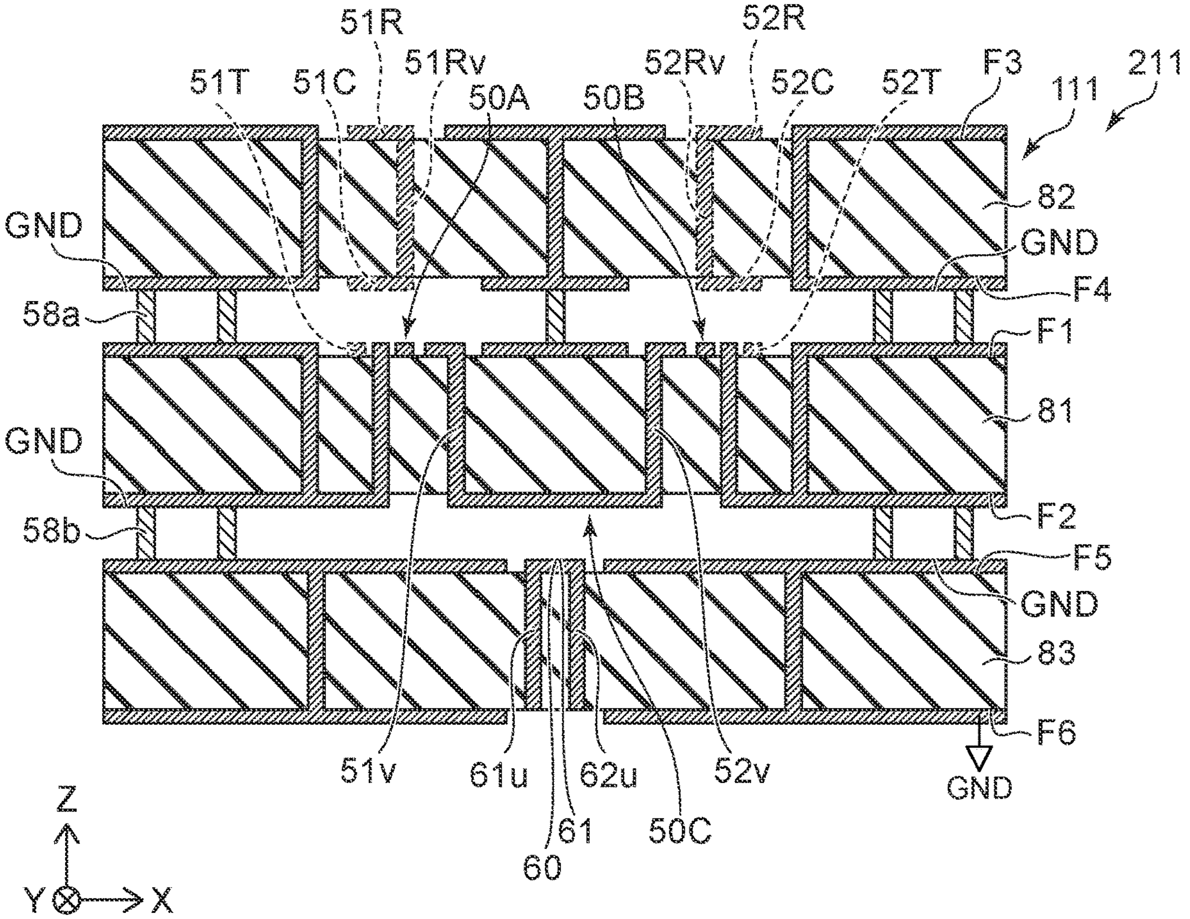
FIG. 6 is a schematic cross-sectional view illustrating an electronic circuit according to the first embodiment.

FIG. 6 is a schematic cross-sectional view illustrating an electronic circuit according to the first embodiment.

Figure 7A:
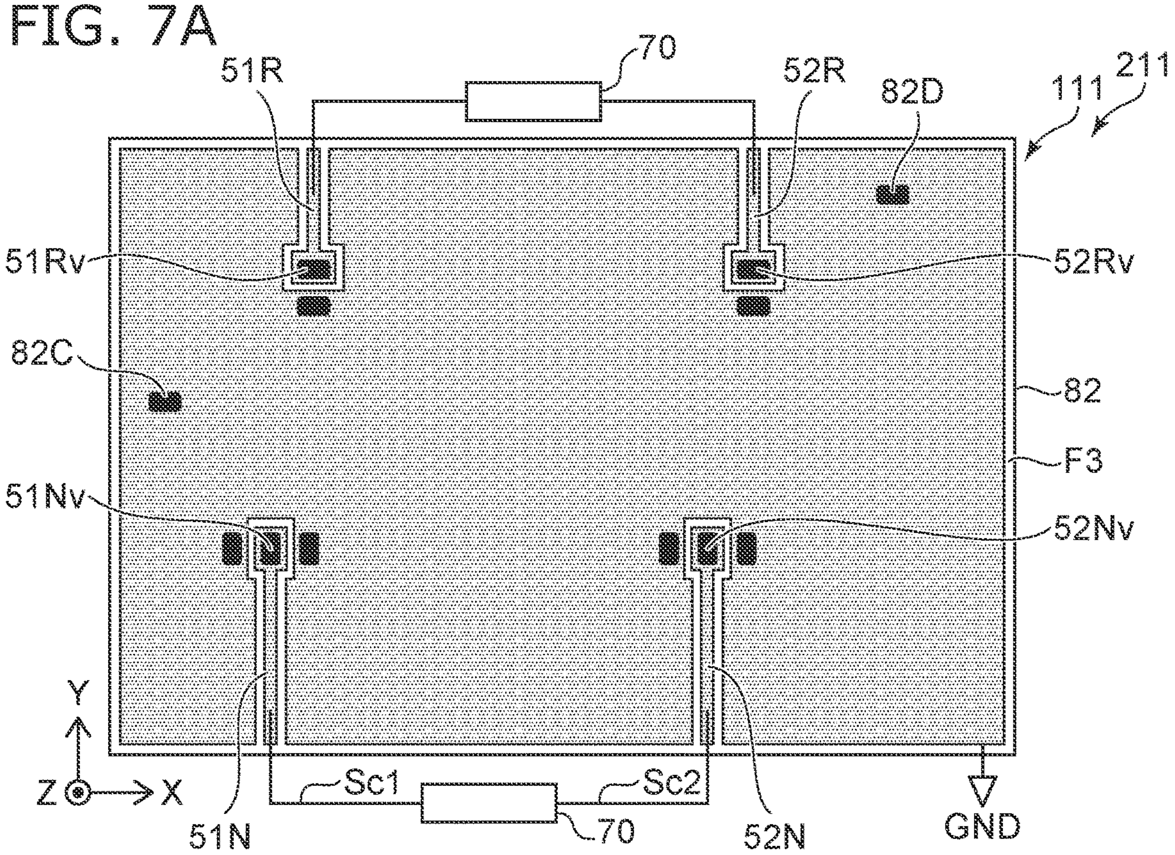
FIGS. 7A and 7B are schematic plan views illustrating a part of the electronic circuit according to the first embodiment.
Figure 7B:
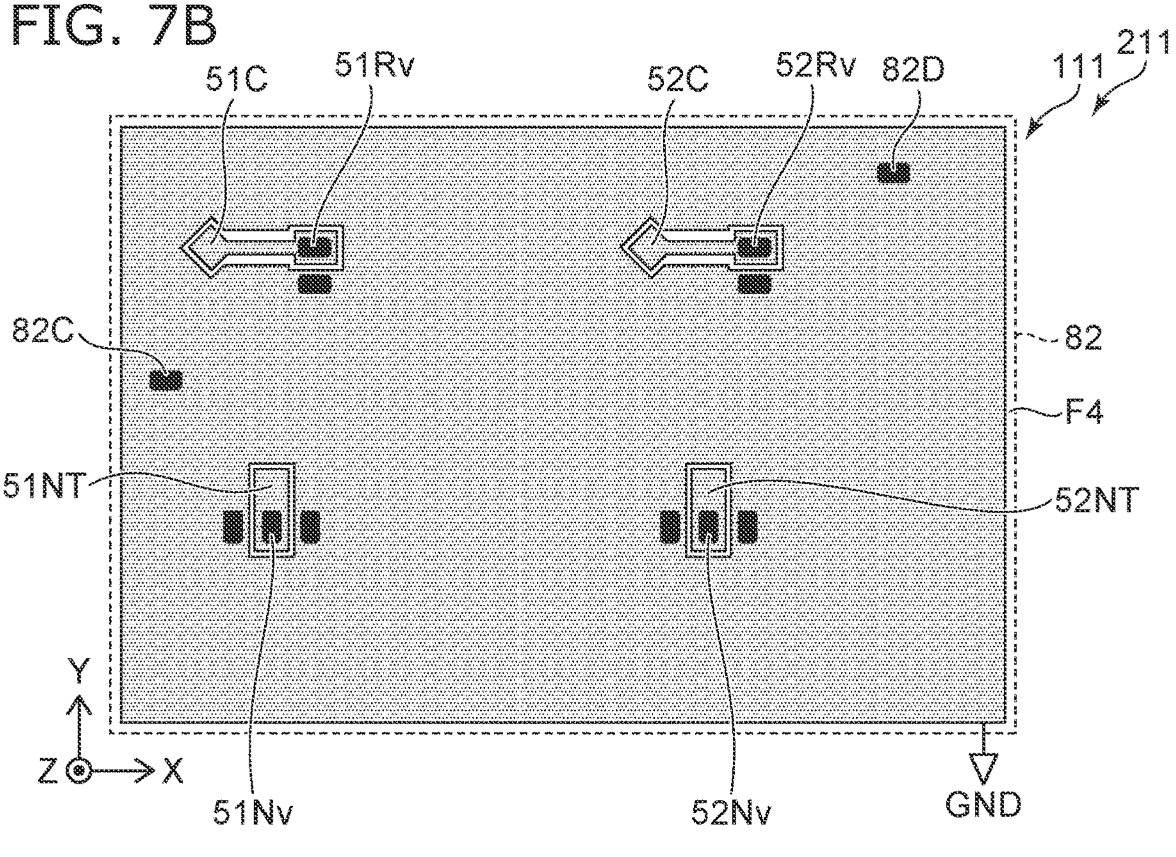

FIGS. 7A and 7B are schematic plan views illustrating a part of the electronic circuit according to the first embodiment.

As shown in FIG. 6, an electronic circuit 111 according to the embodiment includes a second substrate 82, a first counter electrode 51C, and a second counter electrode 52C. The configuration of the electronic circuit 111 excluding these may be the same as the configuration of the electronic circuit 110. The calculation device 211 includes the electronic circuit 111.

The second substrate 82 includes a third surface F3 and a fourth surface F4. The fourth surface F4 faces the first surface F1. The fourth surface F4 is between the first surface F1 and the third surface F3. The fourth surface F4 is, for example, a lower surface. The third surface F3 is, for example, an upper surface.

The first counter electrode 51C is provided on the fourth surface F4. The second counter electrode 52C is provided on the fourth surface F4. The first counter electrode 51C can be coupled (for example, capacitive coupling) with the first element terminal 51T. The second counter electrode 52C can be coupled (for example, capacitive coupling) with the second element terminal 52T.

As shown in FIGS. 6, 7A and 7B, a first read-out electrode 51R, a first read-out conductive portion 51Rv, a second read-out electrode 52R, and a second read-out conductive portion 52Rv may be provided. The first read-out electrode 51R and the second read-out electrode 52R are provided on the third surface F3. The first read-out conductive portion 51Rv extends in the second substrate 82 in the first direction (for example, the Z-axis direction). The first read-out conductive portion 51Rv electrically connects the first counter electrode 51C to the first read-out electrode 51R. The second read-out conductive portion 52Rv extends in the second substrate 82 in the first direction (for example, the Z-axis direction). The second read-out conductive portion 52Rv electrically connects the second counter electrode 52C to the second read-out electrode 52R.

As shown in FIG. 7A, the first read-out electrode 51R and the second read-out electrode 52R may be connected to the controller 70. The controller 70 is configured to acquire a signal corresponding to the state of the first nonlinear element 50A and a signal corresponding to the state of the second nonlinear element 50B through these electrodes.

As shown in FIG. 7B, a first control terminal 51NT and a second control terminal 52NT may be provided on the fourth surface F4. As shown in FIG. 7A, a first control electrode 51N and a second control electrode 52N may be provided on the third surface F3. The first control terminal 51NT is connected to the first control electrode 51N via a conductive portion 51Nv. The second control terminal 52NT is connected to the second control electrode 52N via a conductive portion 52Nv. The controller 70 is connected to the first control electrode 51N and the second control electrode 52N. The characteristics of the first nonlinear element 50A may be controlled by the signal supplied from the controller 70 to the first control electrode 51N. The characteristics of the second nonlinear element 50B may be controlled by the signal supplied from the controller 70 to the second control electrode 52N. The conductive portion 51Nv and the conductive portion 52Nv extend in at least a part of the second substrate 82 in the first direction (Z-axis direction). These conductive portions may be TSVs.

As described above, the electronic circuit 111 may include the first control terminal 51NT and the second control terminal 52NT. A first control signal Sc1 for controlling the first nonlinear element 50A can be applied to the first control terminal 51NT. A second control signal Sc2 for controlling the second nonlinear element 50B can be applied to the second control terminal 52NT. The first control signal Sc1 is a driving signal of the first nonlinear element 50A. The second control signal Sc2 is a driving signal of the second nonlinear element 50B.

As shown in FIGS. 7A and 7B, a conductive layer provided on the third surface F3 and set to the fixed potential (for example, the ground potential GND) and a conductive layer provided on the fourth surface F4 and set to the fixed potential (for example, the ground potential GND) may be electrically connected by the connection portion 82C and the connection portion 82D. These connection portions extend in the second substrate 82 along the Z-axis direction.

Figure 8A:
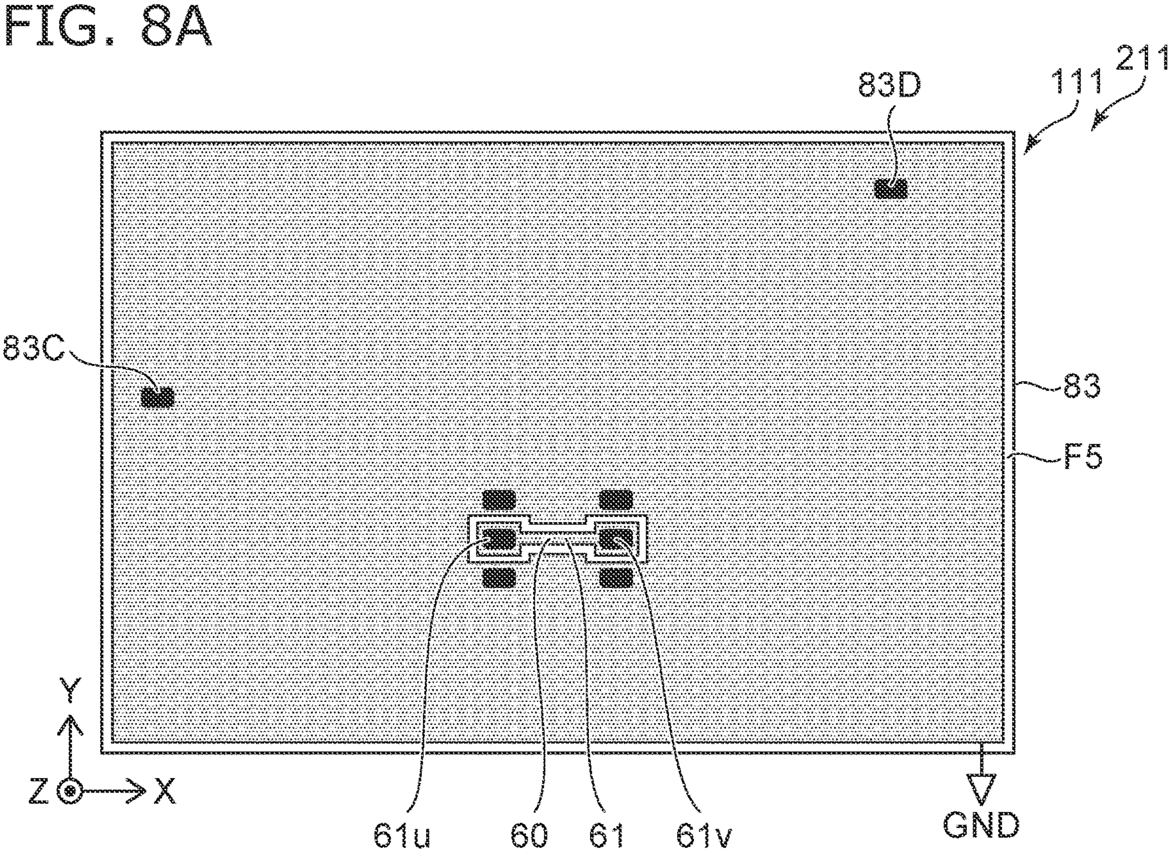
FIGS. 8A and 8B are schematic plan views illustrating a part of the electronic circuit according to the first embodiment.
Figure 8B:
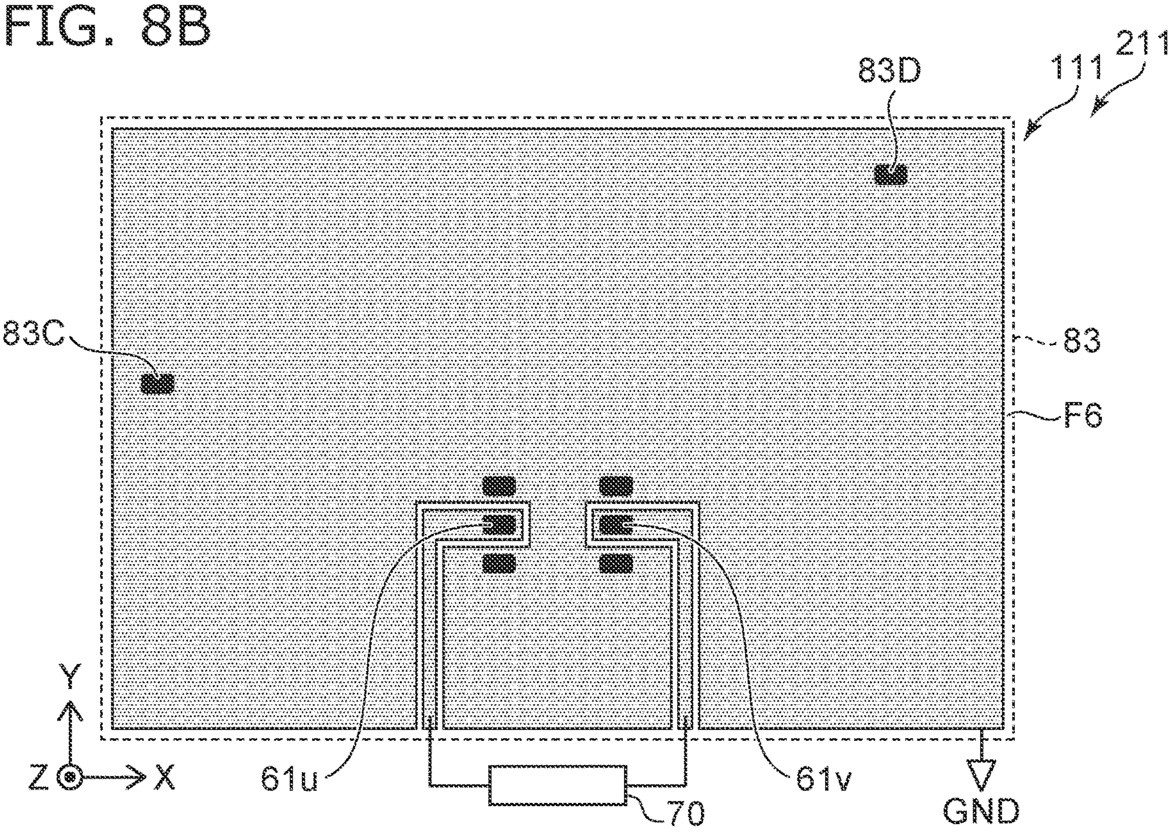

FIGS. 8A and 8B are schematic plan views illustrating a part of the electronic circuit according to the first embodiment.

As shown in FIGS. 6, 8A and 8B, the electronic circuit 111 may include a third substrate 83. The third substrate 83 includes a fifth surface F5 and a sixth surface F6. The fifth surface F5 faces the second surface F2. The fifth surface F5 is between the sixth surface F6 and the second surface F2. The fifth surface F5 is, for example, an upper surface. The sixth surface F6 is, for example, a lower surface. The electronic circuit 111 includes the magnetic flux controller 60. The magnetic flux controller 60 is provided on the fifth surface F5.

The magnetic flux controller 60 is configured to control the magnetic flux $\phi$ of the space SP in the loop 50*r* (see FIG. 3). For example, the controller 70 is provided. The controller 70 controls the magnetic flux controller 60 to control the magnetic flux $\phi$.

In this example, the magnetic flux controller 60 includes a first control conductive member 61. As described above, the electronic circuit 111 may include the first control conductive member 61. In this example, the electronic circuit 111 includes a first control conductive portion 61*u* and a second control conductive portion 61*v*.

As shown in FIGS. 6 and 8A, the first control conductive member 61 is provided on the fifth surface F5. The first control conductive portion 61*u* extends in the third substrate 83 in the first direction (for example, the Z-axis direction). The first control conductive portion 61*u* is electrically connected to a part of the first control conductive member 61. The second control conductive portion 61*v* extends in the third substrate 83 in the first direction (for example, the Z-axis direction). The second control conductive portion 61*v* is electrically connected to another part of the first control conductive member 61.

As shown in FIG. 8B, the controller 70 is connected to the first control conductive member 61 via the first control conductive portion 61*u* and the second control conductive portion 61*v*. A magnetic field is generated by a signal (current) supplied from the controller 70 to the first control conductive member 61. The generated magnetic field is applied to the space SP in the loop 50*r* (see FIG. 3). The magnetic flux $\phi$ of the space SP is controlled.

As shown in FIG. 6, the conductive layer of the ground potential GND provided on the first surface F1 and the conductive layer of the ground potential GND provided on the fourth surface F4 may be electrically connected by a connection portion 58*a*. The conductive layer of the ground potential GND provided on the second surface F2 and the conductive layer of the ground potential GND provided on the fifth surface F5 may be electrically connected by a connection portion 58*b*.

As shown in FIGS. 8A and 8B, a conductive layer provided on the fifth surface F5 and set to the fixed potential (for example, ground potential GND) and a conductive layer provided on the sixth surface F6 and set to the fixed potential (for example, the ground potential GND) may be electrically connected by the connection portion 83C and the connection portion 83D. These connection portions extend in the third substrate 83 along the Z-axis direction.

Some examples of electronic circuits and calculation devices will now be described.

Figure 9A:
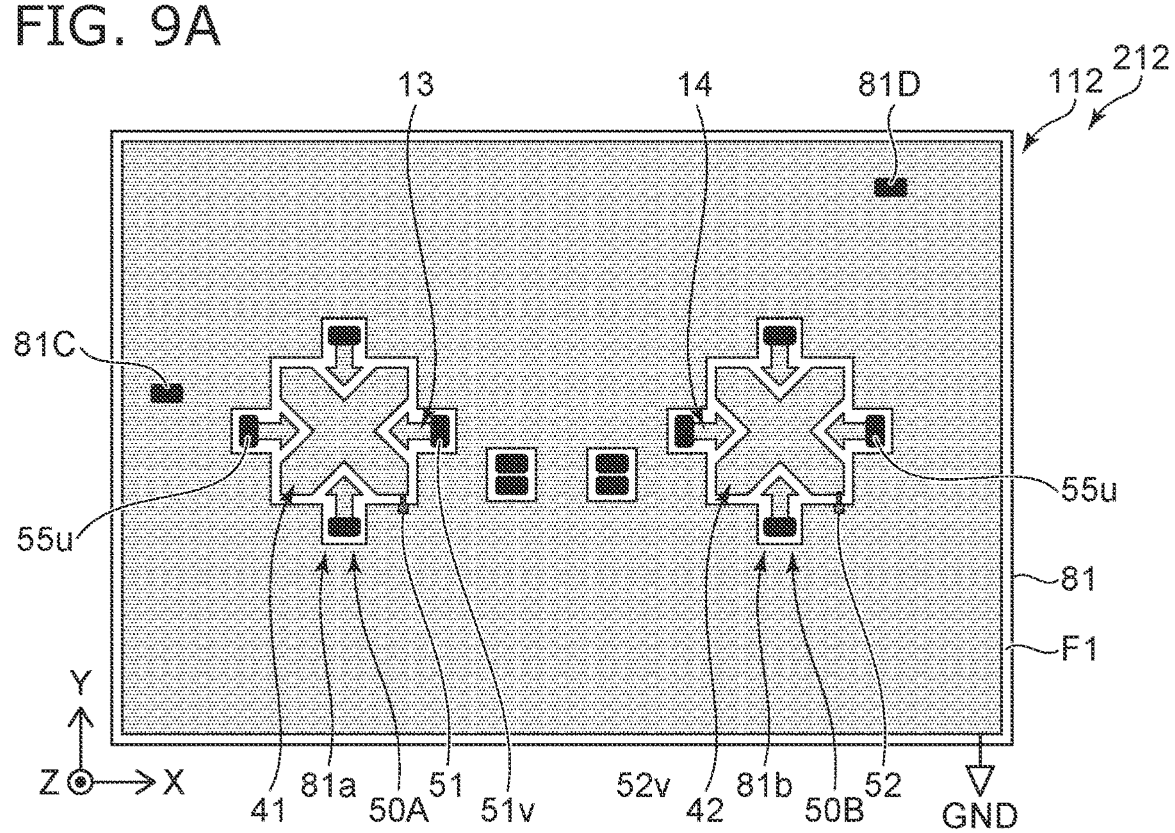
FIGS. 9A and 9B are schematic plan views illustrating an electronic circuit according to the first embodiment.
Figure 9B:
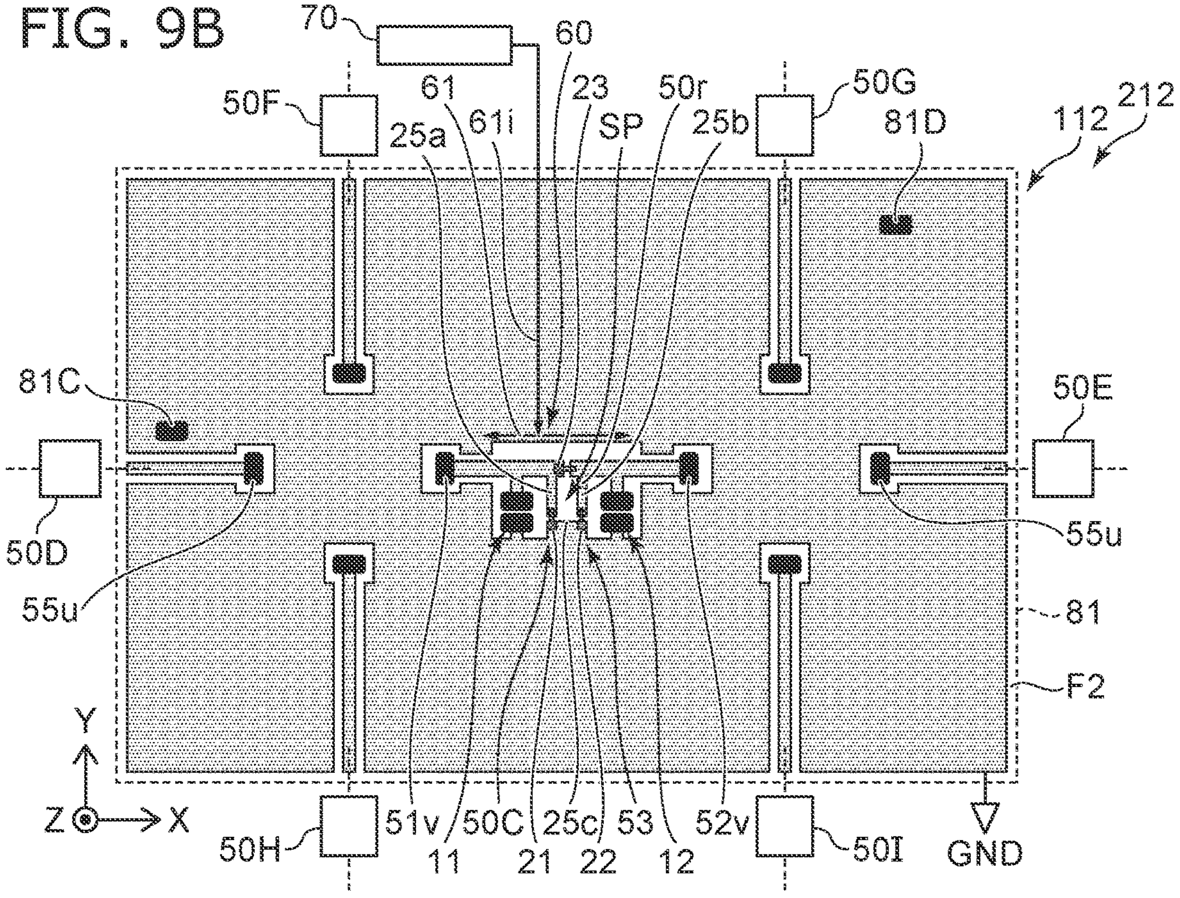

FIGS. 9A and 9B are schematic plan views illustrating an electronic circuit according to the first embodiment.

As shown in FIG. 9A, also in an electronic circuit 112, the first element Josephson junction 51 and the second element Josephson junction 52 are provided on the first surface F1. As shown in FIG. 9B, the first to third Josephson junctions 21 to 23 are provided on the second surface F2. Further, the first control conductive member 61 is provided on the second surface F2. A magnetic flux control signal (for example, a control current 61*i*) is supplied from the controller 70 to the first control conductive member 61. The magnetic field generated by the control current 61*i* is applied to the space SP in the loop 50*r*. The magnetic flux ϕ can be controlled by controlling the control current 61*i*. A calculation device 212 includes the electronic circuit 112 and the controller 70.

Figure 10A:
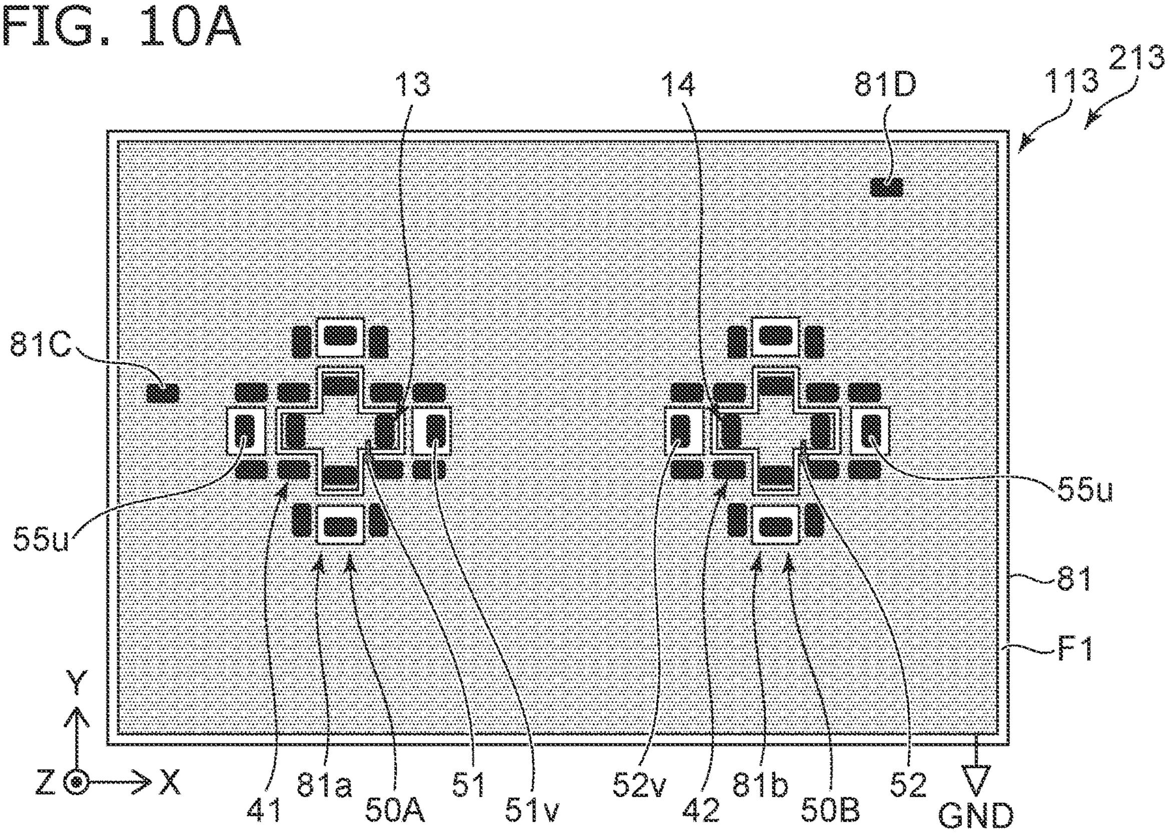
FIGS. 10A and 10B are schematic plan views illustrating an electronic circuit according to the first embodiment.
Figure 10B:
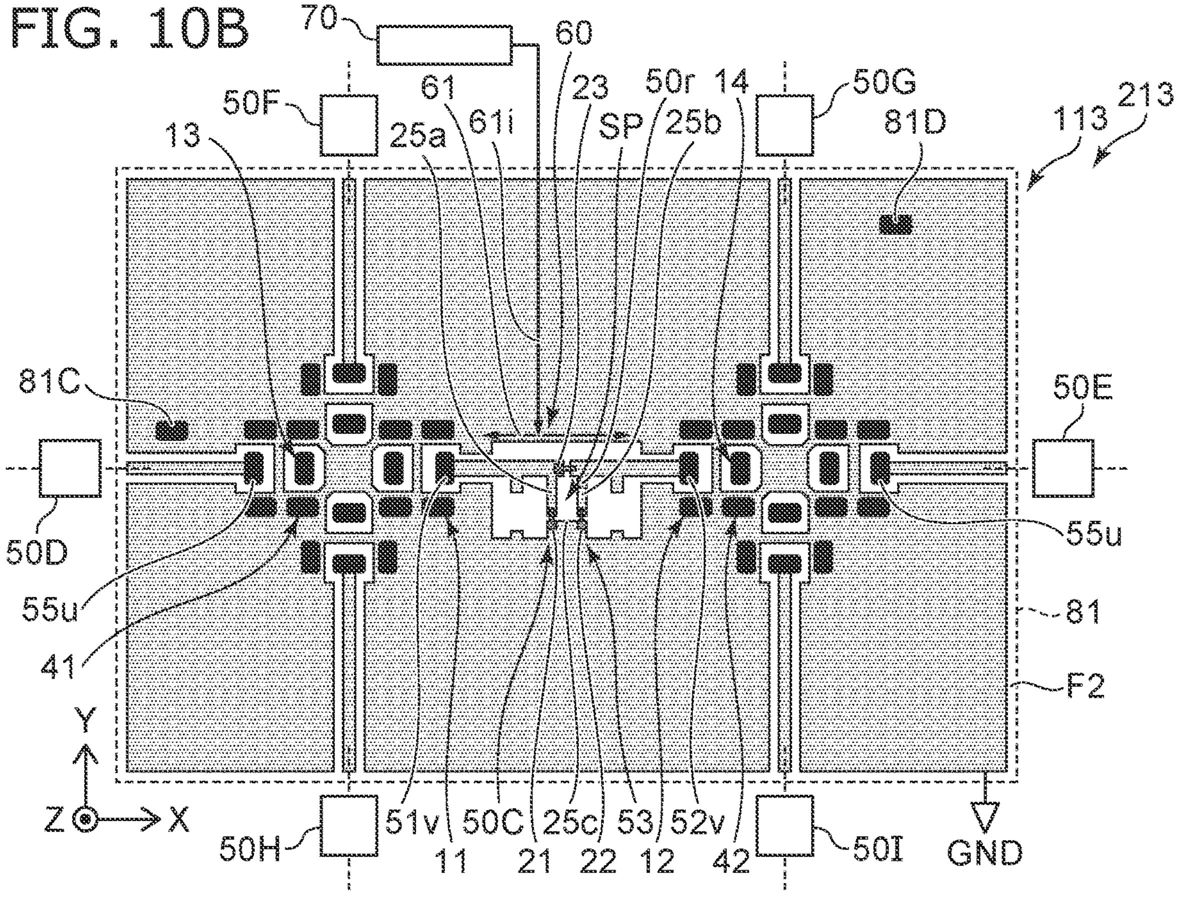

FIGS. 10A and 10B are schematic plan views illustrating an electronic circuit according to the first embodiment.

As shown in FIGS. 10A and 10B, in an electronic circuit 113, the first element capacitor 41, the second element capacitor 42, the third capacitor 13 and the fourth capacitor 14 are formed of conductive portions extending in the first substrate 81 in the first direction (Z-axis direction). A calculation device 213 includes the electronic circuit 113 and the controller 70.

Figure 11A:
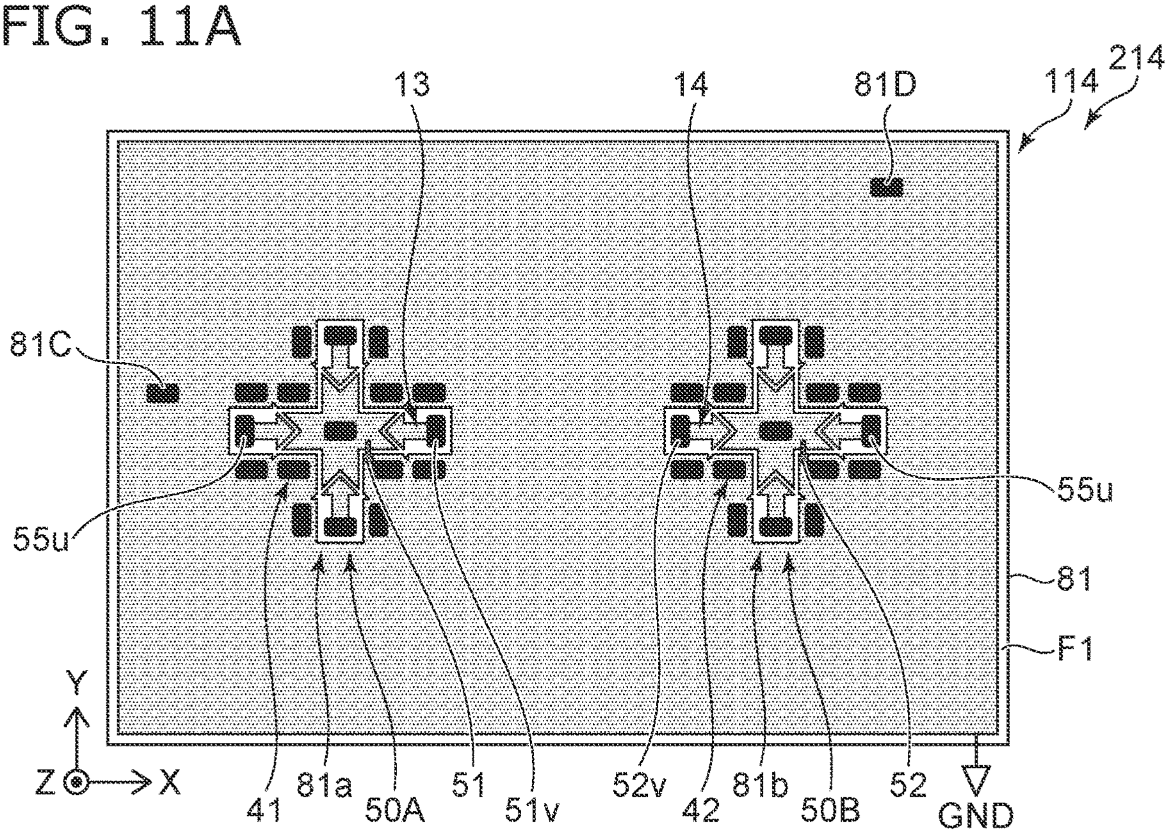
FIGS. 11A and 11B are schematic plan views illustrating an electronic circuit according to the first embodiment.
Figure 11B:
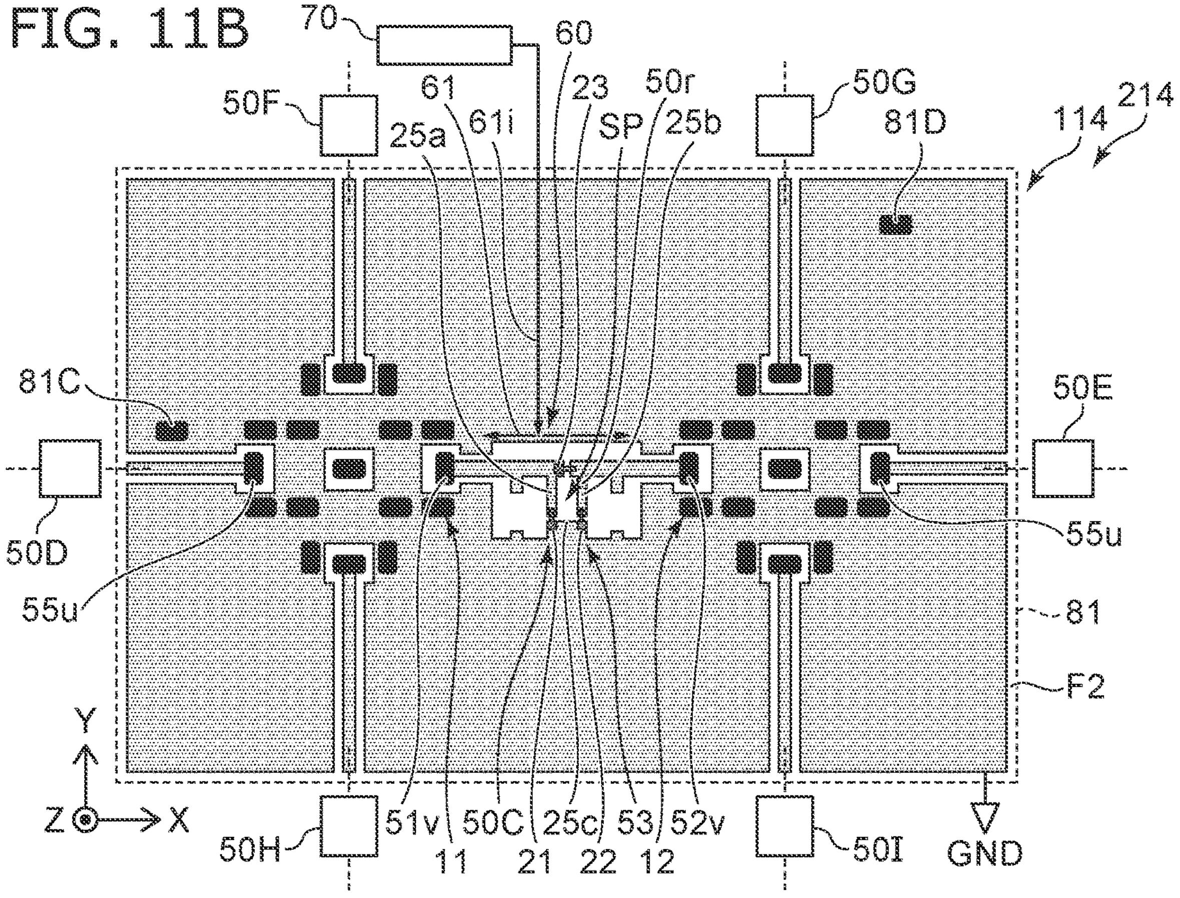

FIGS. 11A and 11B are schematic plan views illustrating an electronic circuit according to the first embodiment.

As shown in FIGS. 11A and 11B, in an electronic circuit 114, the first element capacitor 41, the second element capacitor 42, the first capacitor 11, the second capacitor 12, the third capacitor 13, and the first to fourth capacitors 14 are formed of conductive portions extending in the first substrate 81 in the first direction (Z-axis direction). A calculation device 214 includes the electronic circuit 114 and the controller 70.

Figure 12A:
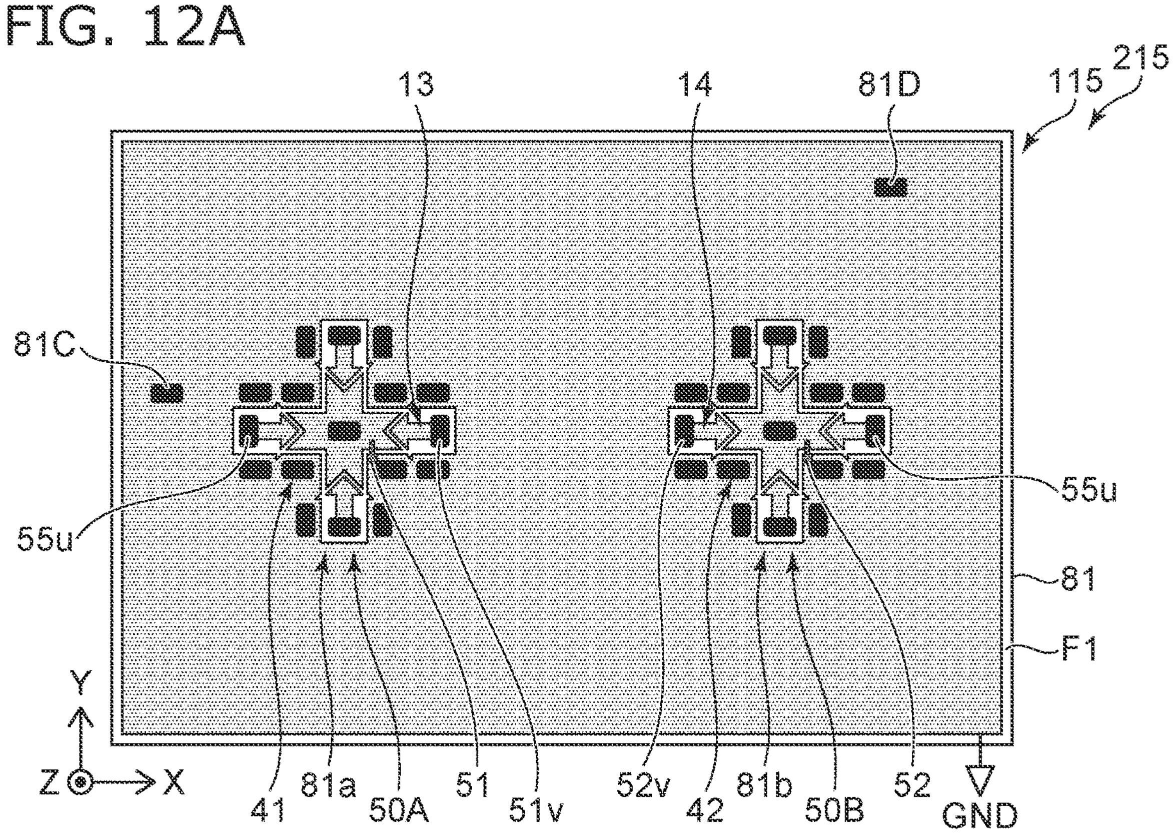
FIGS. 12A and 12B are schematic plan views illustrating an electronic circuit according to the first embodiment.
Figure 12B:
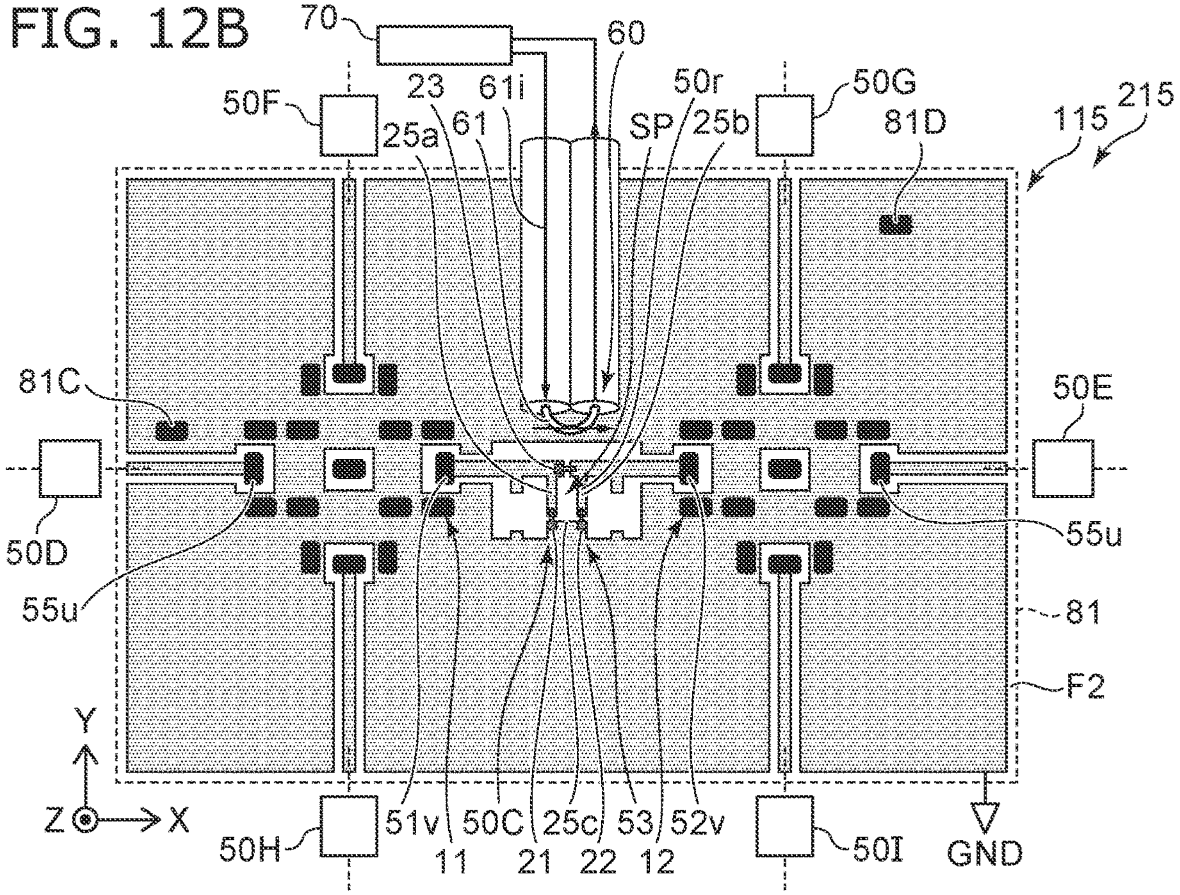

FIGS. 12A and 12B are schematic plan views illustrating an electronic circuit according to the first embodiment.

As shown in FIGS. 12A and 12B, in an electronic circuit 115, the first control conductive member 61 includes a coaxial cable. The first element capacitor 41, the second element capacitor 42, the first capacitor 11, the second capacitor 12, the third capacitor 13, and the fourth capacitor 14 are formed of conductive portions extending the first substrate 81 in the first direction (Z-axis direction). A calculation device 215 includes the electronic circuit 115 and the controller 70.

Figure 13A:
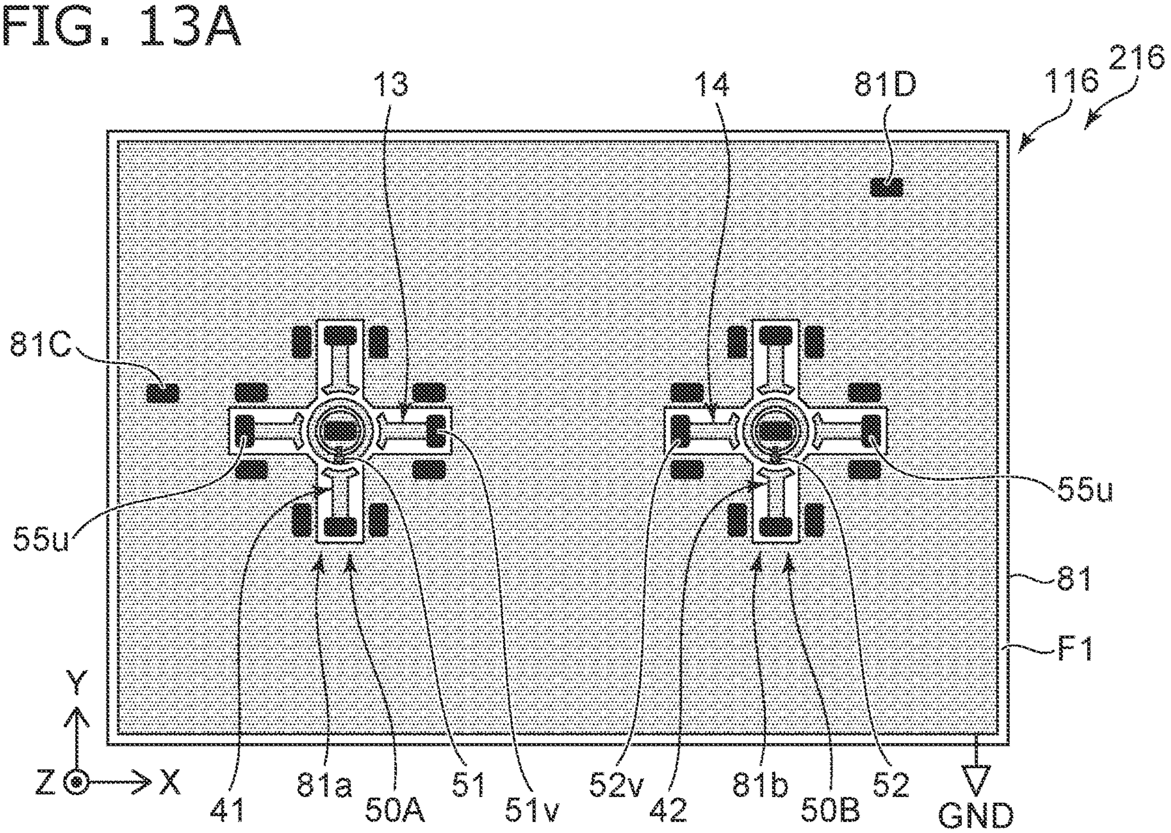
FIGS. 13A and 13B are schematic plan views illustrating an electronic circuit according to the first embodiment.
Figure 13B:
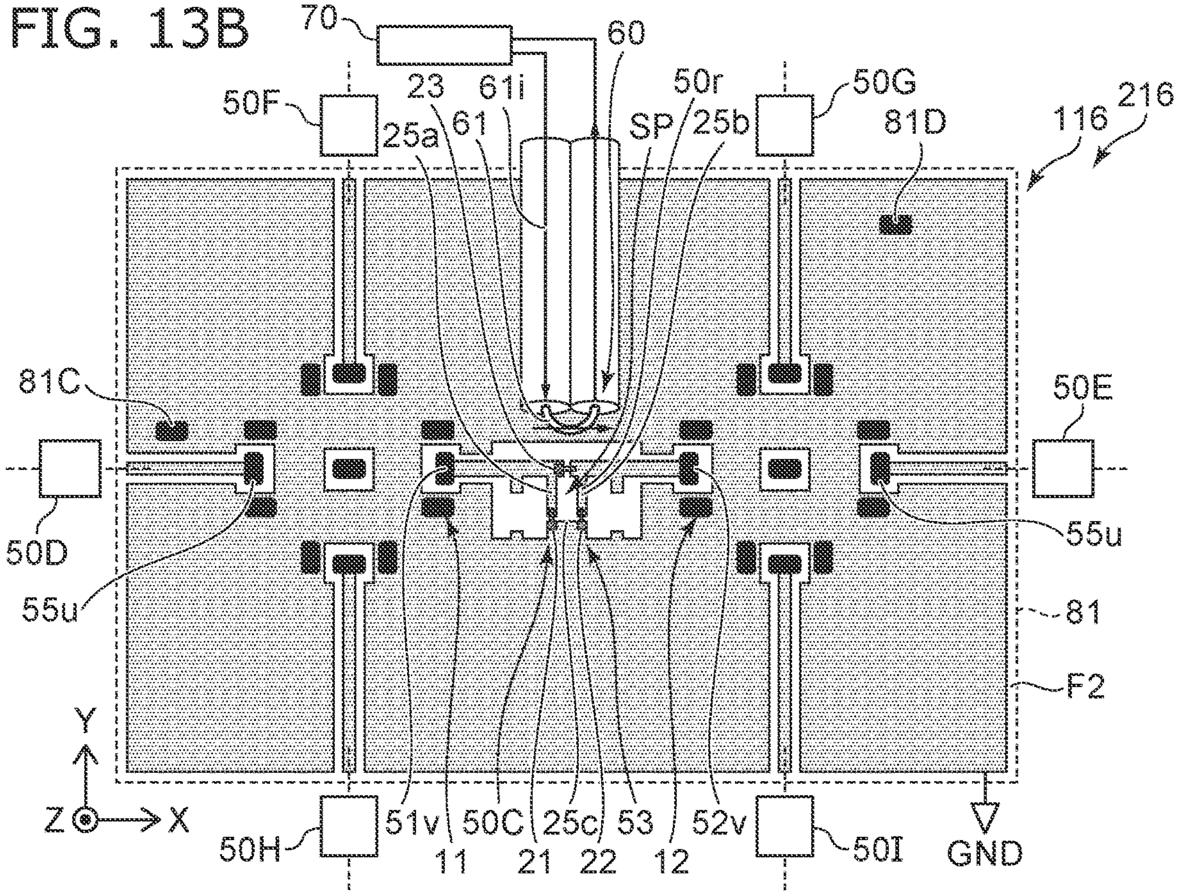

FIGS. 13A and 13B are schematic plan views illustrating an electronic circuit according to the first embodiment.

As shown in FIGS. 13A and 13B, in an electronic circuit 116, the first control conductive member 61 includes a coaxial cable. The first element Josephson junction 51 is provided between the annular conductive portion and the conductive portion provided in the annular conductive portion. The second element Josephson junction 52 is provided between the annular conductive portion and the conductive portion provided in the annular conductive portion. A calculation device 216 includes the electronic circuit 116 and the controller 70.

Figure 14A:
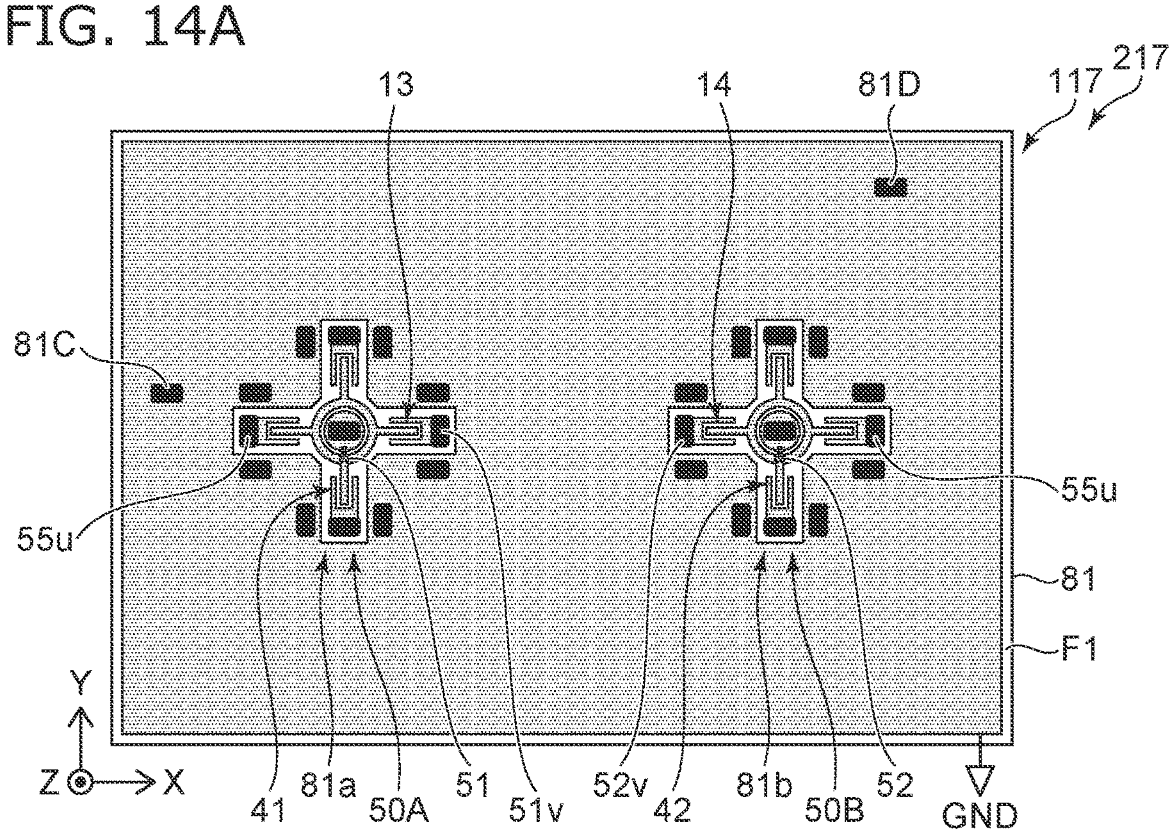
FIGS. 14A and 14B are schematic plan views illustrating an electronic circuit according to the first embodiment.
Figure 14B:
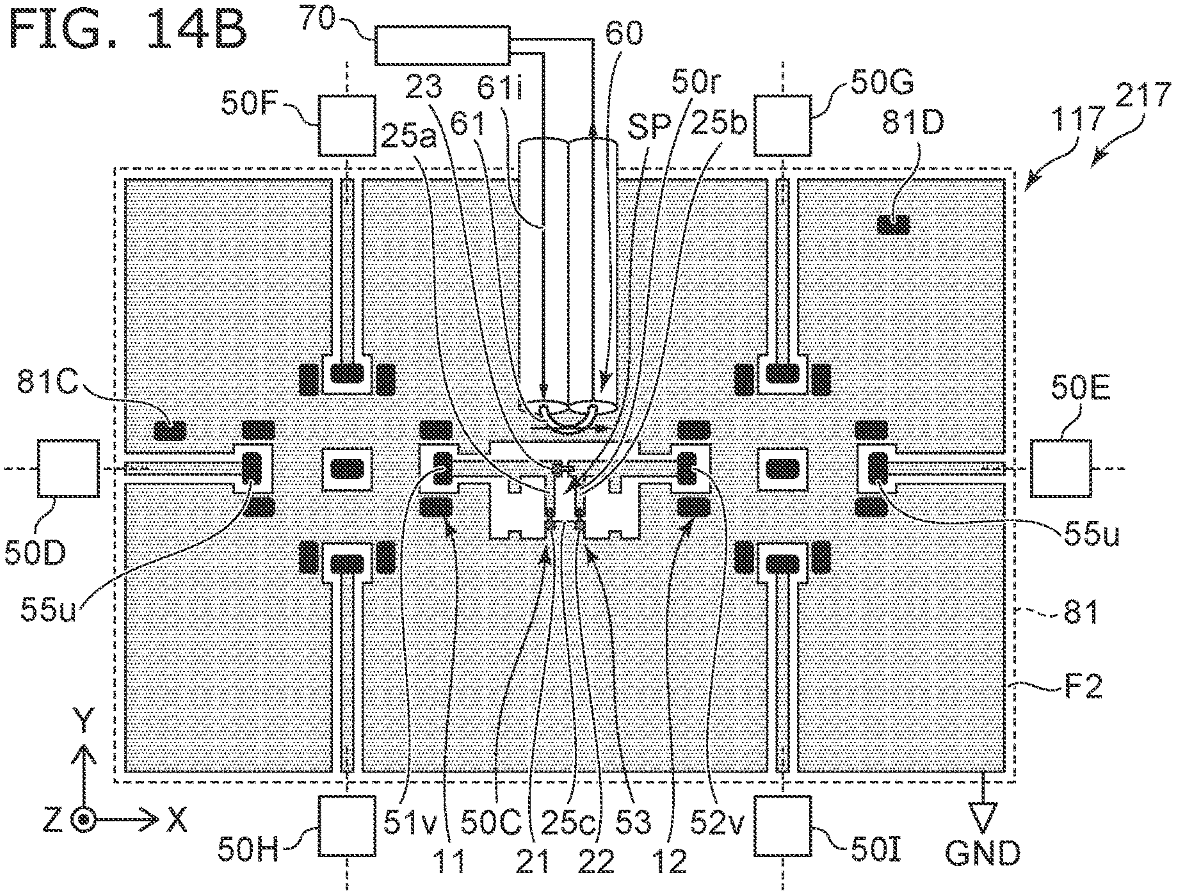

FIGS. 14A and 14B are schematic plan views illustrating an electronic circuit according to the first embodiment.

As shown in FIGS. 14A and 14B, in an electronic circuit 117, the first control conductive member 61 includes a coaxial cable. The first element Josephson junction 51 is provided between the annular conductive portion and the conductive portion provided in the annular conductive portion. The second element Josephson junction 52 is provided between the annular conductive portion and the conductive portion provided in the annular conductive portion. The third capacitor 13 and the fourth capacitor 14 include a portion extending along the first surface F1. The calculation device 217 includes an electronic circuit 117 and a controller 70.

Figure 15A:
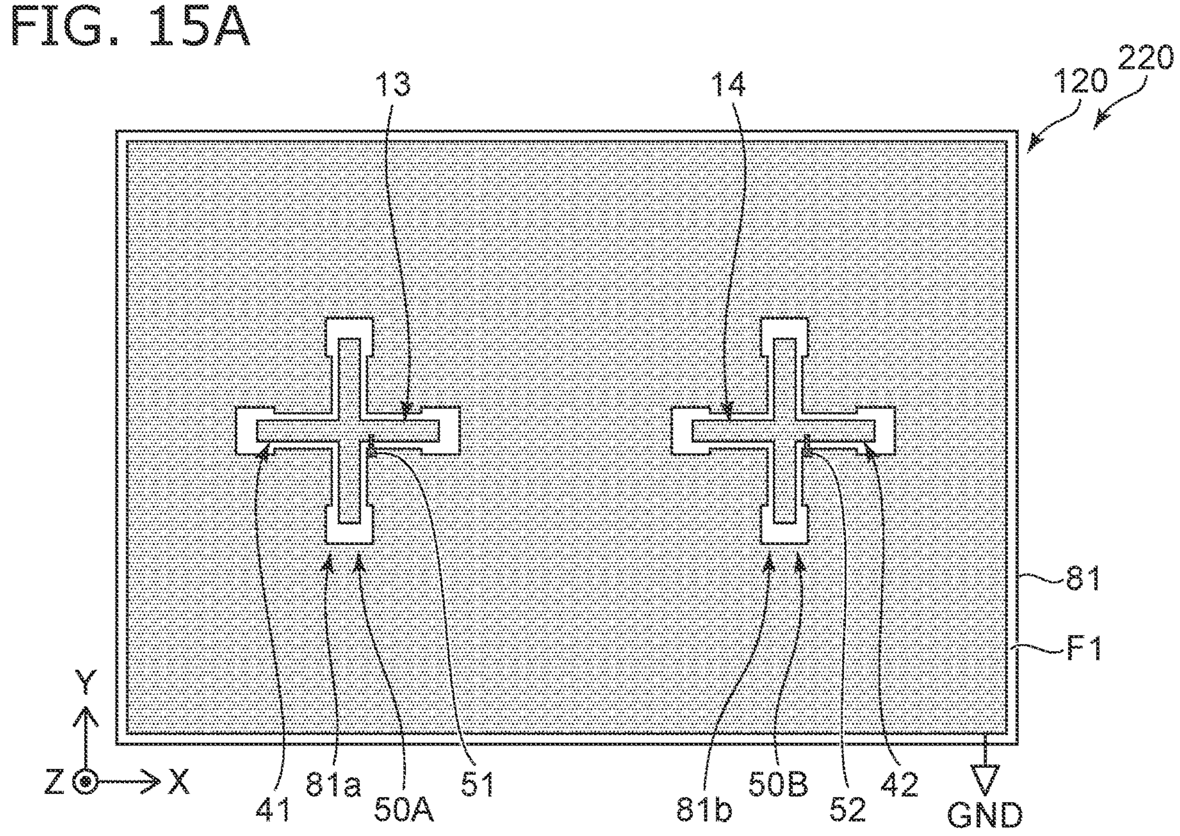
FIGS. 15A and 15B are schematic plan views illustrating an electronic circuit according to the first embodiment.
Figure 15B:
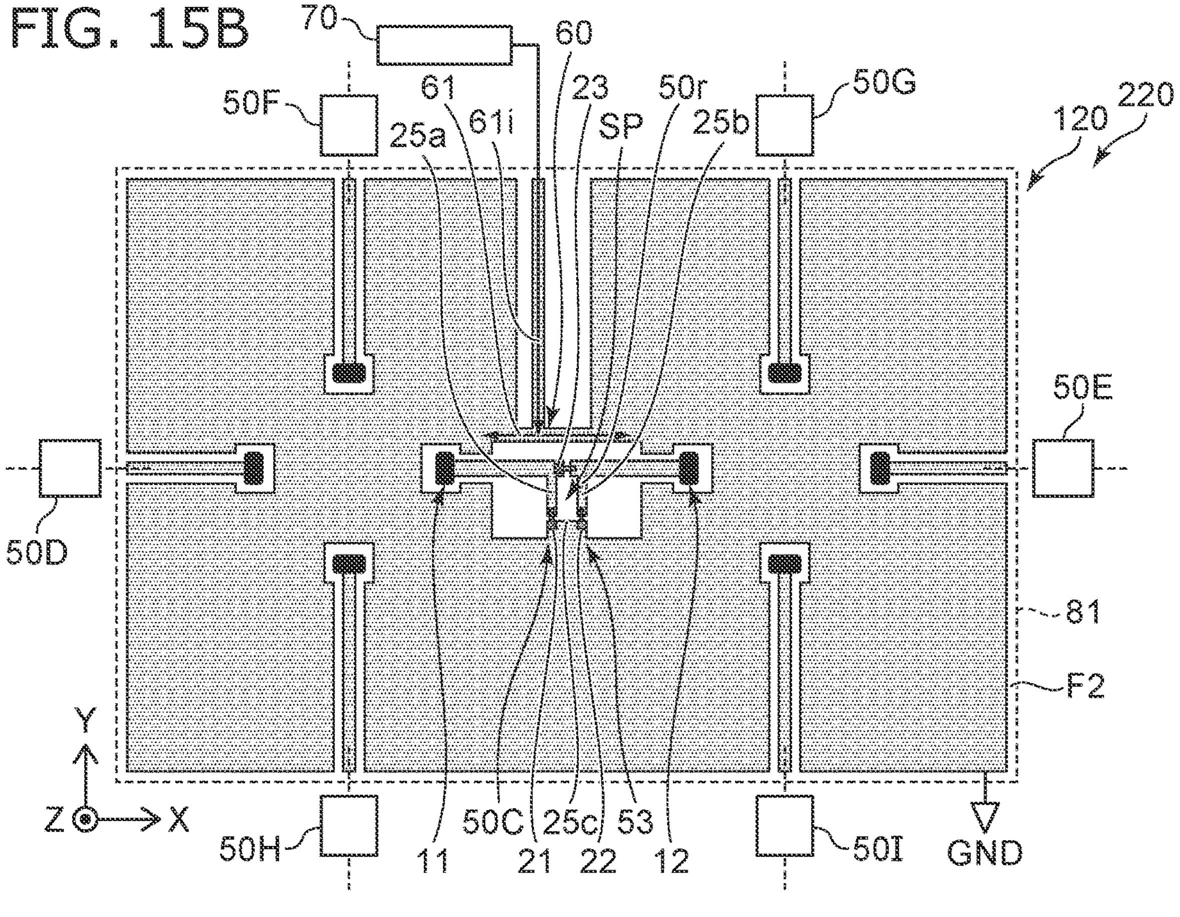

FIGS. 15A and 15B are schematic plan views illustrating an electronic circuit according to the first embodiment.

Figure 16:
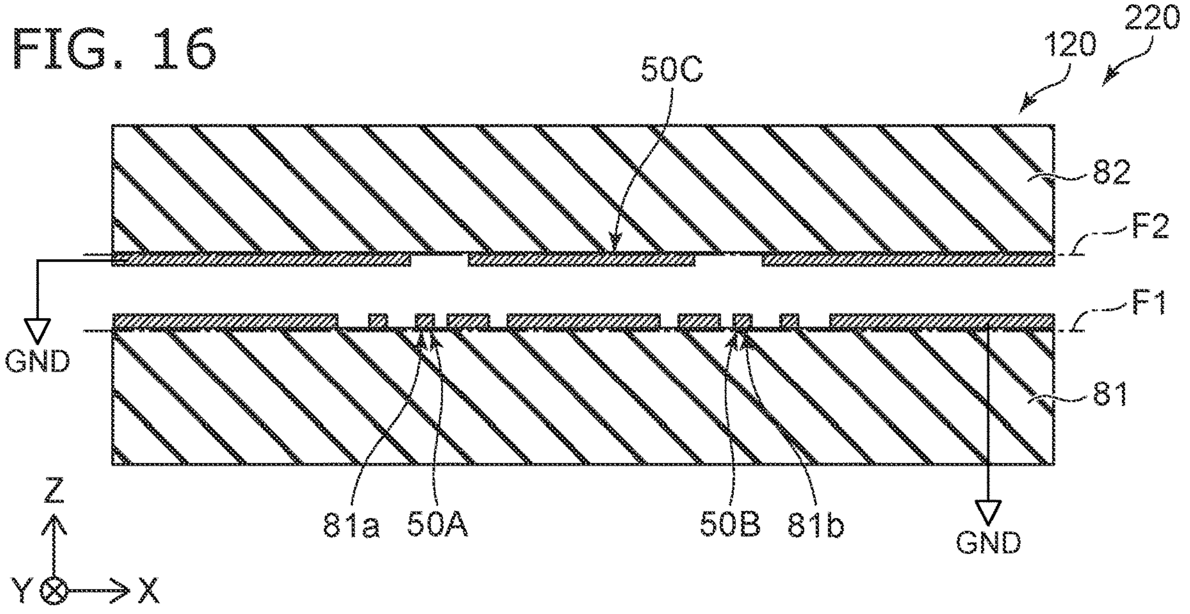
FIG. 16 is a schematic cross-sectional view illustrating the electronic circuit according to the first embodiment.

FIG. 16 is a schematic cross-sectional view illustrating the electronic circuit according to the first embodiment.

As shown in FIG. 16, an electronic circuit 120 includes the first substrate 81 and the second substrate 82. The first surface F1 is one surface (for example, the upper surface) of the first substrate 81. The second surface F2 is one surface (for example, a lower surface) of the second substrate 82. The second surface F2 faces the first surface F1.

The first nonlinear element 50A is provided in the first region 81*a* of the first surface F1. The second nonlinear element 50B is provided in the second region 81*b* of the first surface F1. The third nonlinear element 50C is provided on the second surface F2.

As shown in FIG. 15A, the first element Josephson junction 51 included in the first nonlinear element 50A is provided in the first region 81*a* of the first surface F1. The second element Josephson junction 52 included in the second nonlinear element 50B is provided in the second region 81*b* of the first surface F1.

As shown in FIG. 15B, at least a part of the Josephson junction circuit 53 of the third nonlinear element 50C is provided on the second surface F2. The second surface F2 is separated from the first surface F1. The third nonlinear element 50C can be coupled with the first nonlinear element 50A. The third nonlinear element 50C can be coupled with the second nonlinear element 50B. For example, the third nonlinear element 50C can be inductively coupled with the first nonlinear element 50A. For example, the third nonlinear element 50C can be inductively coupled with the second nonlinear element 50B.

Also in the electronic circuit 120, the Josephson junction circuit 53 includes the first Josephson junction 21, the second Josephson junction 22, and the third Josephson junction 23. These Josephson junctions are provided on the second surface F2. The third nonlinear element 50C includes the first conductive member 25*a*, the second conductive member 25*b*, and the third conductive member 25*c*. These conductive members are provided on the second surface F2. The first conductive member connects the first Josephson junction 21 to the third Josephson junction 23. The second conductive member 25*b* connects the second Josephson junction 22 to the third Josephson junction 23. The third conductive member 25*c* connects the first Josephson junction 21 to the second Josephson junction 22. The first Josephson junction, the second Josephson junction, the third Josephson junction, the first conductive member, the second conductive member, and the third conductive member form the loop 50*r*. The first nonlinear element 50A can be coupled with the first conductive member 25*a*. The second nonlinear element 50B can be coupled with the second conductive member 25*b*. In the electronic circuit 120, the first nonlinear element 50A can be inductively coupled with the first conductive member 25*a*. The second nonlinear element 50B can be inductively coupled with the second conductive member 25*b*.

The electronic circuit 120 includes the circuits described with respect to FIG. 3. The electronic circuit 120 may include the first to fifth capacitors 11 to 15. The first nonlinear element 50A may include the first element capacitor 41. The second nonlinear element 50B may include the second element capacitor 42.

As shown in FIG. 15B, the magnetic flux controller 60 may be provided. The magnetic flux controller 60 includes the first control conductive member 61. The magnetic flux control signal (control current 61*i*) is supplied from the controller 70 to the first control conductive member 61. A magnetic field corresponding to the magnetic flux control signal is generated from the first control conductive member 61. This magnetic field controls the magnetic flux ϕ of the space SP in the loop 50*r*. The controller 70 can change the magnetic flux ϕ by modulating the current supplied to the first control conductive member 61. A calculation device 218 includes the electronic circuit 120 and the controller 70.

An example of the characteristics of the calculation device (for example, the calculation device 210) according to the embodiment will now be described.

In the following description, the critical current of the first element Josephson junction 51 is 56.6 nA. The critical current of the second element Josephson junction 52 is 45.9 nA. The capacitance of the first element capacitor 41 is 43.6 fF. The capacitance of the second element capacitor 42 is 43.6 fF. The critical current of the first Josephson junction 21 is 64.4 nA. The critical current of the second Josephson junction 22 is 50.0 nA. The critical current of the third Josephson junction 23 is 14.8 nA. The capacitance of the first capacitor 11 is 19.4 fF. The capacitance of the second capacitor 12 is 19.4 fF. The capacitance of the third capacitor 13 is 6.46 fF. The capacitance of the fourth capacitor 14 is 6.46 fF. The capacitance of the fifth capacitor 15 is 0.969 fF.

Figure 17:
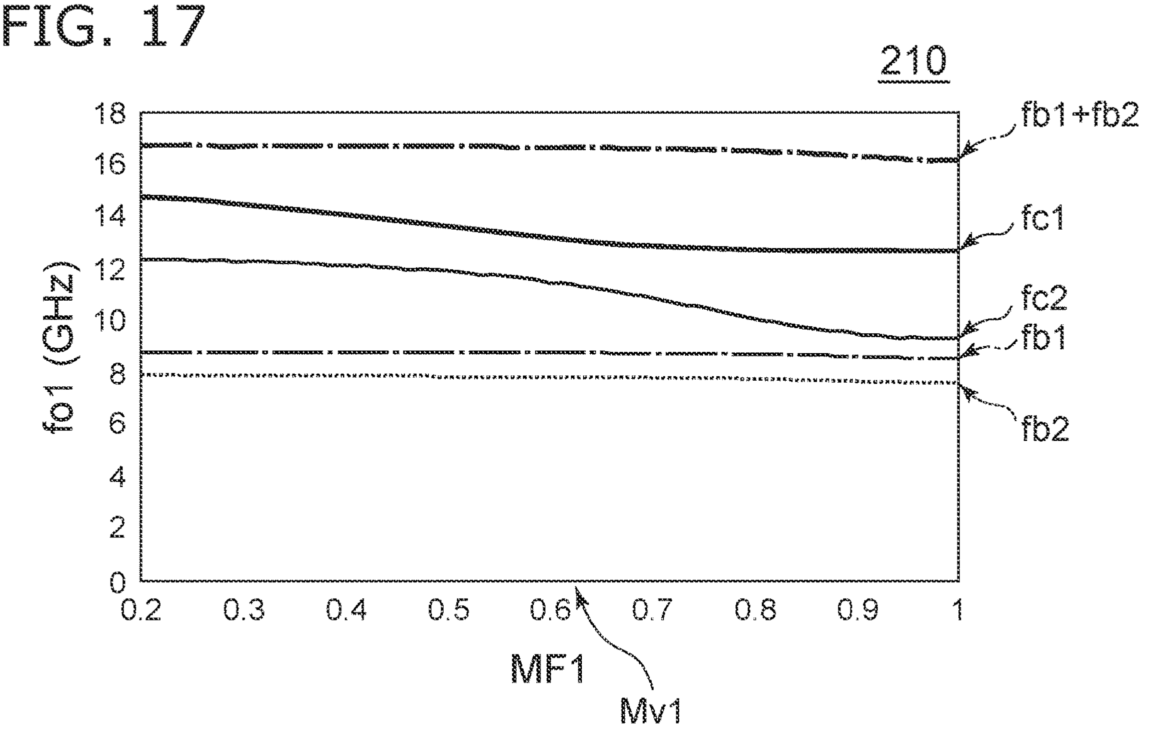
FIG. 17 is a graph illustrating characteristics of the calculation device according to the first embodiment.

FIG. 17 is a graph illustrating characteristics of the calculation device according to the first embodiment.

The horizontal axis of FIG. 17 is a magnetic flux MF1 of the space SP (the loop 10*r*). The magnetic flux MF1 ($=2\phi/\phi_0$) is normalized by a flux quantum $\phi_0$ and is dimensionless. The vertical axis of FIG. 17 corresponds to a frequency fol. FIG. 17 illustrates a resonant frequency fb1 of the first nonlinear element 50A and a resonant frequency fb2 of the second nonlinear element 50B. The first nonlinear element 50A corresponds to, for example, a first qubit. The second nonlinear element 50B corresponds to, for example, a second qubit. The nonlinear element is, for example, a nonlinear resonator (transmon qubit). The resonant frequency of each nonlinear element corresponds to the value of the energy difference between the two lowest states of the nonlinear element divided by Planck's constant h and converted into a frequency.

FIG. 17 illustrates a frequency fc1 and a frequency fc2. The frequency fc1 corresponds to one frequency of the multiple modes (e.g., the two modes) of the third nonlinear element 50C (coupler). The frequency fc2 corresponds to another frequency of the multiple modes (e.g., the two modes) of the third nonlinear element 50C (coupler).

In the calculation device 210 according to the embodiment as shown in FIG. 17, the frequency fc1 and the frequency fc2 change as the magnetic flux MF1 changes. In particular, the frequency fc2 greatly changes. In the example, the frequency fc1 and the frequency fc2 approach each other when the magnetic flux MF1 is about 0.61. The first magnetic flux value Mv1 is about 0.61.

As shown in FIG. 17, the resonant frequency fb1 of the first nonlinear element 50A and the resonant frequency fb2 of the second nonlinear element 50B are substantially constant as the magnetic flux MF1 changes. In the example, the resonant frequency fb1 of the first nonlinear element 50A is about 10.0 GHz. The resonant frequency fb2 of the second nonlinear element 50B is about 8.4 GHz.

Thus, according to the embodiment, the frequency fc1 and the frequency fc2 are relatively near the resonant frequencies fb1 and fb2. The third nonlinear element 50C (coupler) includes multiple modes (at least two modes). In other words, the coupler can resonate in multiple modes. The resonant frequencies (the frequency fc1 and the frequency fc2) of the multiple modes are higher than the resonant frequencies fb1 and fb2 and lower than the sum of the resonant frequency fb1 and the resonant frequency fb2 at the vicinity of the first magnetic flux value Mv1 described above (the magnetic flux value at which the frequencies fc1 and fc2 are near each other). According to the embodiment, a state exists in which the resonant frequencies (the frequency fc1 and the frequency fc2) of the multiple modes are lower than the sum of the resonant frequency fb1 and the resonant frequency fb2.

For example, in a state where the coupling between the first nonlinear element 50A and the second nonlinear element 50B is substantially decoupled, the resonant frequency in each of the multiple modes in the third nonlinear element 50C is higher than the resonant frequency fb1 of the first nonlinear element 50A, higher than the resonant frequency fb2 of the second nonlinear element 50B, and lower than the sum of the resonant frequency fb1 of the first nonlinear element 50A and the resonant frequency fb2 of the second nonlinear element 50B.

Figure 18:
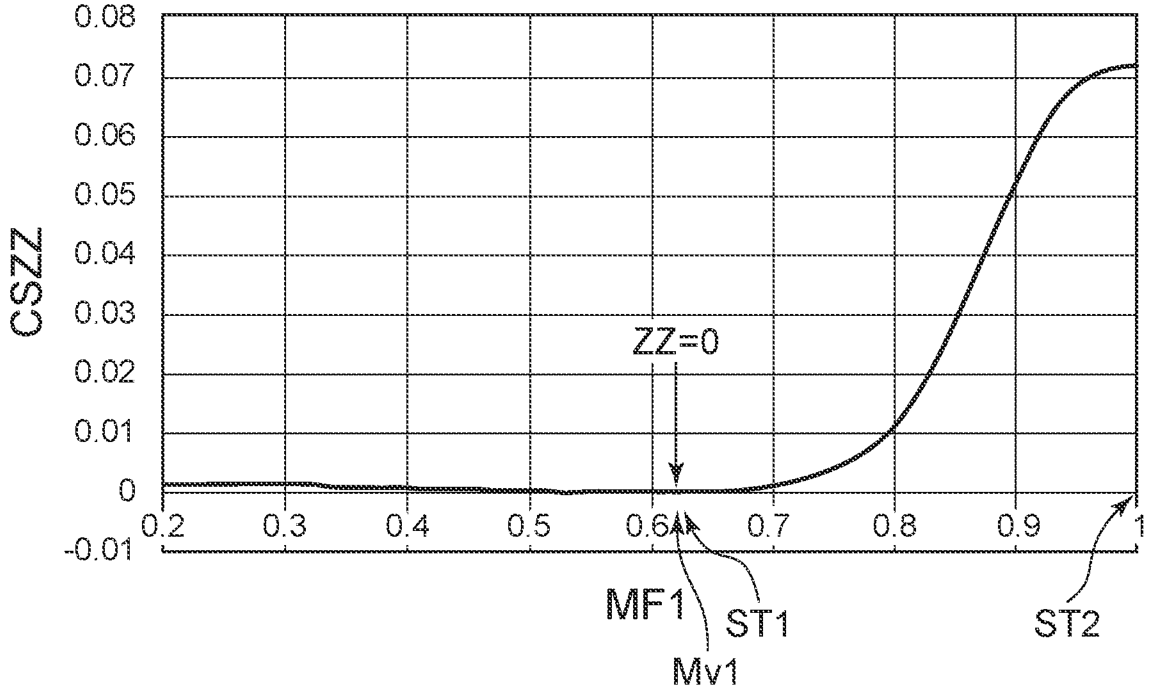
FIG. 18 is a graph illustrating characteristics of the calculation device according to the first embodiment.

FIG. 18 is a graph illustrating characteristics of the calculation device according to the first embodiment.

The horizontal axis of FIG. 18 is the magnetic flux MF1. The vertical axis is a coupling strength CSZZ related to residual coupling (so-called ZZ-coupling). ZZ-coupling corresponds to the state in which fb1+fb2−fb3 is nonzero due to the residual coupling, wherein the frequency fb3 corresponds to both the two qubits being in the "1 state". The ZZ-coupling "shift" corresponds to the coupling strength CSZZ.

In the example, the coupling strength CSZZ is substantially zero when the magnetic flux MF1 is about 0.61 (the first magnetic flux value Mv1). As shown in FIG. 18, the coupling strength CSZZ that is related to the residual coupling can be substantially zero when the magnetic flux MF1 is about 0.61. For example, robust zero ZZ-coupling is obtained.

For example, the magnetic flux MF1 is increased or decreased between the first state ST1 in which the magnetic flux MF1 is the first magnetic flux value Mv1 and the second state ST2 in which the magnetic flux MF1 is larger than the first magnetic flux value Mv1. This makes it possible to perform a two-qubit gate. Such an operation corresponds to, for example, a first operation. For example, in the second state ST2, the magnetic flux MF1 is 1.

In the first operation, for example, the magnetic flux ϕ (corresponding to the magnetic flux MF1) is increased from the first magnetic flux value Mv1 (first state ST1) to form the second state ST2. After that, the magnetic flux ϕ (corresponding to the magnetic flux MF1) is decreased and returned to the first magnetic flux value Mv1. As a result, the two-qubit gate is performed by the flux pulse. In the two-qubit gate, the phase of the |01>state with respect to the |00>state is rotated by $\theta_{01}$. In the two-qubit gate, the phase of the |10>state with respect to the |00>state is rotated by $\theta_{10}$. In the two-qubit gate, the phase of the | 11>state with respect to the |00>state is rotated by $\theta_{11}$. $\theta_{11}$ deviates from the sum of $\theta_{01}$ and $\theta_{10}$ (that is, $\theta_{01}+\theta_{10}$). This phase shift $(\theta_{11}-\theta_{01}-\theta_{10})$ corresponds to the gate rotation angle.

Figure 19:
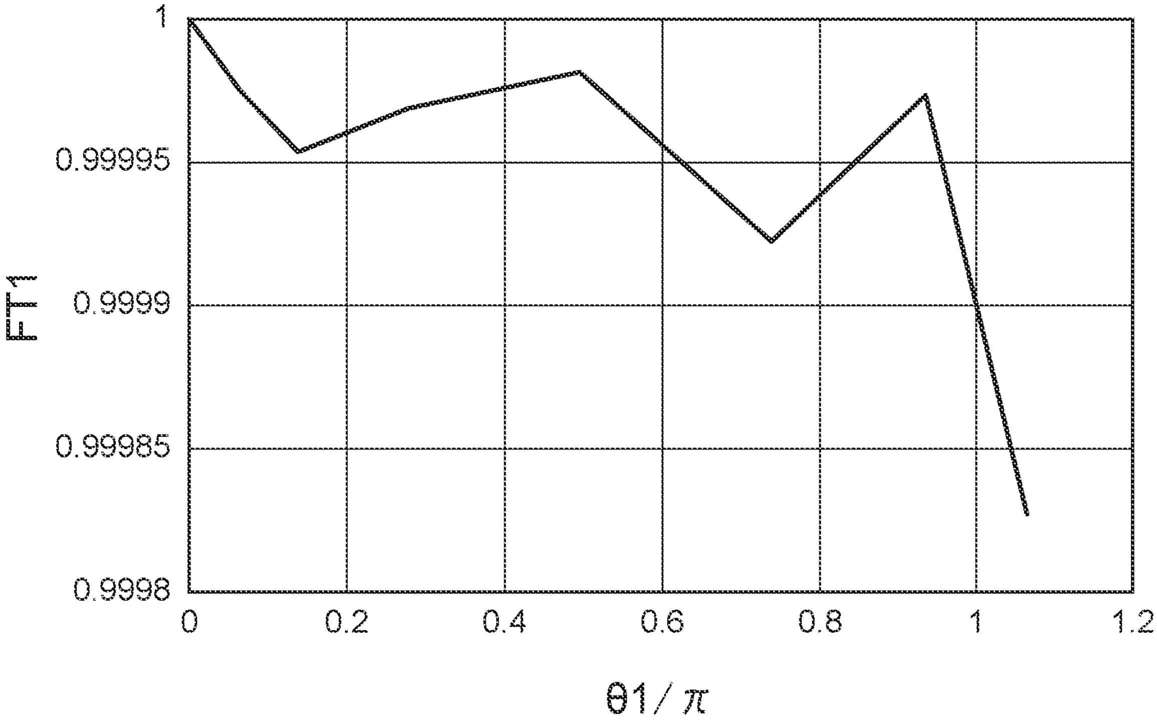
FIG. 19 is a graph illustrating characteristics of the calculation device according to the first embodiment.

FIG. 19 is a graph illustrating characteristics of the calculation device according to the first embodiment.

FIG. 19 illustrates the characteristics of the first operation described above. The horizontal axis of FIG. 19 is a value obtained by dividing the gate rotation angle $\theta_1$ by $\pi$. "$\pi$" is the pi. The vertical axis is fidelity FT1. The gate time is about 12 ns. As shown in FIG. 19, high fidelity FT1 of not less than 99.98% is obtained at high speed gates.

Figure 20:
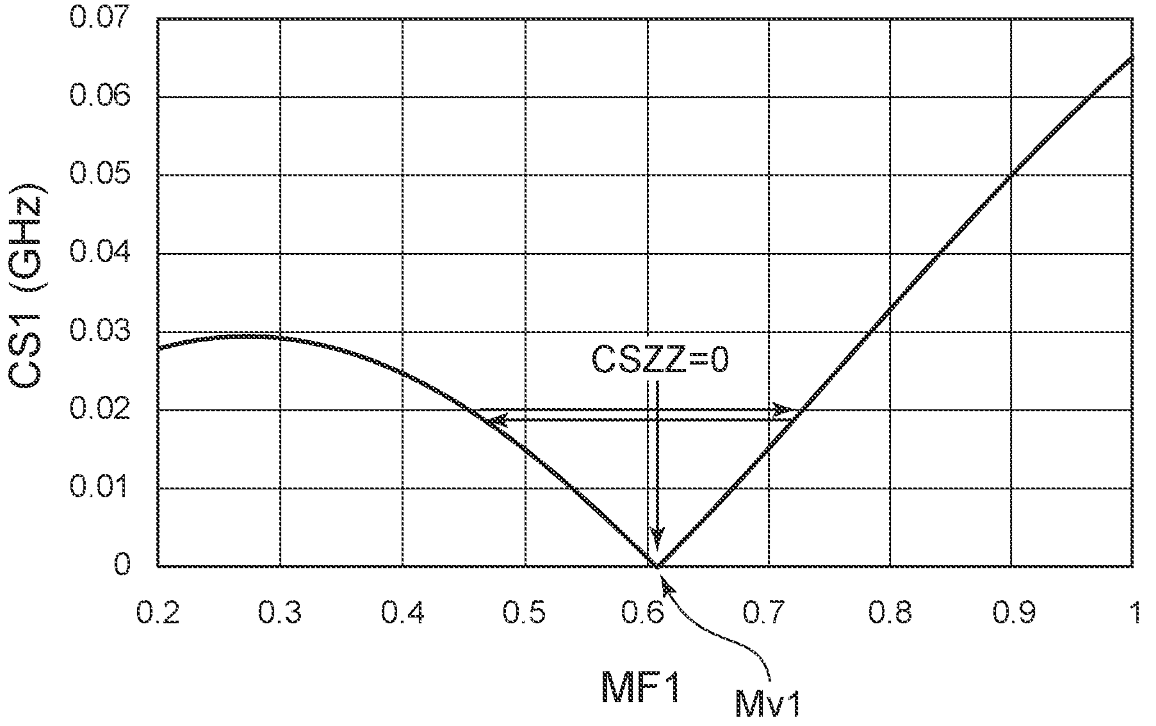
FIG. 20 is a graph illustrating characteristics of the calculation device according to the first embodiment.

FIG. 20 is a graph illustrating characteristics of the calculation device according to the first embodiment.

The horizontal axis of FIG. 20 is the magnetic flux MF1. The vertical axis is the coupling strength CS1 between the first nonlinear element 50A and the second nonlinear element 50B. The coupling strength CS1 is a coupling strength between the |01>state and the |10>state. As shown in FIG. 20, when the magnetic flux MF1 is the first magnetic flux value MV1, the coupling strength CS1 becomes zero. At this time, the coupling is turned off. As shown in FIG. 20, when the magnetic flux MF1 changes, the coupling strength CS1 changes. By controlling the magnetic flux MF1, the coupling strength CS1 can be controlled. For example, the width of the change in the coupling strength CS1 is about 20 MHz. That is, the coupling strength CS1 can be adjusted in a range of −20 MHz to 20 MHz. Such an operation corresponds to, for example, a second operation.

For example, in the second operation, the magnetic flux $\phi$ (magnetic flux MF1) is modulated at the frequency of "fb1-fb2". The envelope in the modulation may be, for example, pulse-like. In this second operation, the two-qubit gate is a rotating gate in which the probability of |01>state and the probability of |10>state are interchanged. In this rotation gate (rotation gate in which the probabilities are interchanged), the rotation angle corresponds to a rotation angle of the rotation matrix with respect to the probability amplitude vector.

In this way, the controller 70 can control the magnetic flux $\phi$ (magnetic flux MF1) in the space SP to change the coupling strength CS1 between the first nonlinear element 50A and the second nonlinear element 50B.

Figure 21:
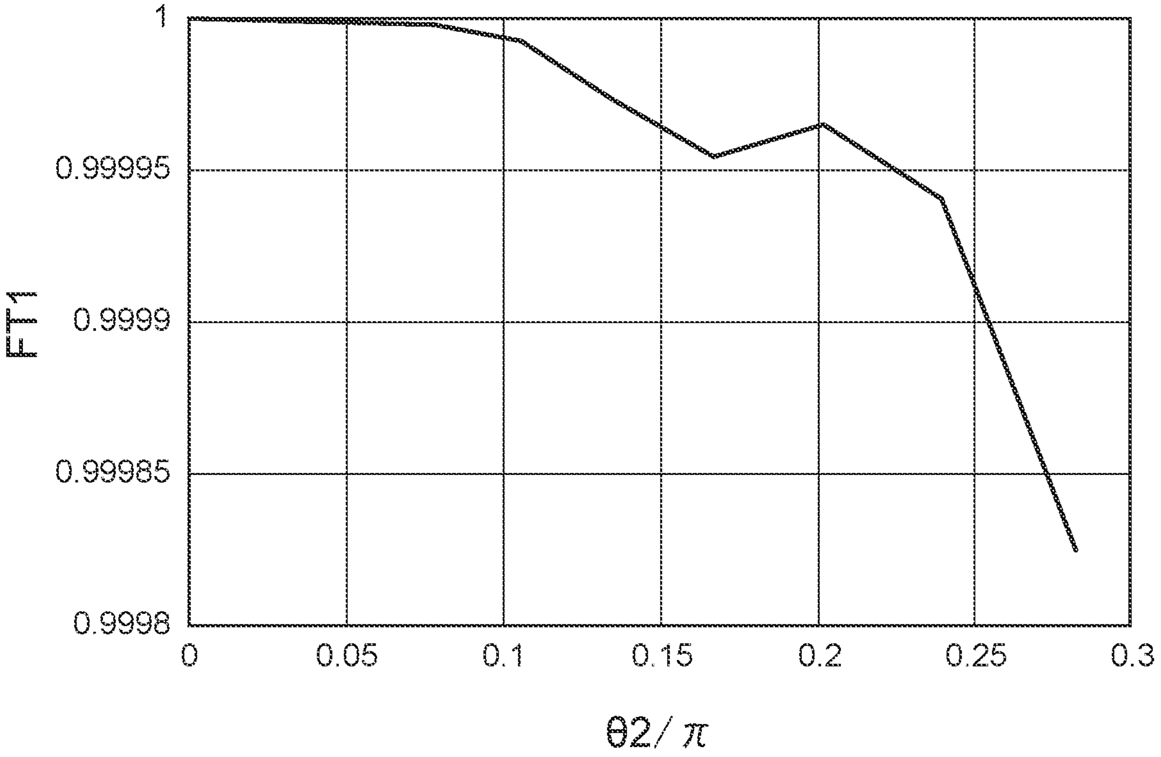
FIG. 21 is a graph illustrating characteristics of the calculation device according to the first embodiment.

FIG. 21 is a graph illustrating characteristics of the calculation device according to the first embodiment.

FIG. 21 illustrates the characteristics of the second operation described above. The horizontal axis of FIG. 20 is a value obtained by dividing the gate rotation angle θ2 by $\pi$. This gate rotation angle θ2 corresponds to the rotation angle of the rotation matrix with respect to the probability amplitude vector in the rotation gate where the probabilities are interchanged. The vertical axis is fidelity FT1. The gate time is about 12 ns. As shown in FIG. 21, a high fidelity FT1 of not less than 99.98% is obtained at a high speed gate. In FIG. 21, the gate at the gate rotation angle θ2 of 0.25$\pi$ corresponds to the "square root of iSWAP gate".

The controller 70 is configured to perform at least one of the first operation or the second operation, for example. In the first operation, the controller 70 performs a two-qubit operation of the first nonlinear element 50A and the second nonlinear element 50B by changing the magnetic flux $\phi$ between the first value and the second value larger than the first value. The first value is a value (0.5$\phi_0$×Mv1) corresponding to the above-mentioned first magnetic flux value Mv1. The second value may be, for example, substantially 0.500. In the second operation, the controller 70 performs the two-qubit operation of the first nonlinear element 50A and the second nonlinear element 50B by modulating the magnetic flux $\phi$ with alternating current.

The characteristics of the electronic circuit and the calculation device according to the embodiment will now be described.

The Lagrangian of the system including the first nonlinear element 50A, the second nonlinear element 50B, and the third nonlinear element 50C (coupler) is represented by the following first formula.

$$L=L_1+L_2+L_C+L_I \tag{1}$$

The left side of the first equation is the Lagrangian of the system including the coupler, the first nonlinear element 50A coupled with the coupler, and the second nonlinear element 50B coupled with the coupler.

The first term on the right side of the first equation is the Lagrangian of the first nonlinear element 50A. The second term on the right side of the first formula is the Lagrangian of the second nonlinear element 50B. The third term on the right side of the first formula is the Lagrangian of the coupler. The fourth term on the right side of the first formula is the Lagrangian representing the interaction between the coupler, the first nonlinear element 50A and the second nonlinear element 50B.

The Lagrangian of the first nonlinear element 50A is represented by the following second formula. In the second formula, "$C_1$" is a capacitor of the first element capacitor 41.

$$\mathcal{L}_1 = \frac{C_1}{2}\dot{\phi}_1^2 + \phi_0 I_{c1}\cos\theta_1 \tag{2}$$

In the second formula, the reduced magnetic flux quantum $\varphi_0$ corresponds to $1/(2\pi)$ times the magnetic flux quantum do.

The Lagrangian of the second nonlinear element 50B is represented by the following third formula. In the third formula, "$C_2$" is a capacitor of the second element capacitor 42.

$$\mathcal{L}_2 = \frac{C_2}{2}\dot{\phi}_2^2 + \phi_0 I_{c2}\cos\theta_2 \tag{3}$$

The Lagrangian representing the interaction between the coupler, the first nonlinear element 50A and the second nonlinear element 50B is represented by the following fourth formula. In the fourth formula, "$C_c$" is a capacitor of the third capacitor 13 and the fourth capacitor 14, respectively.

$$\begin{aligned}\mathcal{L}_I &= \frac{C_c}{2}(\dot{\phi}_1-\dot{\phi}_{c1})^2 + \frac{C_c}{2}(\dot{\phi}_2-\dot{\phi}_{c2})^2 \\ &= \frac{C_c}{2}\left(\dot{\phi}_1 - \frac{\dot{\phi}_{c+}+\dot{\phi}_{c-}}{2}\right)^2 + \frac{C_c}{2}\left(\dot{\phi}_2 - \frac{\dot{\phi}_{c+}-\dot{\phi}_{c-}}{2}\right)^2\end{aligned} \tag{4}$$

The Lagrangian of the coupler is represented by the following fifth formula. In the fifth formula, "C" is a capacitor of the first capacitor 11 and the second capacitor 12, respectively.

$$\mathcal{L}_c = \frac{C}{2}\dot{\phi}_{c1}^2 - \frac{\phi_{c1}^2}{2L} + \frac{C}{2}\dot{\phi}_{c2}^2 - \frac{\phi_{c2}^2}{2L} + \frac{C_J}{2}\left(\dot{\phi}_{c1} - \dot{\phi}_{c2} + \dot{\Phi}\right)^2 + \phi_0 I_c \cos\left(\theta_{c1} - \theta_{c2} + \frac{\Phi}{\phi_0}\right) = \frac{C}{4}\dot{\phi}_{c+}^2 - \frac{\phi_{c+}^2}{4L} + \frac{C}{4}\dot{\phi}_{c-}^2 - \frac{\phi_{c-}^2}{4L} + \frac{C_J}{2}\left(\dot{\phi}_{c-} + \dot{\Phi}\right)^2 + \phi_0 I_c \cos\left(\theta_{c-} + \frac{\Phi}{\phi_0}\right) \quad (5)$$

Here, φ is a magnetic flux operator. @ has a relationship represented by the following sixth formula with the phase difference θ.

$$\phi = \phi_0 \theta \quad (6)$$

The magnetic flux operator $\varphi_{c+}$ for the "+ mode" of the coupler is represented by the following seventh formula.

$$\phi_{c+} = \phi_{c1} + \phi_{c2} \quad (7)$$

The magnetic flux operator $\varphi_{c-}$ for the "− mode" of the coupler is represented by the following eighth formula.

$$\phi_{c-} = \phi_{c1} - \phi_{c2} \quad (8)$$

In the seventh and eighth formulae, Per is a magnetic flux operator for the portion of the third nonlinear element 50C including the first Josephson junction 21. In the seventh and eighth formulae, $\varphi_{c2}$ is a magnetic flux operator for the portion of the third nonlinear element 50C including the second Josephson junction 22.

On the right side of the above fourth formula, the symbols are interchanged in the first term and the second term. Coupling between qubits via±mode is cancelled.

In the above-mentioned fifth formula, the first term and the second term on the right side correspond to "+ mode". In the fifth formula, the third to sixth terms on the right side correspond to the "− mode". The "+ mode" corresponds to the LC resonator. In the "− mode", the frequency becomes variable due to the magnetic flux ϕ.

As described above, in the embodiment, the coupler has two modes, "+ mode" and "− mode", at the same time. A variable frequency is obtained by using the "− mode".

In the above, for the sake of simplicity, the case where the first capacitor 11 and the second capacitor 12 have the same value (C) is described. In the above, for the sake of simplicity, the case where the respective capacitors of the third capacitor 13 and the fourth capacitor 14 have the same value ($C_c$) with each other will be described. In the embodiment, the capacitor of the first capacitor 11 may be different from the capacitor of the second capacitor 12. In the embodiment, the capacitor of the third capacitor 13 may be different from the capacitor of the fourth capacitor 14.

Figure 22:
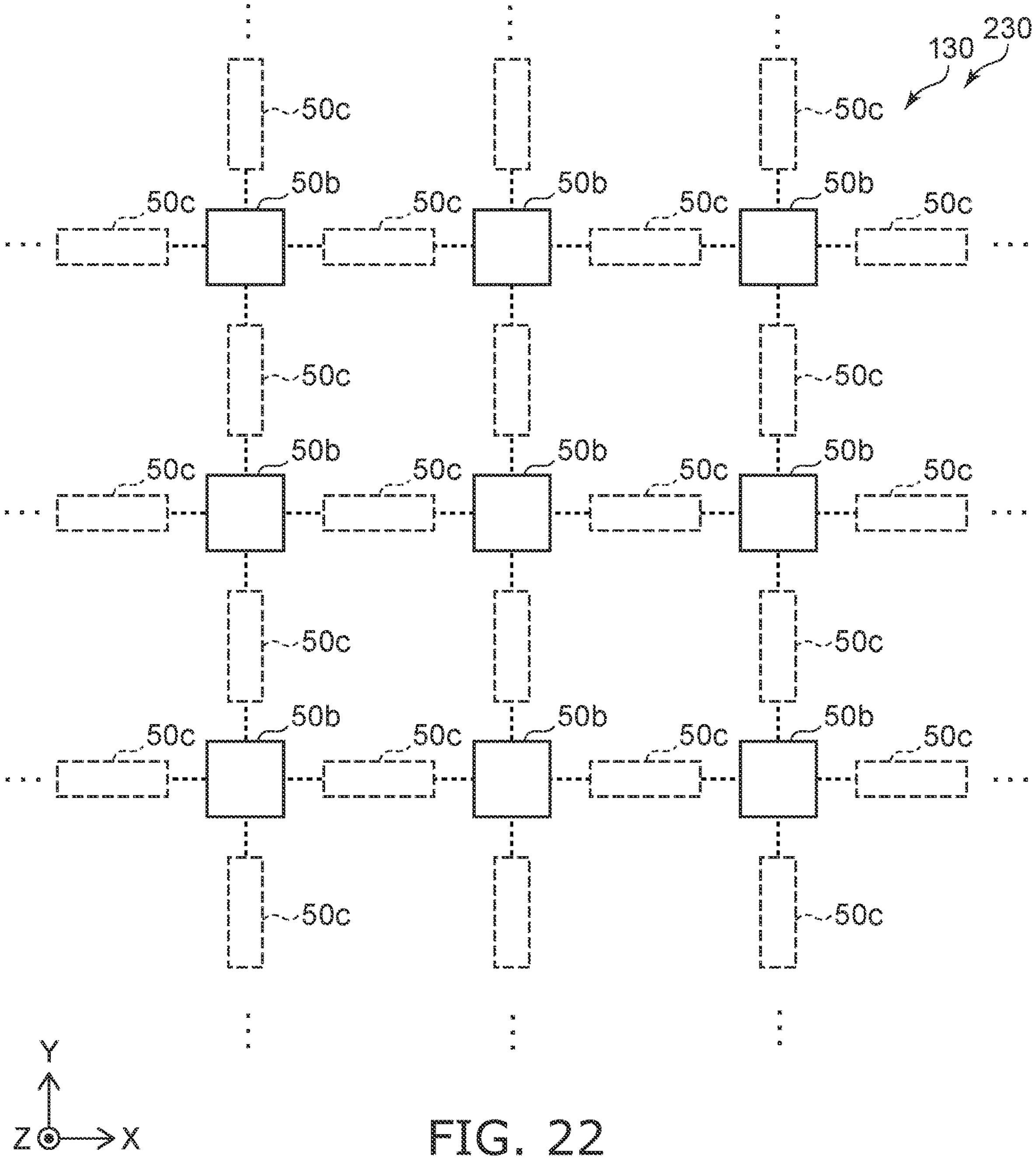
FIG. 22 is a schematic plan view illustrating an electronic circuit according to the first embodiment.

FIG. 22 is a schematic plan view illustrating an electronic circuit according to the first embodiment.

As shown in FIG. 22, an electronic circuit 130 according to the embodiment includes multiple qubits 50*b* and multiple couplers 50*c*. The multiple qubits 50*b* are provided in a matrix, for example, in the X-Y plane. One of the multiple couplers 50*c* is provided between one of the multiple qubits 50*b* and another one of the multiple qubits 50*b*. One of the multiple qubits 50*b* is, for example, the first nonlinear element 50A. Another one of the multiple qubits 50*b* is, for example, the second nonlinear element 50B. One of the multiple couplers 50*c* is, for example, the third nonlinear element 50C. One of the multiple couplers 50*c* can be coupled (e.g., capacitive coupling) with one of the multiple qubits 50*b*. One of the multiple couplers 50*c* can be coupled (e.g., capacitive coupling) with another one of the multiple qubits 50*b*. A calculation device 230 according to the embodiment includes the electronic circuit 130. In the electronic circuit 130, the configurations of the electronic circuits 110 to 117 and 120 are applicable. For example, the Josephson junction included in the multiple qubits 50*b* (for example, the first element Josephson junction 51 and the second element Josephson junction 52, etc.) is provided on the first surface F1. The Josephson junction circuit 53 included in each of the multiple couplers 50*c* is provided on the second surface F2.

Second Embodiment

FIGS. 23A, 23B, 24A, 24B, 25A, and 25B are schematic plan views illustrating an electronic circuit according to a second embodiment.

In an electronic circuit 140 according to the embodiment, the first to sixth surfaces F1 to F6 are provided. The configuration described with respect to FIG. 6 may be applied to the first to sixth surfaces F1 to F6. The first surface F1 is one surface (for example, the upper surface) of the first substrate 81. The second surface F2 is another surface (for example, a lower surface) of the first substrate 81. The second surface F2 is separated from the first surface F1 in the first direction crossing the first surface F1 and is along the first surface F1. The third surface F3 is one surface (for example, the upper surface) of the second substrate 82. The fourth surface F4 is another surface (for example, a lower surface) of the second substrate 82. The fourth surface F4 faces the first surface F1. The fourth surface F4 is between the first surface F1 and the third surface F3. The fifth surface F5 is one surface (for example, the upper surface) of the third substrate 83. The sixth surface F6 is another surface (for example, a lower surface) of the third substrate 83. The fifth surface F5 faces the second surface F2. The fifth surface F5 is between the sixth surface F6 and the second surface F2.

Figure 23A:
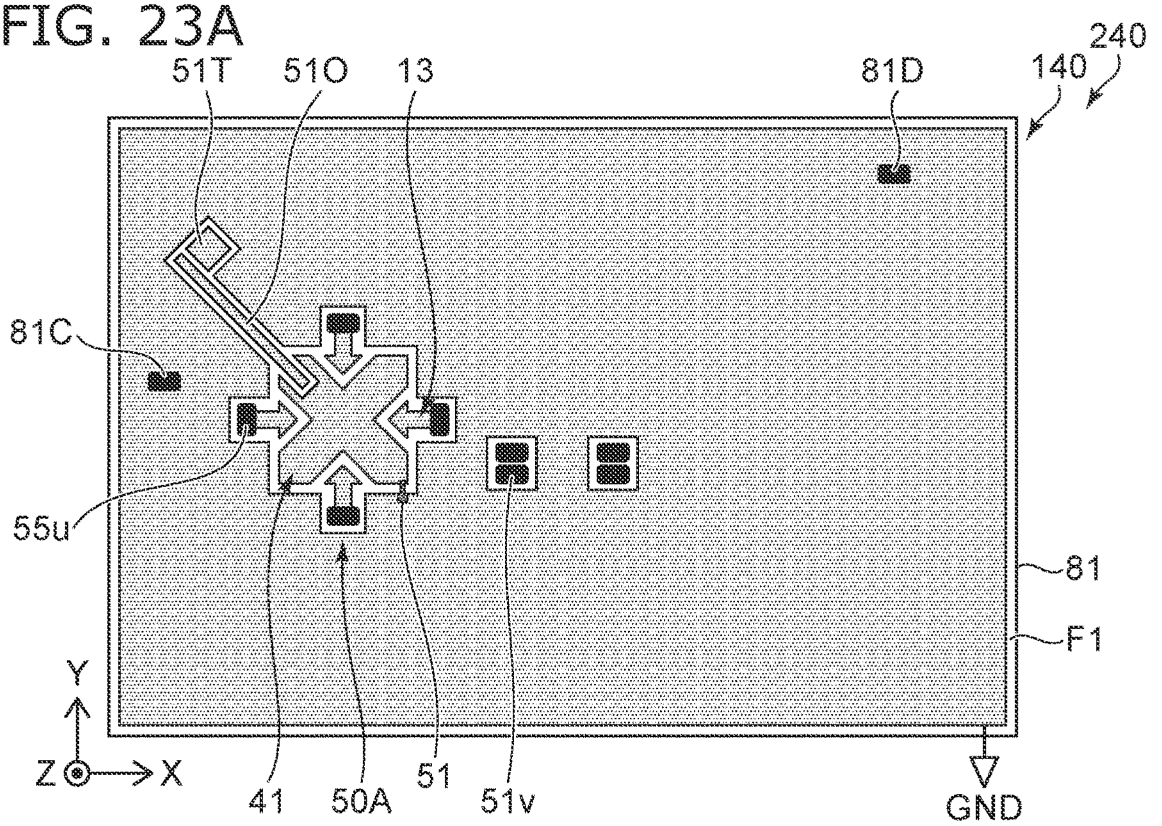
FIGS. 23A and 23B are schematic plan views illustrating an electronic circuit according to a second embodiment.
Figure 23B:
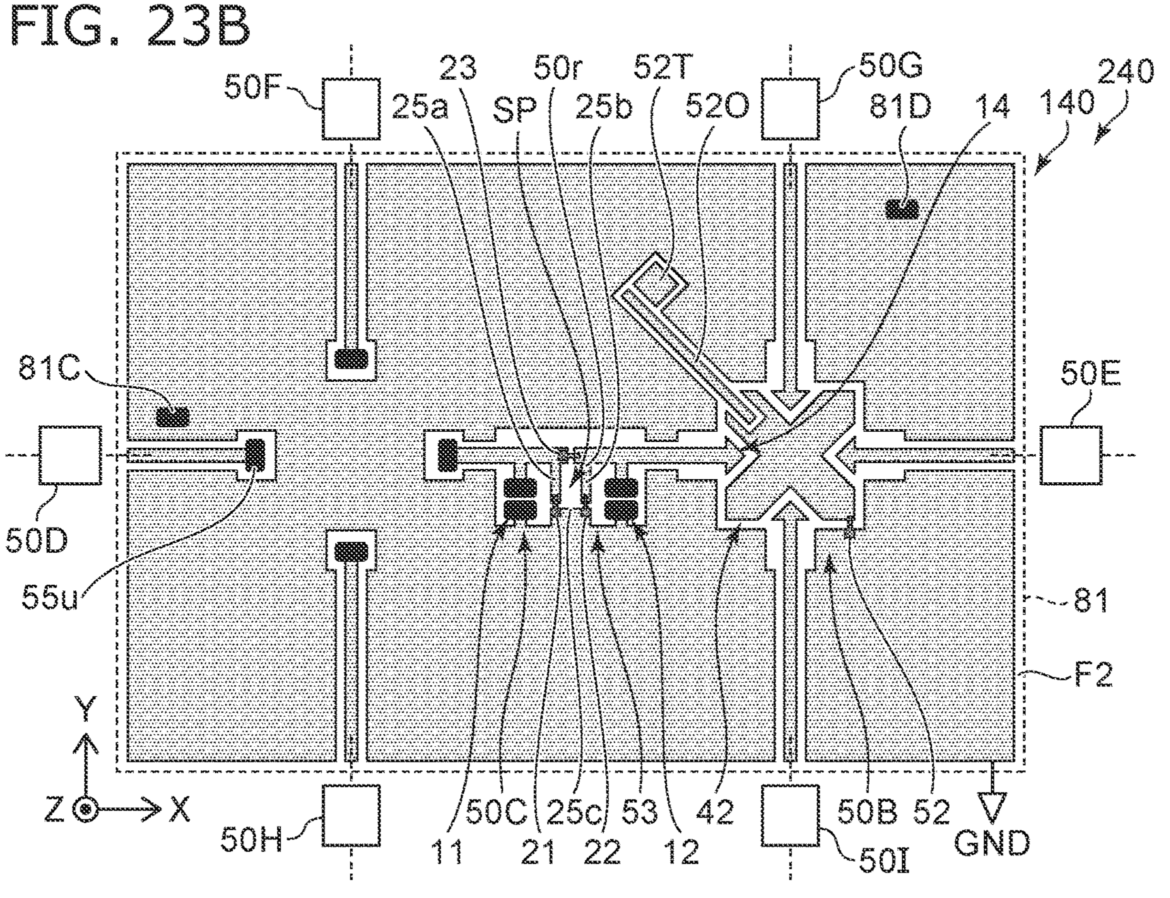

The electronic circuit 140 includes the first nonlinear element 50A, the second nonlinear element 50B, and the third nonlinear element 50C. The first nonlinear element 50A includes the first element Josephson junction 51. As shown in FIG. 23A, the first element Josephson junction 51 is provided on the first surface F1. The second nonlinear element 50B includes the second element Josephson junction 52. As shown in FIG. 23B, the second element Josephson junction 52 is provided on the second surface F2.

The third nonlinear element 50C includes the Josephson junction circuit 53. The third nonlinear element 50C can be coupled with the first nonlinear element 50A. The third nonlinear element 50C can be coupled with the second nonlinear element 50B.

The electronic circuit 140 also facilitates connection. For example, crosstalk between wires can be reduced. Extensibility is increased. An electronic circuit and a calculation device capable of improving the characteristics can be provided. For example, the qubit gate operation becomes stable. For example, the stability of the qubit is improved. A calculation device 240 according to the embodiment includes the electronic circuit 140 and the controller 70.

In the example of the electronic circuit 140, at least a part of the Josephson junction circuit 53 is provided on one of the first surface F1 and the second surface F2. In this example, the Josephson junction circuit 53 is provided on the second surface F2.

In the electronic circuit 140, the configuration of the electronic circuit according to the first embodiment may be applied to the configurations other than the above.

Figure 24A:
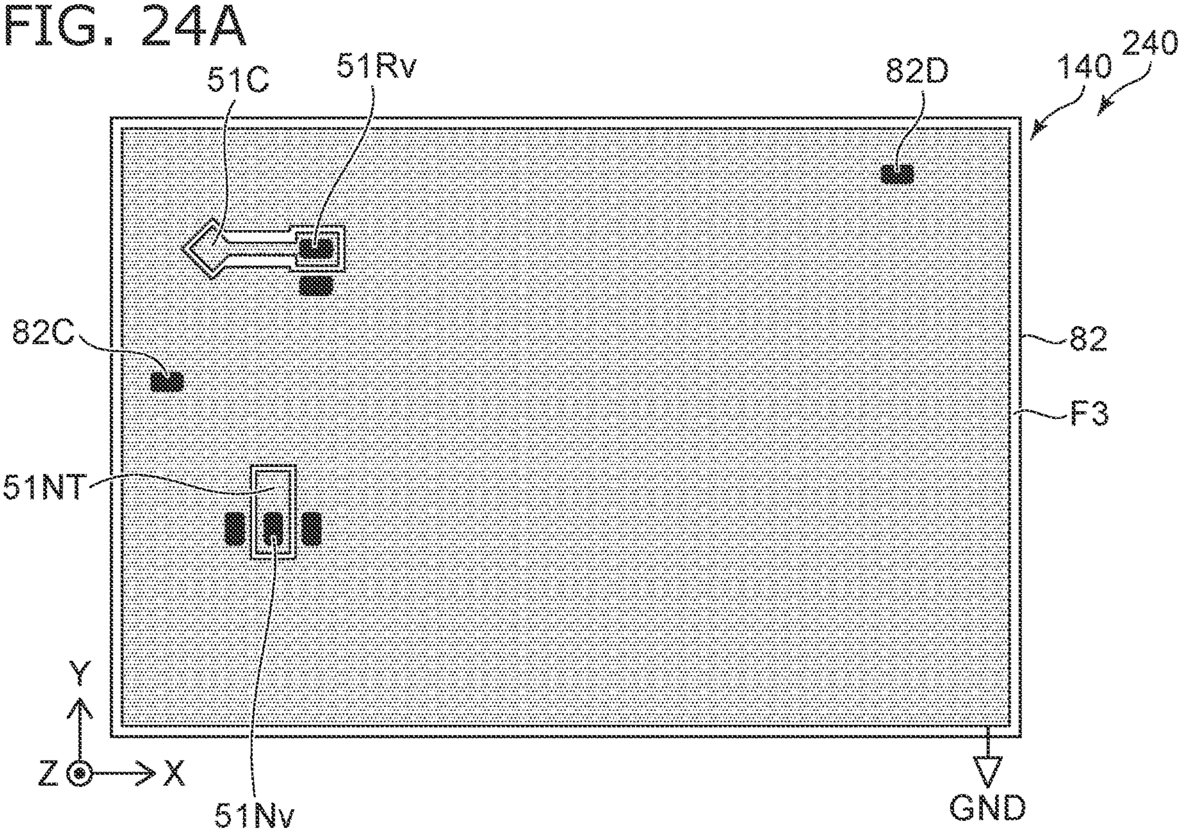
FIGS. 24A and 24B are schematic plan views illustrating the electronic circuit according to the second embodiment.
Figure 24B:
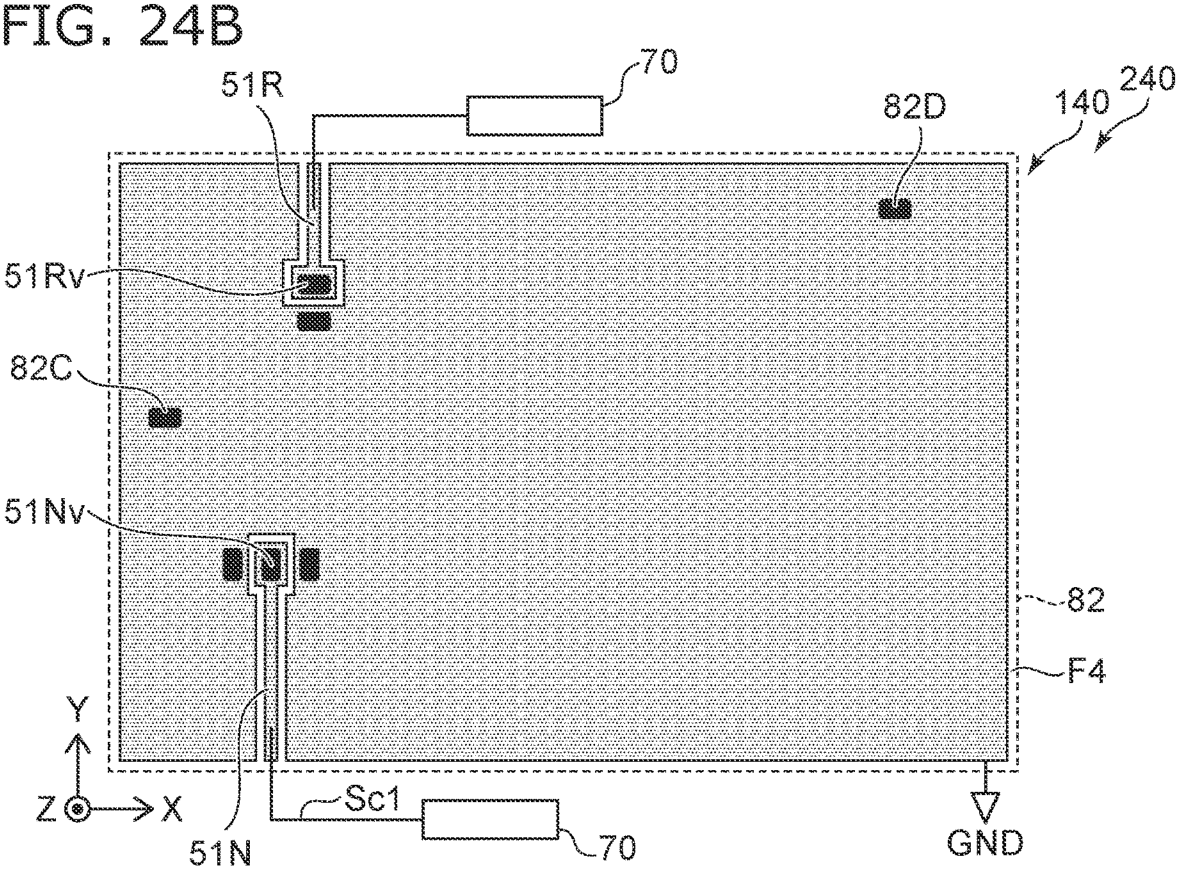

As shown in FIG. 23A, in this example, the first element resonator 510 and the first element terminal 51T are provided on the first surface F1. As shown in FIG. 23B, in this example, the second element resonator 520 and the second element terminal 52T are provided on the second surface F2. As shown in FIG. 24A, in this example, the first counter electrode 51C and the first control terminal 51NT are provided on the third surface F3. As shown in FIG. 24B, in this example, the first read-out electrode 51R and the first control electrode 51N are provided on the fourth surface F4.

Figure 25A:
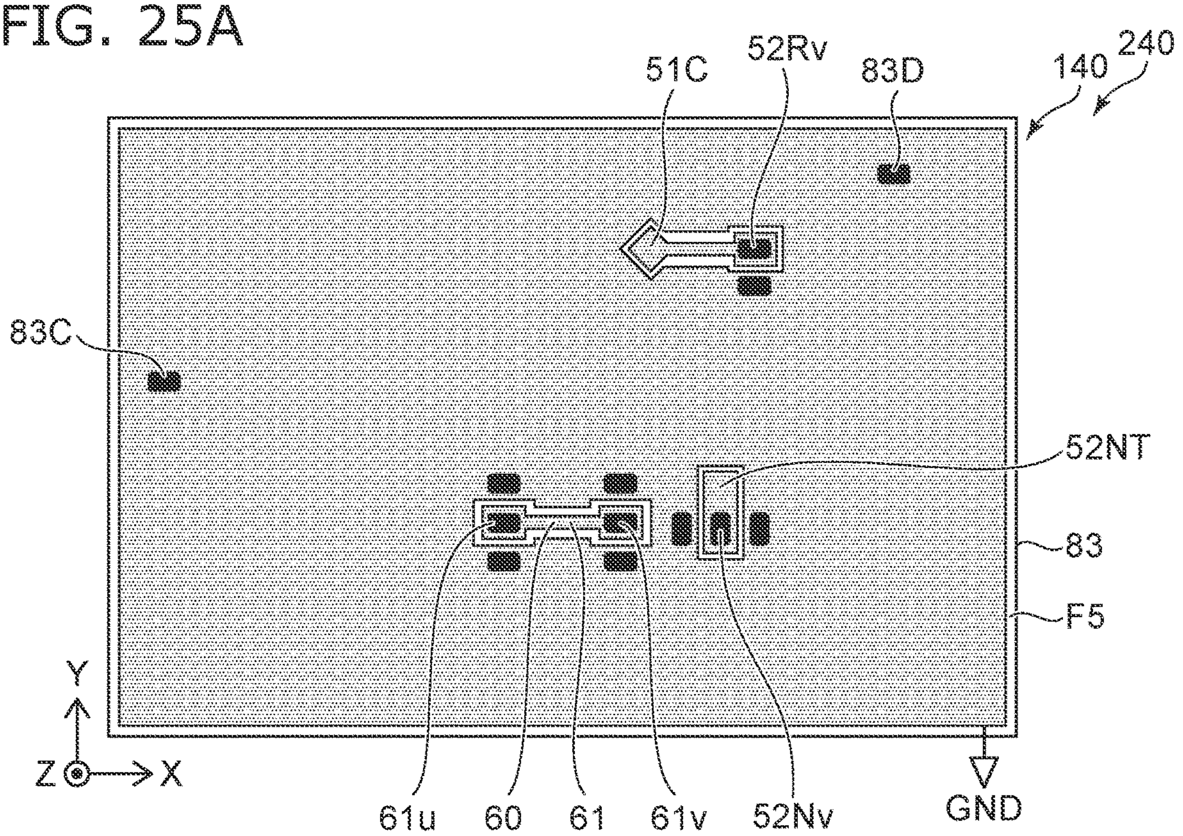
FIGS. 25A and 25B are schematic plan views illustrating the electronic circuit according to the second embodiment.
Figure 25B:
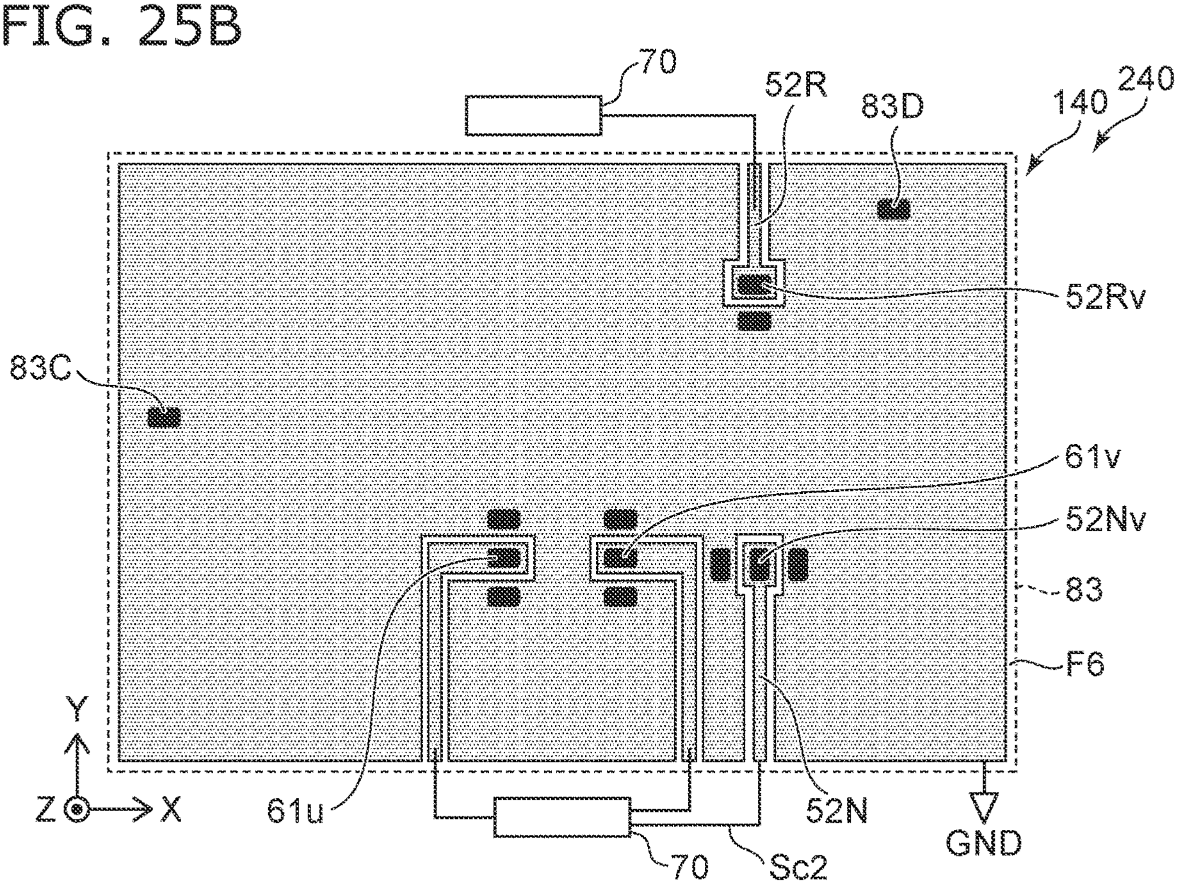

As shown in FIG. 25A, in this example, the second counter electrode 52C, the second control terminal 52NT, and the first control conductive member 61 are provided on the fifth surface F5. As shown in FIG. 25B, in this example, the second read-out electrode 52R and the second control electrode 52N are provided on the sixth surface F6. The first control conductive member 61 is connected to the controller 70 via the first control conductive portion 61*u* and the second control conductive portion 61*v* (see FIG. 25B). The second read-out electrode 52R is connected to the controller 70.

FIGS. 26A, 26B, 27A, 27B, 28A, and 28B are schematic plan views illustrating an electronic circuit according to the second embodiment.

Figure 26A:
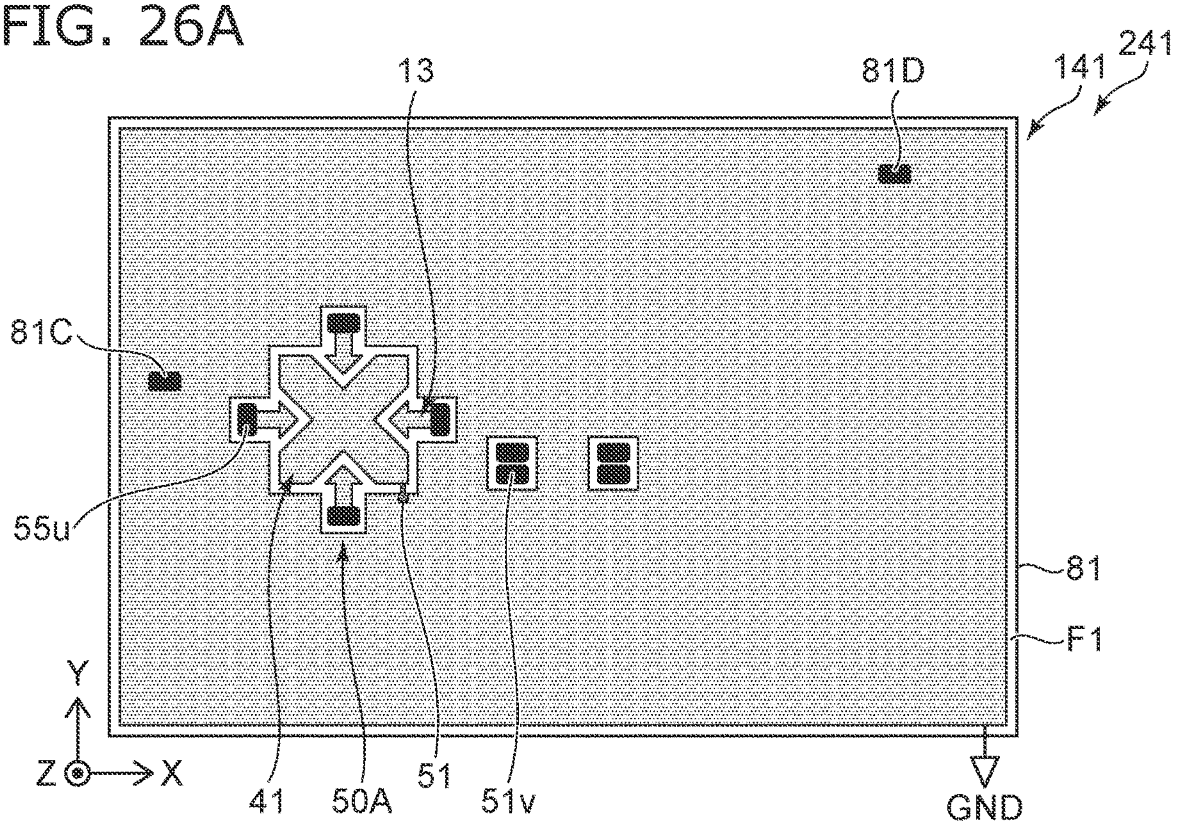
FIGS. 26A and 26B are schematic plan views illustrating an electronic circuit according to the second embodiment.
Figure 26B:
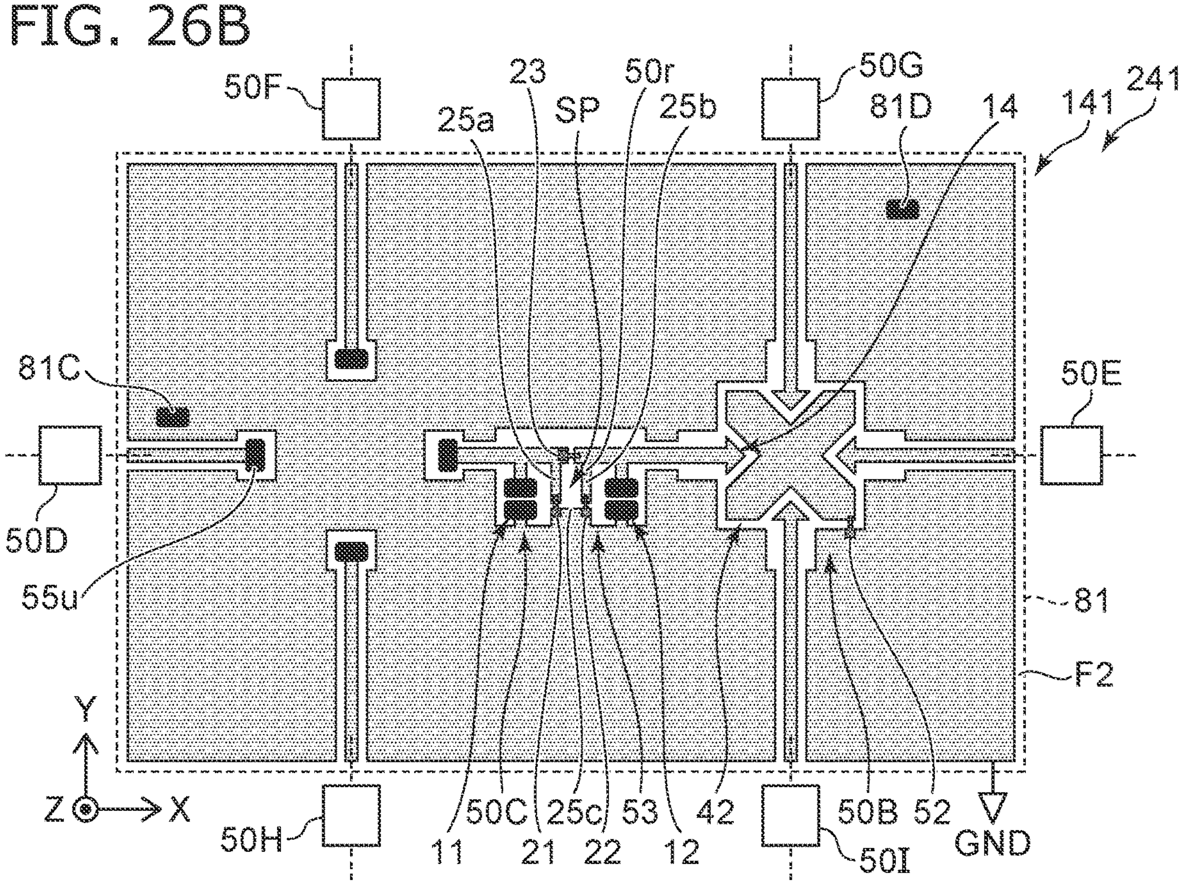
Figure 27A:
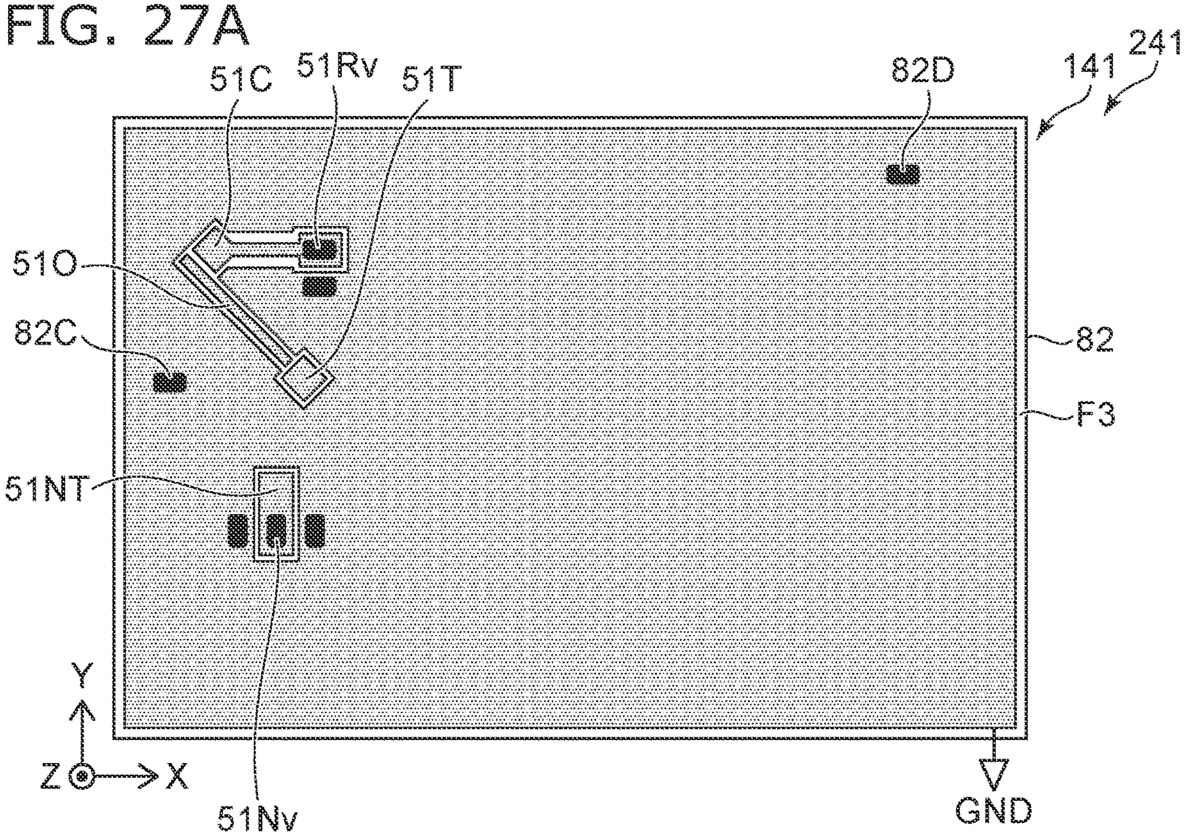
FIGS. 27A and 27B are schematic plan views illustrating the electronic circuit according to the second embodiment.
Figure 27B:
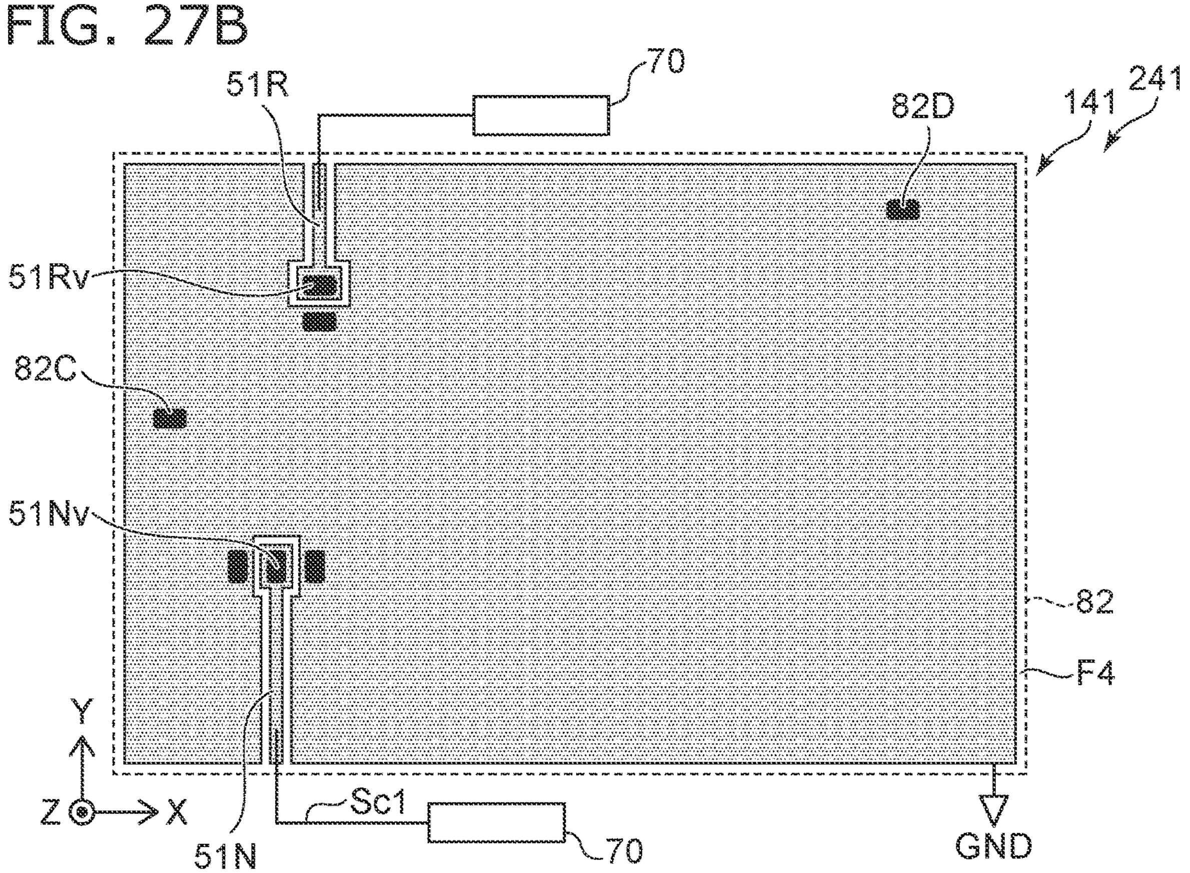

As shown in FIG. 26A, in an electronic circuit 141 according to the embodiment, the first element Josephson junction 51 is provided on the first surface F1. As shown in FIG. 26B, the second element Josephson junction 52 is provided on the second surface F2. In this example, as shown in FIG. 26B, in this example, the Josephson junction circuit 53 is provided on the second surface F2. As shown in FIG. 27A, the first element resonator 510, the first element terminal 51T, the first counter electrode 51C, and the first control terminal 51NT are provided on the third surface F3. As shown in FIG. 27B, the first read-out electrode 51R and the first control electrode 51N are provided on the fourth surface F4.

Figure 28A:
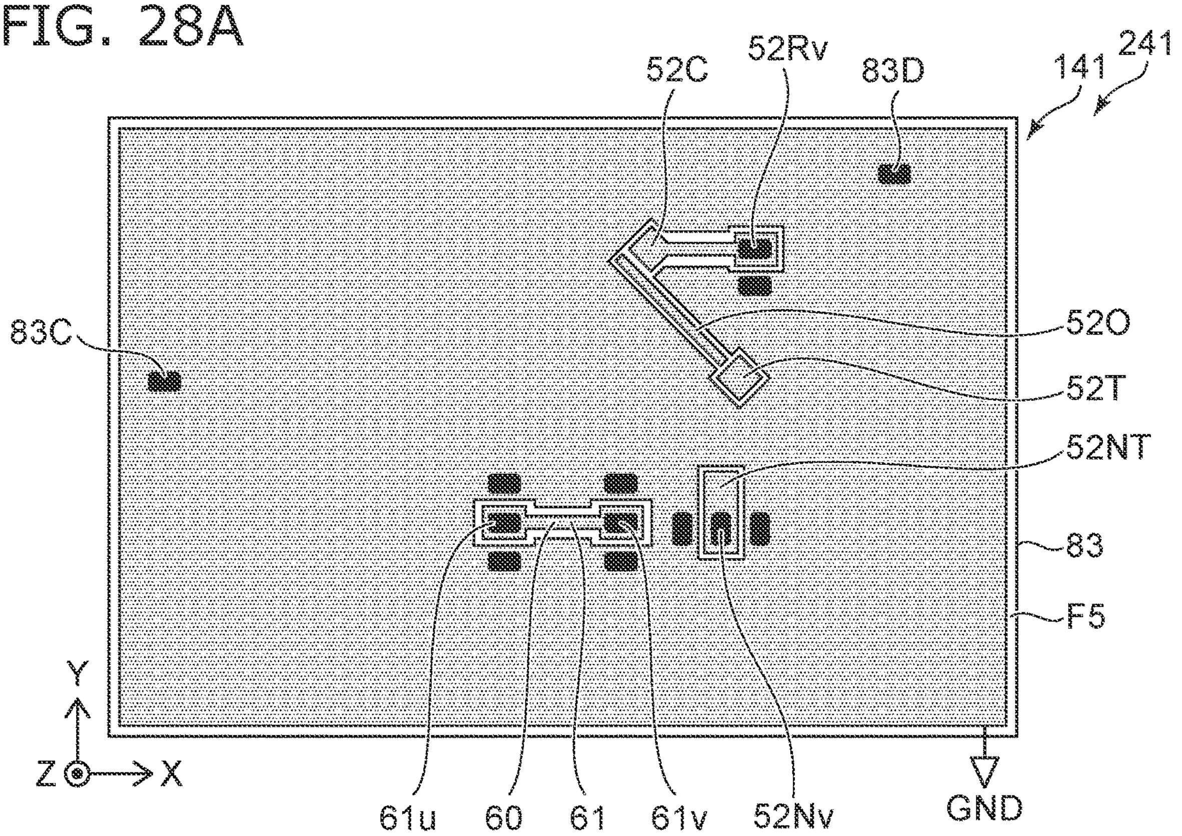
FIGS. 28A and 28B are schematic plan views illustrating the electronic circuit according to the second embodiment.
Figure 28B:
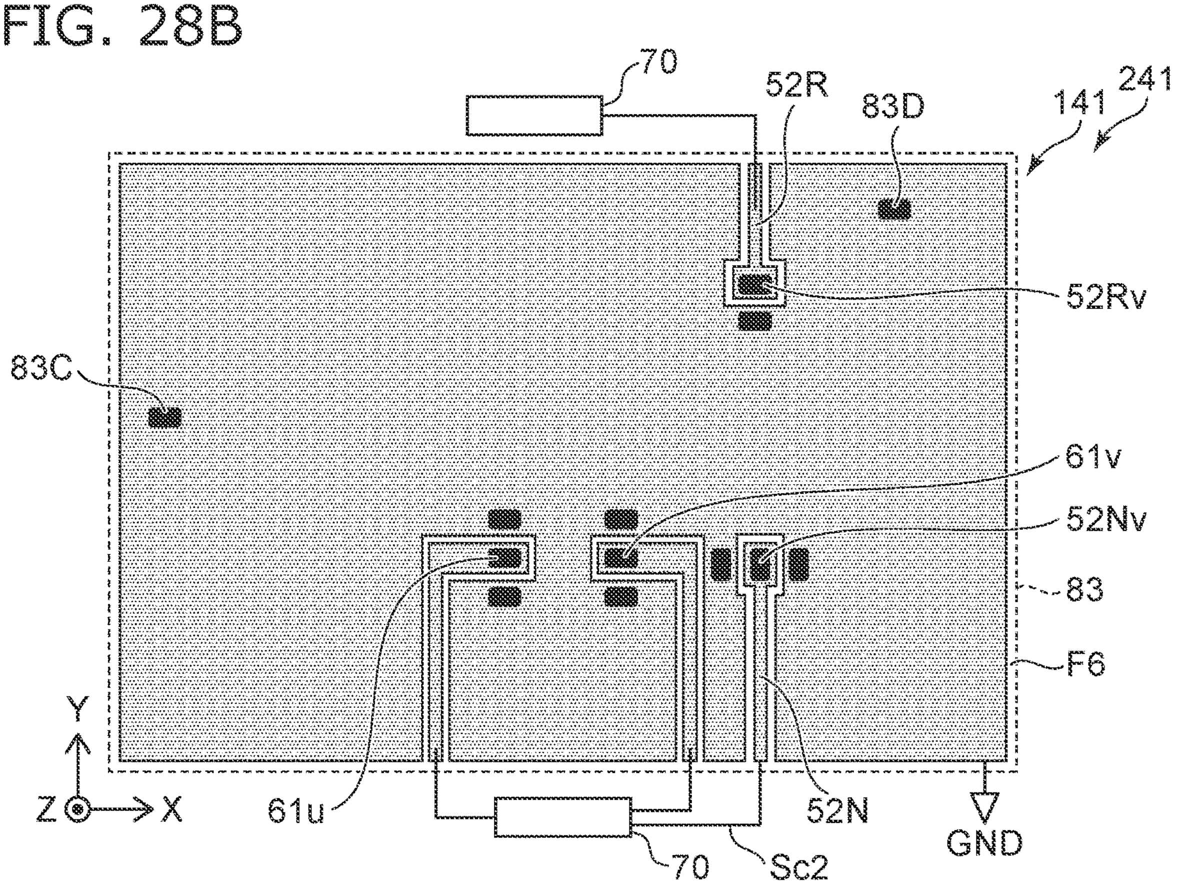

As shown in FIG. 28A, the second element resonator 520, the second element terminal 52T, the second counter electrode 52C, the second control terminal 52NT, and the first control conductive member 61 are provided on the fifth surface F5. As shown in FIG. 28B, the second read-out electrode 52R and the second control electrode 52N are provided on the sixth surface F6. The first control conductive member 61 is connected to the controller 70 via the first control conductive portion 61*u* and the second control conductive portion 61*v* (see FIG. 28B). The second read-out electrode 52R is connected to the controller 70.

Figure 29A:
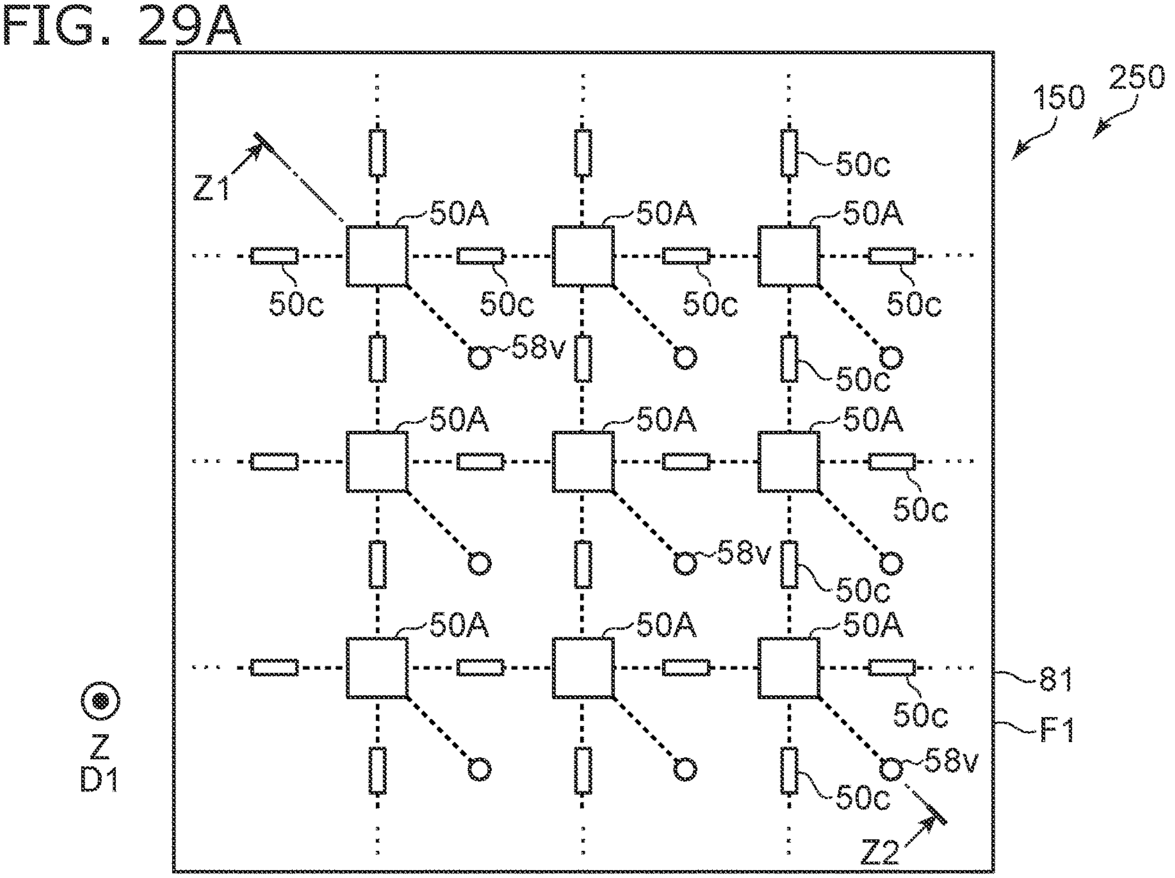
FIGS. 29A and 29B are schematic plan views illustrating an electronic circuit according to the second embodiment.
Figure 29B:
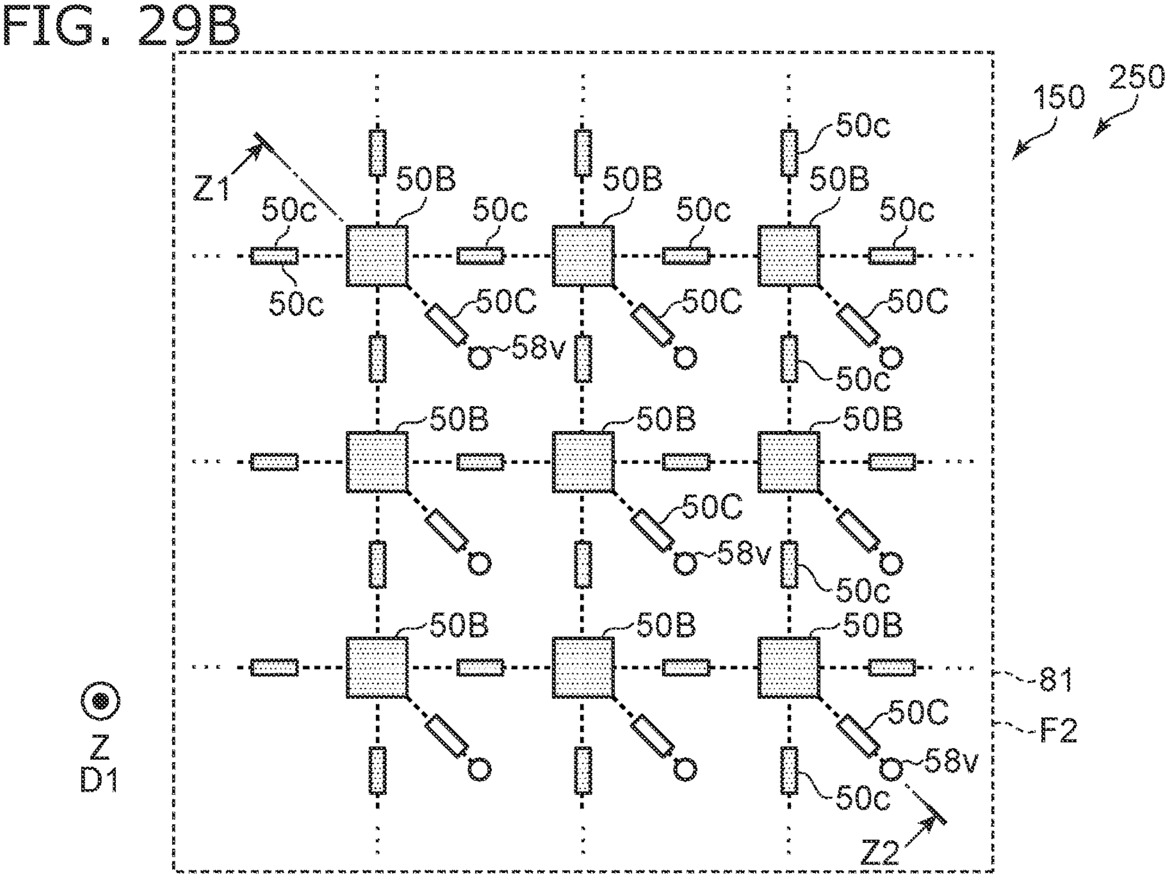

FIGS. 29A and 29B are schematic plan views illustrating an electronic circuit according to the second embodiment.

Figure 30:
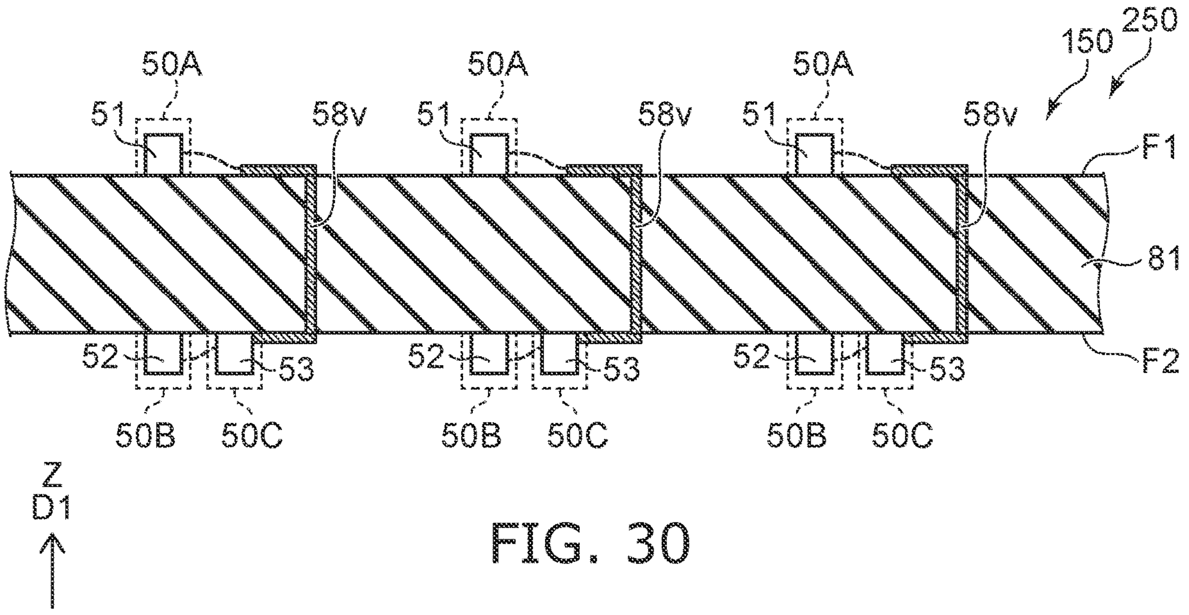
FIG. 30 is a schematic cross-sectional view illustrating the electronic circuit according to the second embodiment.

FIG. 30 is a schematic cross-sectional view illustrating the electronic circuit according to the second embodiment.

FIG. 29B is a transmission plan view. FIGS. 29A and 29B conceptually show coupling (e.g., capacitive coupling). FIG. 30 is a cross-sectional view along the line Z1-Z2 of FIGS. 29A and 29B.

As shown in FIG. 29A, an electronic circuit 150 according to the embodiment includes the first nonlinear element 50A (for example, multiple qubits). In this example, the multiple first nonlinear elements 50A are provided in a matrix along the first surface F1 along the X-Y plane, for example. As shown in FIG. 29A, the multiple couplers 50*c* may be provided on the first surface F1. One of the multiple couplers 50*c* provided on the first surface F1 may couple one of the multiple first nonlinear elements 50A and another one of the multiple first nonlinear elements 50A. In FIG. 29A, the broken line connecting one of the multiple couplers 50*c* and one of the multiple first nonlinear elements 50A corresponds to capacitive coupling.

As shown in FIG. 29B, the electronic circuit 150 includes multiple second nonlinear elements 50B (for example, multiple qubits). In this example, the multiple second nonlinear elements 50B are provided in a matrix along the second surface F2 along the X-Y plane, for example. As shown in FIG. 29B, the multiple couplers 50*c* may be provided on the second surface F2. One of the multiple couplers 50*c* provided on the second surface F2 may couple one of the multiple second nonlinear elements 50B and another one of the multiple second nonlinear elements 50B. In FIG. 29B, the broken line connecting one of the multiple couplers 50*c* and one of the multiple second nonlinear elements 50B corresponds to capacitive coupling.

As shown in FIG. 29B, the electronic circuit 150 includes the third nonlinear element 50C (coupler). In this example, the multiple third nonlinear elements 50C are provided. In this example, the third nonlinear elements 50C are provided on the second surface F2. In the embodiment, the third nonlinear elements 50C may be provided on the first surface F1.

As described above, the first nonlinear element 50A includes the first element Josephson junction 51 (see FIG. 30). The second nonlinear element 50B includes the second element Josephson junction 52 (see FIG. 30). The third nonlinear element 50C includes the Josephson junction circuit 53 (see FIG. 30). As described above, the Josephson junction circuit 53 may include the first Josephson junction 21, the second Josephson junction 22, the third Josephson junction 23, and the like.

As shown in FIG. 30, the first element Josephson junction 51 is provided on the first surface F1. The second element Josephson junction 52 is provided on the second surface F2. The second surface F2 is separated from the first surface F1 in the first direction D1 (for example, the Z-axis direction) crossing the first surface F1 and is along the first surface F1. In this example, the first surface F1 is one surface (for example, the upper surface) of the first substrate 81. The second surface F2 is another surface (for example, a lower surface) of the first substrate 81.

The third nonlinear element 50C can be coupled with the first nonlinear element 50A, and the third nonlinear element 50C can be coupled with the second nonlinear element 50B. At least a part of the Josephson junction circuit 53 is provided on one of the first surface F1 and the second surface F2. In this example, the Josephson junction circuit 53 is provided on the second surface F2.

Also in the electronic circuit 150, it is possible to provide an electronic circuit and a calculation device capable of improving the characteristics. A calculation device 250 includes the electronic circuit 150 described above.

In the electronic circuit 150, for example, the Josephson junction circuit 53 can be coupled with the first element Josephson junction 51. For example, the Josephson junction circuit 53 can be coupled with the second element Josephson junction 52.

As shown in FIG. 30, in this example, in the first direction D1 (for example, the Z-axis direction), at least a part of the first element Josephson junction 51 overlaps the second element Josephson junction 52. In the electronic circuit 150 as described above, for example, the first element Josephson junction 51 provided on the first surface F1 may be coupled with the second element Josephson junction 52, which is the closest to the first element Josephson junction 51 among the multiple second element Josephson junctions 52 provided on the second surface F2.

In this example, one of the multiple second element Josephson junctions 52 overlaps one of the multiple first element Josephson junctions 51 in the first direction D1 (for example, in the Z-axis direction). The above one of the multiple second element Josephson junctions 52 is coupled with the above one of the multiple first element Josephson junctions 51 by the third nonlinear element 50C.

In this example, a connection member 58*v* is provided. The connection member 58*v* extends in the first substrate 81 along the first direction D1. The connection member 58*v* couples the first element Josephson junction 51 provided on the first surface F1 with the third nonlinear element 50C (Josephson junction circuit 53) provided on the second surface F2. The third nonlinear element 50C (Josephson junction circuit 53) provided on the second surface F2 is coupled with the second element Josephson junction 52 provided on the second surface F2.

In the embodiment, the first element Josephson junction 51 provided on the first surface F1 may be coupled with the second element Josephson junction 52 which is not closest to the first element Josephson junction 51 among the multiple second element Josephson junctions 52 provided on the second surface F2. For example, as described below, the first element Josephson junction 51 provided on the first surface F1 may be coupled with the second element Josephson junction 52, which is closer to the third (or higher) to the first element Josephson junction 51 among the multiple second element Josephson junctions 52 provided on the second surface F2.

Figure 31:
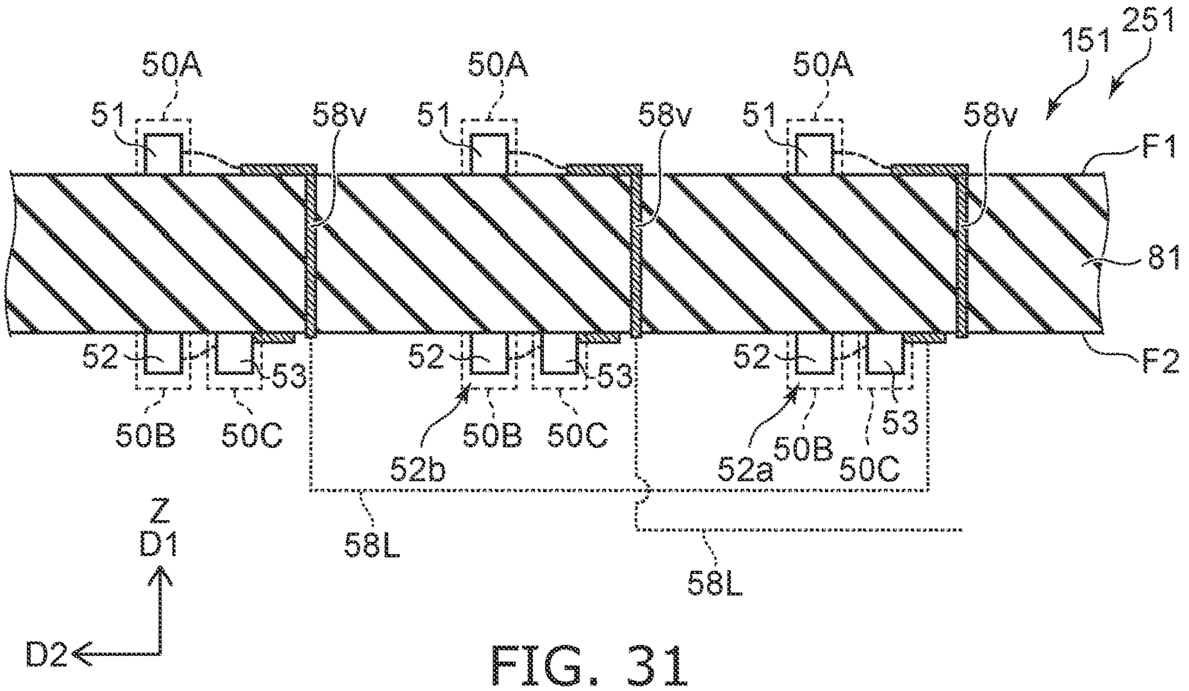
FIG. 31 is a schematic cross-sectional view illustrating an electronic circuit according to the second embodiment.

FIG. 31 is a schematic cross-sectional view illustrating an electronic circuit according to the second embodiment.

As shown in FIG. 31, in an electronic circuit 151 according to the embodiment, the multiple second element Josephson junctions 52 are provided on the second surface F2. The direction from one of the multiple second element Josephson junctions 52 (second element Josephson junction 52*a*) to another of the multiple second element Josephson junctions 52 (second element Josephson junction 52*b*) is along the second direction D2. The second direction D2 crosses first direction D1 (for example, the Z-axis direction).

The Josephson junction circuit 53 included in the third nonlinear element 50C is coupled with one of the multiple second element Josephson junctions 52 (second element Josephson junction 52*a*). As described above, the Josephson junction circuit 53 is coupled with the first element Josephson junction 51. The coupling is a capacitive coupling. In this example, the Josephson junction circuit 53 is coupled with the first element Josephson junction 51 via a wire 58L (conductive member) and the connection member 58*v*. A position of another one of the multiple second element Josephson junctions 52 (second element Josephson junction 52*b*) in the second direction D2 is between a position of the first element Josephson junction 51 in the second direction D2 and a position of one of the above (second element Josephson junction 52*a*) of the multiple second element Josephson junctions 52 in the second direction D2.

That is, in the electronic circuit 151, the first element Josephson junction 51 is coupled with the second element Josephson junction 52, which is the third (or more) closer to the first element Josephson junction 51 among the plurality of second element Josephson junctions 52. Another second element Josephson junction 52 may exist between one of the multiple second element Josephson junctions 52 coupled with the first element Josephson junction 51 and the first element Josephson junction 51. A calculation device 251 includes the electronic circuit 151 described above.

Figure 32:
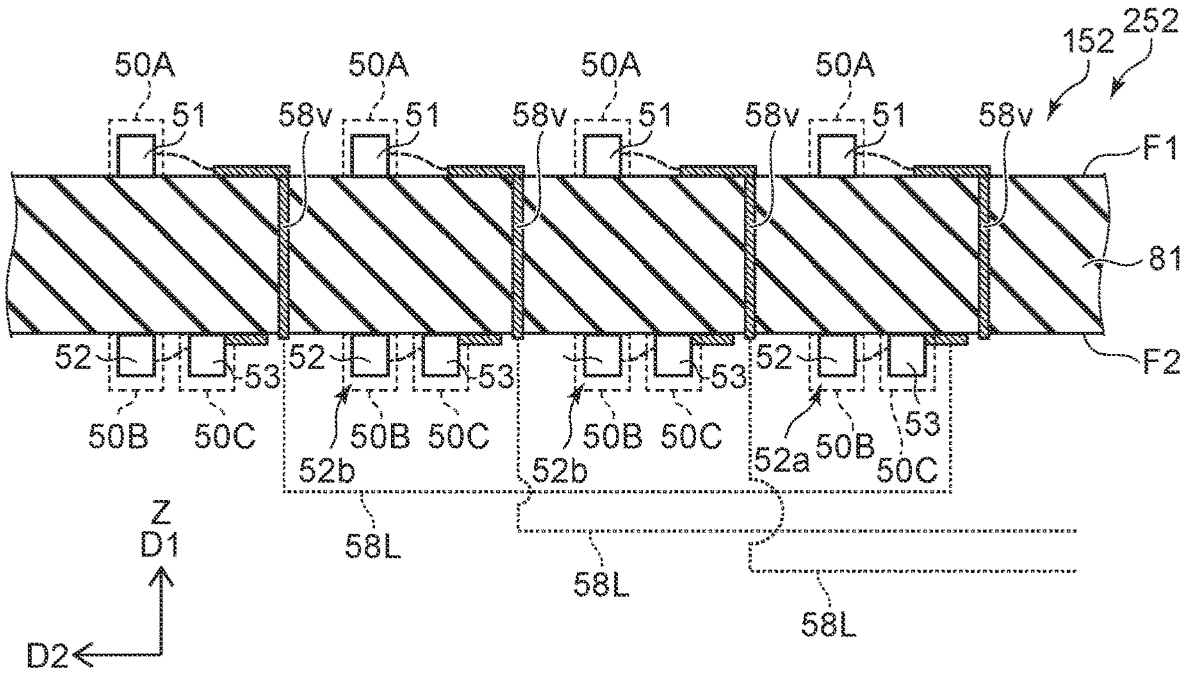
FIG. 32 is a schematic cross-sectional view illustrating an electronic circuit according to the second embodiment.

FIG. 32 is a schematic cross-sectional view illustrating an electronic circuit according to the second embodiment.

As shown in FIG. 32, in an electronic circuit 152 according to the embodiment, the first element Josephson junction 51 and one of the multiple second element Josephson junctions 52 (second element Josephson junction 52*a*) are coupled by the Josephson junction circuit 53. The coupling is a capacitive coupling. The coupling is performed, for example, via the wire 58L and the connection member 58*v*. The multiple second element Josephson junctions 52 (multiple second element Josephson junctions 52*b*) may be provided between the first element Josephson junction 51 and one of the multiple second element Josephson junctions 52. A calculation device 252 includes the electronic circuit 152 described above.

In FIGS. 30 to 32, the broken line connecting the first element Josephson junction 51 to the connection member 58*v* corresponds to the capacitive coupling. The broken line connecting the second element Josephson junction 52 to the Josephson junction circuit 53 corresponds to the capacitive coupling.

In the electronic circuits 140, 141, and 150 to 152, the configurations described with respect to the first embodiment may be applied to the extent technically possible.

Figure 33:
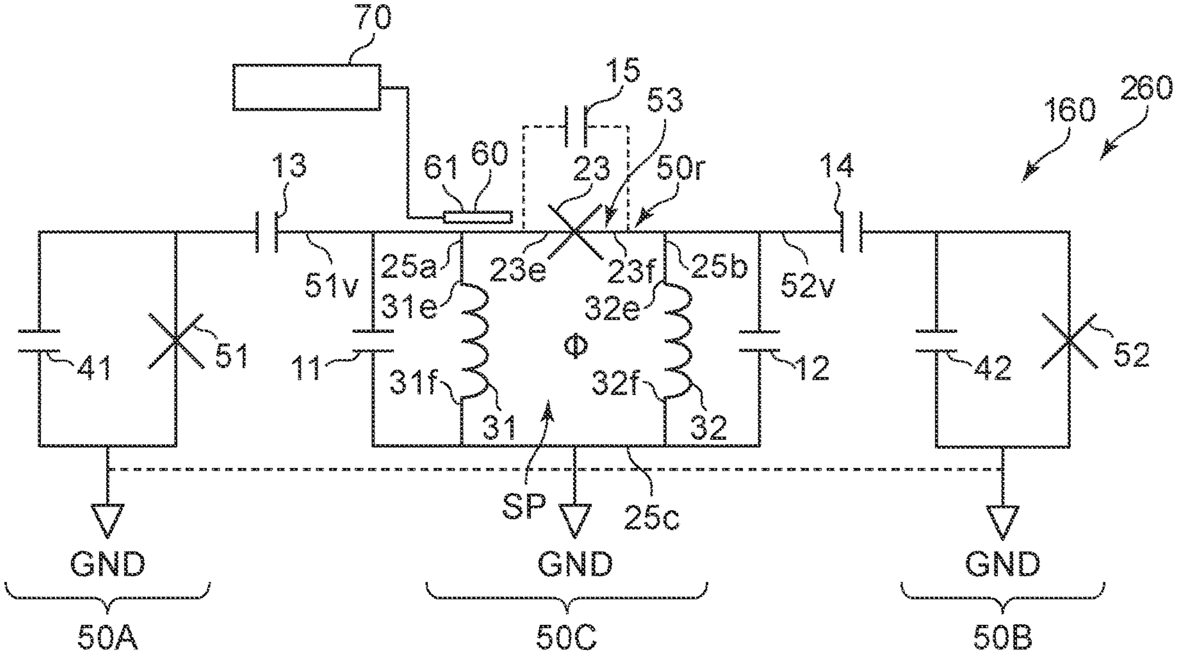
FIG. 33 is a schematic view illustrating an electronic circuit and a calculation device according to the embodiment.

FIG. 33 is a schematic view illustrating an electronic circuit and a calculation device according to the embodiment.

As shown in FIG. 33, in an electronic circuit 160 according to the embodiment, the Josephson junction circuit 53 includes a first inductor 31, a second inductor 32, and the third Josephson junction 23. The third nonlinear element 50C further includes the first conductive member 25*a*, the second conductive member 25*b*, and the third conductive member 25*c*. The first conductive member 25*a* connects the first inductor 31 to the third Josephson junction 23. The second conductive member 25*b* connects the second inductor 32 to the third Josephson junction 23. The third conductive member 25*c* connects the first inductor 31 to the second inductor 32. These connections may be, for example, electrical connections.

For example, the first conductive member 25*a* connects one end 31*e* of the first inductor 31 to one end 23*e* of the third Josephson junction 23. The second conductive member 25*b* connects one end 32*e* of the second inductor 32 to other end 23*f* of the third Josephson junction 23. The third conductive member 25*c* connects other end 31*f* of the first inductor 31 to other end 32*f* of the second inductor 32.

In the electronic circuit 160, the third Josephson junction 23 is provided on the second surface F2. The first inductor 31 and the second inductor 32 may be provided on the second surface F2. As the configuration of the electronic circuit 160, the configurations described with respect to the electronic circuits 110 to 117, 120, 130, 140, 141, 150 to 152 may be applied. A calculation device 260 includes the electronic circuit 160 described above.

Third Embodiment

The third embodiment relates to a method for manufacturing the electronic circuit.

FIGS. 34A to 34I are schematic cross-sectional views illustrating a method for manufacturing the electronic circuit according to the third embodiment.

Figure 34A:
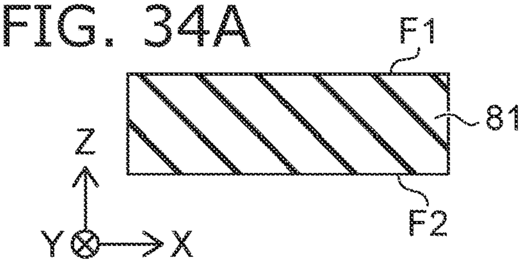
FIGS. 34A to 34I are schematic cross-sectional views illustrating a method for manufacturing the electronic circuit according to a third embodiment.

As shown in FIG. 34A, the first substrate 81 is prepared. The first substrate 81 includes the first surface F1 and the second surface F2.

Figure 34B:
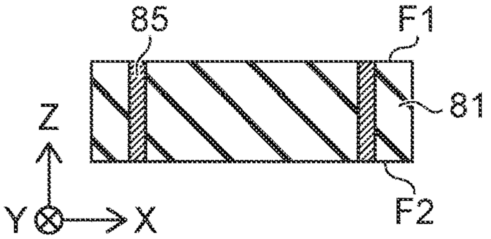

As shown in FIG. 34B, a conductive portion 85 is formed on the first substrate 81. The conductive portion 85 is along the first direction (Z-axis direction) from the second surface F2 to the first surface F1. The conductive portion 85 may be a TSV or the like. The conductive portion 85 may be the first element conductive portion 51*v*, the second element conductive portion 52*v*, or the like.

Figure 34C:
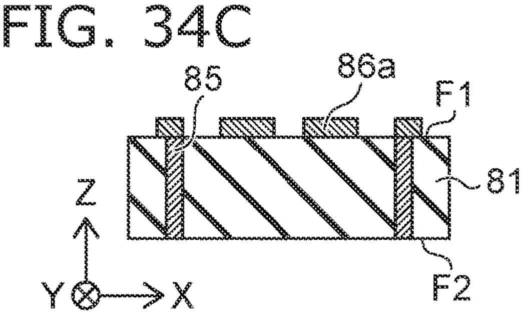

As shown in FIG. 34C, a conductive member 86*a* is formed on the first surface F1. The conductive member 86*a* may be at least a part of the capacitor included in the first nonlinear element 50A, the second nonlinear element 50B, and the like. At least a part of the conductive member 86*a* is electrically connected to the conductive portion 85.

Figure 34D:
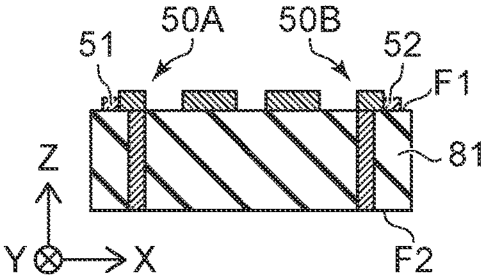

As shown in FIG. 34D, the first element Josephson junction 51 and the second element Josephson junction 52 are formed on the first surface F1. In this way, the first nonlinear element 50A and the second nonlinear element 50B are formed on the first surface F1 of the first substrate 81. The first nonlinear element 50A includes the first element Josephson junction 51. The second nonlinear element 50B includes the second element Josephson junction 52.

Figure 34E:
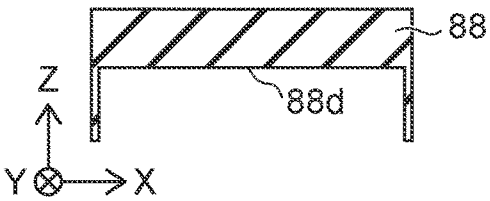
Figure 34F:
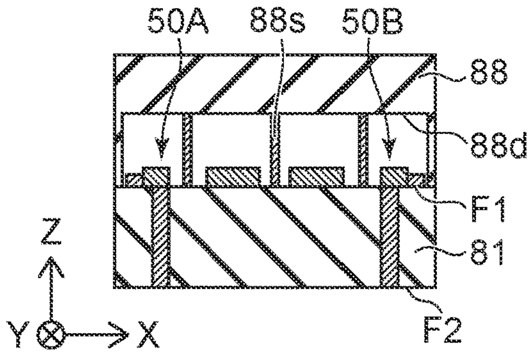

As shown in FIG. 34E, a first member 88 including a recess 88*d* is prepared. As shown in FIG. 34F, the first member 88 is provided. The first nonlinear element 50A and the second nonlinear element 50B are between the first substrate 81 and the recess 88*d*. A support portion 88*s* may be provided between the first surface F1 and the recess 88*d*. The support portion 88*s* stabilizes a distance between the first surface F1 and the recess 88*d*.

Figure 34G:
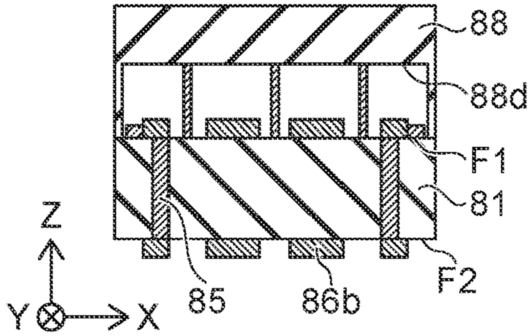

As shown in FIG. 34G, a conductive member 86*b* is formed on the second surface F2. The conductive member 86*b* may be at least a part of the capacitor included in the third nonlinear element 50C or the like. At least a part of the conductive member 86*b* is electrically connected to the conductive portion 85.

Figure 34H:
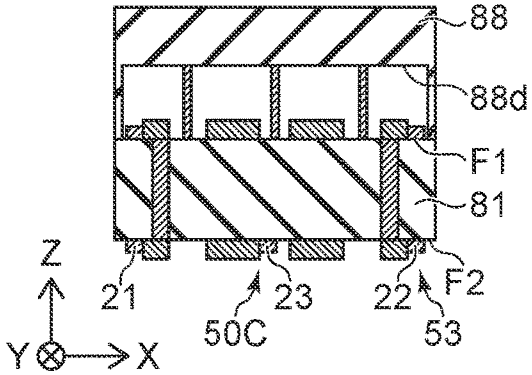

As shown in FIG. 34H, the first Josephson junction 21, the second Josephson junction 22, and the third Josephson junction 23 are formed on the second surface F2. These Josephson junctions are included in the Josephson junction circuit 53 of the third nonlinear element 50C. As described above, in this manufacturing method, the third nonlinear element 50C including the Josephson junction circuit 53 is formed on the second surface F2 of the first substrate 81. The first surface F1 is between the second surface F2 and the first member 88.

Figure 34I:
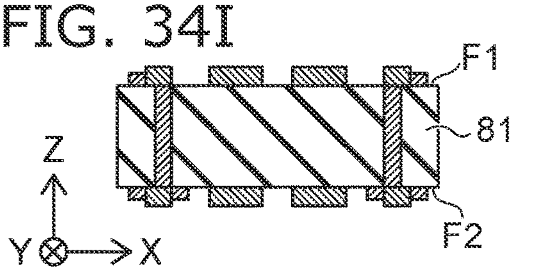

As shown in FIG. 34I, the first member 88 is removed. Thereby, for example, the electronic circuit 110 is obtained.

FIGS. 35A to 35I are schematic cross-sectional views illustrating a method for manufacturing the electronic circuit according to the third embodiment.

Figure 35A:
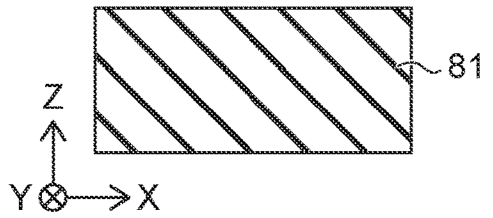
FIGS. 35A to 35I are schematic cross-sectional views illustrating a method for manufacturing the electronic circuit according to the third embodiment.
Figure 35B:
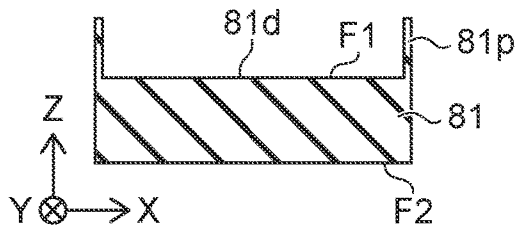

As shown in FIG. 35A, a substrate to be the first substrate 81 is prepared. As shown in FIG. 35B, a recess 81*d* is formed on the first surface F1 of the first substrate 81. The first substrate 81 includes the second surface F2. The first substrate 81 includes a protrusion 81*p* around the recess 81*d*.

Figure 35C:
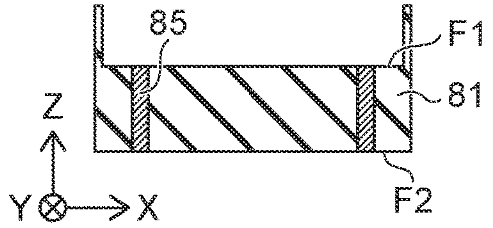

As shown in FIG. 35C, the conductive portion 85 is formed on the first substrate 81. The conductive portion 85 is along the first direction (Z-axis direction) from the second surface F2 to the first surface F1. The conductive portion 85 may be a TSV or the like. The conductive portion 85 may be the first element conductive portion 51*v*, the second element conductive portion 52*v*, or the like.

Figure 35D:
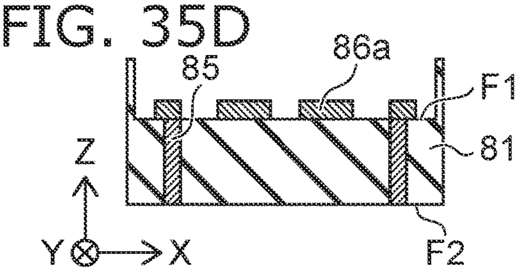

As shown in FIG. 35D, the conductive member 86*a* is formed on the first surface F1. The conductive member 86*a* may be at least a part of the capacitor included in the first nonlinear element 50A, the second nonlinear element 50B, and the like. At least a part of the conductive member 86*a* is electrically connected to the conductive portion 85.

Figure 35E:
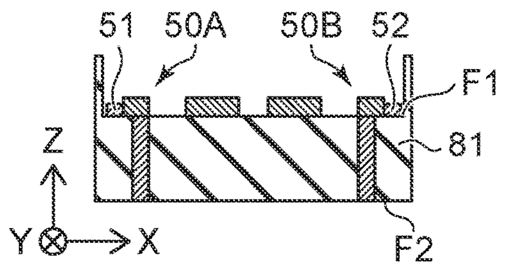

As shown in FIG. 35E, the first element Josephson junction 51 and the second element Josephson junction 52 are formed on the first surface F1. In this way, the first nonlinear element 50A and the second nonlinear element 50B are formed on the first surface F1 of the first substrate 81. The first nonlinear element 50A includes the first element Josephson junction 51. The second nonlinear element 50B includes the second element Josephson junction 52.

Figure 35F:
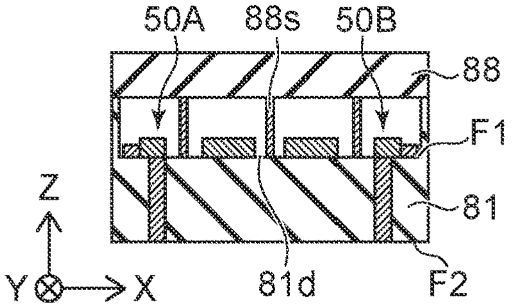

As shown in FIG. 35F, the first member 88 is provided. The first nonlinear element 50A and the second nonlinear element 50B are between the first substrate 81 and the first member 88. The support portion 88*s* may be provided between the recess 81*d* of the first surface F1 and the first member 88. The support portion 88*s* stabilizes the distance between the recess 81*d* and the first member 88.

Figure 35G:
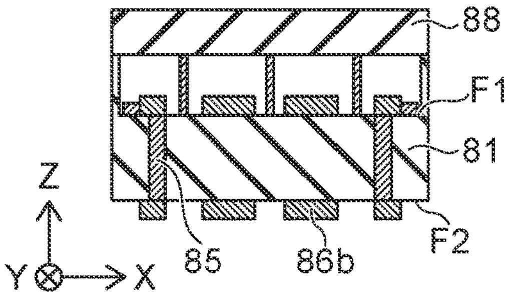

As shown in FIG. 35G, the conductive member 86*b* is formed on the second surface F2. The conductive member 86*b* may be at least a part of the capacitor included in the third nonlinear element 50C or the like. At least a part of the conductive member 86*b* is electrically connected to the conductive portion 85.

Figure 35H:
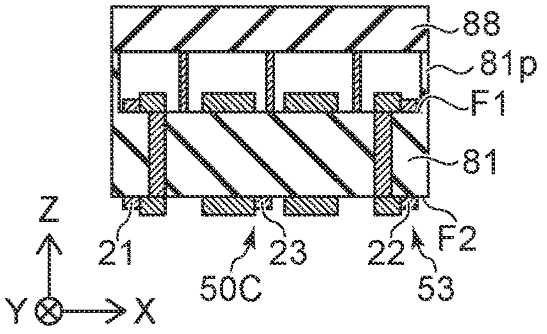
Figure 35I:
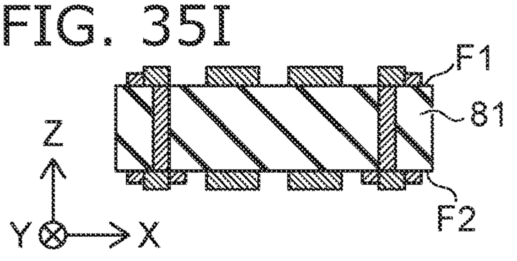

As shown in FIG. 35H, the first Josephson junction 21, the second Josephson junction 22, and the third Josephson junction 23 are formed on the second surface F2. These Josephson junctions are included in the Josephson junction circuit 53 of the third nonlinear element 50C. As described above, in this manufacturing method, the third nonlinear element 50C including the Josephson junction circuit 53 is formed on the second surface F2 of the first substrate 81. The first surface F1 is between the second surface F2 and the first member 88.

As shown in FIG. 35J, the first member 88 is removed. Further, the protrusion 81*p* of the first substrate 81 is removed. Thereby, for example, the electronic circuit 110 is obtained.

The embodiment may include the following configuration (technical proposal).

Configuration 1

An electronic circuit, comprising:

a first nonlinear element including a first element Josephson junction provided in a first region of a first surface including the first region and a second region;

a second nonlinear element including a second element Josephson junction provided in the second region; and a third nonlinear element including a Josephson junction circuit, at least a part of the Josephson junction circuit being provided on a second surface, the second surface being separated from the first surface in a first direction crossing the first surface, the second surface being along the first surface, the third nonlinear element being configured to be coupled with the first nonlinear element, the third nonlinear element being configured to be coupled with the second nonlinear element.

Configuration 2

The electronic circuit according to Configuration 1, further comprising:

a first substrate, the first surface being one surface of the first substrate, and the second surface being an other surface of the first substrate.

Configuration 3

The electronic circuit according to Configuration 2, wherein the Josephson junction circuit includes a first Josephson junction, a second Josephson junction, and a third Josephson junction, the third nonlinear element further includes a first conductive member, a second conductive member, and a third conductive member, the first conductive member connects one end of the first Josephson junction to one end of the third Josephson junction, the second conductive member connects one end of the second Josephson junction to an other end of the third Josephson junction, the third conductive member connects other end of the first Josephson junction to an other end of the second Josephson junction, the first Josephson junction, the second Josephson junction, the third Josephson junction, the first conductive member, the second conductive member, and the third conductive member form a loop, the first nonlinear element is configured to be coupled with the first conductive member, and the second nonlinear element is configured to be coupled with the second conductive member.

Configuration 4

The electronic circuit according to Configuration 3, further comprising:

a first element conductive portion extending in the first substrate in the first direction, the first element conductive portion being electrically connected to the first nonlinear element, or being configured to be coupled with the first nonlinear element, and the first element conductive portion being electrically connected to the first conductive member, or being configured to be coupled with the first conductive member.

Configuration 5

The electronic circuit according to Configuration 3 or 4, further comprising:

a second element conductive portion extending in the first substrate in the first direction, the second element conductive portion being electrically connected to the second nonlinear element, or being configured to be coupled with the second nonlinear element, and the second element conductive portion being electrically connected to the second conductive member, or being configured to be coupled with the second conductive member.

Configuration 6

The electronic circuit according to any one of Configurations 3 to 5, further comprising:

a first element resonator configured to be coupled with the first nonlinear element; and a first element terminal configured to be coupled with the first element resonator.

Configuration 7

The electronic circuit according to Configuration 6, wherein at least one of at least a part of the first element resonator, at least a part of the first element terminal, at least a part of the second element resonator, or at least a part of the second element terminal is provided on the first surface.

Configuration 8

The electronic circuit according to Configuration 7, further comprising:

a second substrate including a third surface and a fourth surface, the fourth surface facing the first surface, the fourth surface being between the first surface and the third surface;

a first counter electrode provided on the fourth surface; and a second counter electrode provided on the fourth surface, the first counter electrode being configured to be coupled with the first element terminal, and the second counter electrode being configured to be coupled with the second element terminal.

Configuration 9

The electronic circuit according to Configuration 8, further comprising:

a first read-out electrode provided on the third surface; and a first read-out conductive portion extending in the second substrate in the first direction and electrically connecting the first counter electrode to the first read-out electrode.

Configuration 10

The electronic circuit according to Configuration 8 or 9, further comprising:

a third substrate including a fifth surface and a sixth surface, the fifth surface facing the second surface, the fifth surface being between the sixth surface and the second surface; and a magnetic flux controller provided on the fifth surface and configured to control a magnetic flux of a space in the loop.

Configuration 11

The electronic circuit according to any one of Configurations 1 to 9, further comprising:

a third substrate including a fifth surface and a sixth surface, the fifth surface facing the second surface, the fifth surface being between the sixth surface and the second surface;

a first control conductive member provided on the fifth surface; and a first control conductive portion extending in the third substrate in the first direction, and electrically connected to a part of the first control conductive member.

Configuration 12

The electronic circuit according to Configuration 1, further comprising:

a first substrate; and a second substrate, the first surface is one surface of the first substrate, and the second surface is one surface of the second substrate.

Configuration 13

An electronic circuit, comprising:

a first nonlinear element including a first element Josephson junction provided on a first surface;

a second nonlinear element including a second element Josephson junction provided on a second surface, the second surface being separated from the first surface in a first direction crossing the first surface and being along the first surface; and a third nonlinear element including a Josephson junction circuit, the third nonlinear element being configured to be coupled with the first nonlinear element, the third nonlinear element being configured to be coupled with the second nonlinear element.

Configuration 14

The electronic circuit according to Configuration 13, wherein at least a part of the Josephson junction circuit is provided one of the first surface and the second surface.

Configuration 15

The electronic circuit according to Configuration 13 or 14, wherein the Josephson junction circuit is configured to be coupled with a first element Josephson junction, the Josephson junction circuit is configured to be coupled with a second element Josephson junction, a plurality of the second element Josephson junctions are provided on the second surface, a direction from one of the plurality of second element Josephson junctions to an other one of the plurality of second element Josephson junctions is along a second direction crossing the first direction, the third element Josephson junction is configured to be coupled with one of the plurality of second element Josephson junctions, and a position of an other one of the plurality of second element Josephson junctions in the second direction is between a position the first element Josephson junction in the second direction and a position of the one of the plurality of second element Josephson junctions in the second direction.

Configuration 16

The electronic circuit according to any one of Configurations 13 to 15, wherein the Josephson junction circuit includes a first Josephson junction, a second Josephson junction, and a third Josephson junction, the third nonlinear element further includes a first conductive member, a second conductive member, and a third conductive member, the first conductive member connects one end of the first Josephson junction to one end of the third Josephson junction, the second conductive member connects one end of the second Josephson junction to an other end of the third Josephson junction, the third conductive member connects an other end of the first Josephson junction to an other end of the second Josephson junction, the first Josephson junction, the second Josephson junction, the third Josephson junction, the first conductive member, the second conductive member, and the third conductive member form a loop, the first nonlinear element is configured to be coupled with the first conductive member, and the second nonlinear element is configured to be coupled with the second conductive member.

Configuration 17

The electronic circuit according to Configuration 1 or 13, wherein the Josephson junction circuit includes a first inductor, a second inductor, and a third inductor, the third nonlinear element further includes a first conductive member, a second conductive member, and a third conductive member, the first conductive member connects one end of the first inductor to one end of the third Josephson junction, the second conductive member connects one end of the second inductor to an other end of the third Josephson junction, the third conductive member connects an other end of the first inductor to an other end of the second inductor, the first Josephson junction, the second Josephson junction, the third Josephson junction, the first conductive portion, the second conductive portion, and the third conductive portion form a loop, the first nonlinear element is configured to be coupled with the first conductive member, and the second nonlinear element is configured to be coupled with the second conductive member.

Configuration 18

The electronic circuit according to any one of configurations 1 to 17, further comprising:

a first control terminal, a first control signal for controlling the first nonlinear element can be applied to the first control terminal.

Configuration 19

The electronic circuit according to any one of Configurations 3 to 9, 16, and 17, further comprising:

a magnetic flux controller configured to control a magnetic flux of a space in the loop.

Configuration 20

A calculation device, comprising:

the electronic circuit according to Configuration 10 or 19; and a controller, the magnetic flux controller including a first control conductive portion, and the controller being configured to supply a magnetic flux signal to the first control conductive portion.

Configuration 21

The calculation device according to configuration 20, wherein a coupling strength between the first nonlinear element and the second nonlinear element changes according to a magnetic flux in the space.

Configuration 22

The calculation device according to Configuration 20 or 21, wherein the third nonlinear element can resonate in a plurality of modes, and a resonant frequency in each of the plurality of modes is higher than a resonant frequency of the first nonlinear element, higher than a resonant frequency of the second nonlinear element, and lower than a sum of the resonant frequency of the first nonlinear element and the resonant frequency of the second nonlinear element.

Configuration 23

The calculation device according to any one of configurations 20 to 22, wherein the controller is configured to perform at least one of a first operation or a second operation, in the first operation, the controller performs a two-qubit operation of the first nonlinear element and the second nonlinear element by changing the magnetic flux between a first value and a second value different from the first value, and in the second operation, the controller performs the two-qubit operation of the first nonlinear element and the second nonlinear element by modulating the magnetic flux with alternating current.

Configuration 24

A method for manufacturing an electronic circuit, comprising:

forming a first nonlinear element and a second nonlinear element on a first surface of a first substrate, the first nonlinear element including a first element Josephson junction, the second nonlinear element including a second element Josephson junction;

providing a first member including a recess, the first nonlinear element and the second nonlinear element being between the first substrate and the recess; and forming a third nonlinear element including a Josephson junction circuit on a second surface of the first substrate, the first surface being between the second surface and the first member.

Configuration 25

A method for manufacturing an electronic circuit, comprising:

forming a first nonlinear element and a second nonlinear element in a recess of a first surface of a first substrate, the first nonlinear element including a first element Josephson junction, the second nonlinear element including a second element Josephson junction;

providing a first member, the first nonlinear element and the second nonlinear element being between the first substrate and the first member; and forming a third nonlinear element including a Josephson junction circuit on a second surface of the first substrate, the first surface being between the second surface and the first member.

According to the embodiment, it is possible to provide an electronic circuit and a calculation device capable of improving controllability.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electronic circuits or calculation devices such as nonlinear elements, Josephson junctions, capacitors, conductive members, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electronic circuits, and calculation devices practicable by an appropriate design modification by one skilled in the art based on the electronic circuits, and the calculation devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electronic circuit comprising:

a first nonlinear element including a first element Josephson junction provided in a first region of a first surface of a first substrate, the first surface including the first region and a second region;

a second nonlinear element including a second element Josephson junction provided in the second region; and a third nonlinear element including a Josephson junction circuit, at least a part of the Josephson junction circuit being provided on a second surface, the second surface being separated from the first surface in a first direction crossing the first surface, the second surface being along the first surface, the third nonlinear element being configured to be coupled with the first nonlinear element, the third nonlinear element being configured to be coupled with the second nonlinear element, wherein the Josephson junction circuit includes a first Josephson junction, a second Josephson junction, and a third Josephson junction, the third nonlinear element further includes a first conductive member, a second conductive member, and a third conductive member, the first conductive member connects one end of the first Josephson junction to one end on the third Josephson junction, the second conductive member connects one end of the second Josephson junction to an other end of the third Josephson junction, the third conductive member connects an other end of the first Josephson junction to an other end of the second Josephson junction, the first Josephson junction, the second Josephson junction, the third Josephson junction, the first conductive member, the second conductive member, and the third conductive member form a loop, the first nonlinear element is configured to be coupled with the first conductive member, and the second nonlinear element is configured to be coupled with the second conductive member.

2. The circuit according to claim 1, further comprising:

a first element conductive portion extending in the first substrate in the first direction, the first element conductive portion being electrically connected to the first nonlinear element, or being configured to be coupled with the first nonlinear element, and the first element conductive portion being electrically connected to the first conductive member, or being configured to be coupled with the first conductive member.

3. The circuit according to claim 1, further comprising:

a second element conductive portion extending in the first substrate in the first direction, the second element conductive portion being electrically connected to the second nonlinear element, or being configured to be coupled with the second nonlinear element, and the second element conductive portion being electrically connected to the second conductive member, or being configured to be coupled with the second conductive member.

4. The circuit according to claim 1, further comprising:

a first element resonator configured to be coupled with the first nonlinear element; and a first element terminal configured to be coupled with the first element resonator.

5. The circuit according to claim 4, wherein at least one of at least a part of the first element resonator, or at least a part of the first element terminal is provided on the first surface.

6. The circuit according to claim 5, further comprising:

a second substrate including a third surface and a fourth surface, the fourth surface facing the first surface, the fourth surface being between the first surface and the third surface;

a first counter electrode provided on the fourth surface;

the first counter electrode being configured to be coupled with the first element terminal.

7. The circuit according to claim 6, further comprising:

a first read-out electrode provided on the third surface; and a first read-out conductive portion extending in the second substrate in the first direction and electrically connecting the first counter electrode to the first read-out electrode.

8. The circuit according to claim 1, further comprising:

a second substrate including a third surface and a fourth surface, the third surface facing the second surface, the third surface being between the fourth surface and the second surface; and a magnetic flux controller provided on the third surface and configured to control a magnetic flux of a space in the loop.

9. The circuit according to claim 1, further comprising:

a second substrate including a third surface and a fourth surface, the third surface facing the second surface, the third surface being between the fourth surface and the second surface;

a first control conductive member provided on the third surface; and a first control conductive portion extending in the second substrate in the first direction, and electrically connected to a part of the first control conductive member.

10. The circuit according to claim 1, further comprising:

a first substrate; and a second substrate, the first surface is one surface of the first substrate, and the second surface is one surface of the second substrate.

11. The circuit according to claim 1, further comprising:

a magnetic flux controller configured to control a magnetic flux of a space in the loop.

12. A calculation device, comprising:

the electronic circuit according to claim 8; and a controller, the magnetic flux controller including a first control conductive portion, and the controller being configured to supply a magnetic flux signal to the first control conductive portion.

13. The device according to claim 12, wherein a coupling strength between the first nonlinear element and the second nonlinear element changes according to a magnetic flux in the space.

14. The device according to claim 12, wherein the third nonlinear element can resonate in a plurality of modes, and a resonant frequency in each of the modes is higher than a resonant frequency of the first nonlinear element, higher than a resonant frequency of the second nonlinear element, and lower than a sum of the resonant frequency of the first nonlinear element and the resonant frequency of the second nonlinear element.

15. The device according to claim 12, wherein the controller is configured to perform at least one of a first operation or a second operation, in the first operation, the controller performs a two-qubit operation of the first nonlinear element and the second nonlinear element by changing the magnetic flux between a first value and a second value different from the first value, and in the second operation, the controller performs the two-qubit operation of the first nonlinear element and the second nonlinear element by modulating the magnetic flux with alternating current.

16. An electronic circuit, comprising:

a first nonlinear element including a first element Josephson junction provided on a first surface of a substrate;

a second nonlinear element including a second element Josephson junction provided on a second surface of the substrate, the second surface being separated from the first surface in a first direction crossing the first surface and being along the first surface; and a third nonlinear element including a Josephson junction circuit, the third nonlinear element being configured to be coupled with the first nonlinear element, the third nonlinear element being configured to be coupled with the second nonlinear element, wherein the Josephson junction circuit includes a first Josephson junction, a second Josephson junction, and a third Josephson junction, the third nonlinear element further includes a first conductive member, a second conductive member, and a third conductive member, the first conductive member connects one end of the first Josephson junction to one end on the third Josephson junction, the second conductive member connects one end of the second Josephson junction to an other end of the third Josephson junction, the third conductive member connects an other end of the first Josephson junction to an other end of the second Josephson junction, the first Josephson junction, the second Josephson junction, the third Josephson junction, the first conductive member, the second conductive member, and the third conductive member form a loop, the first nonlinear element is configured to be coupled with the first conductive member, and the second nonlinear element is configured to be coupled with the second conductive member.

17. An electronic circuit comprising:

a first nonlinear element including a first element Josephson junction provided in a first region of a first surface including the first region and a second region;

a second nonlinear element including a second element Josephson junction provided in the second region; and a third nonlinear element including a Josephson junction circuit, at least a part of the Josephson junction circuit being provided on a second surface, the second surface being separated from the first surface in a first direction crossing the first surface, the second surface being along the first surface, the third nonlinear element being configured to be coupled with the first nonlinear element, the third nonlinear element being configured to be coupled with the second nonlinear element, wherein the Josephson junction circuit includes a first inductor, a second inductor, and a third inductor, the third nonlinear element further includes a first conductive member, a second conductive member, and a third conductive member, the first conductive member connects one end of the first inductor to one end of the third inductor, the second conductive member connects one end of the second inductor to an other end of the third inductor, the third conductive member connects an other end of the first inductor to an other end of the second inductor, the first inductor, the second inductor, the third inductor, the first conductive member, the second conductive member, and the third conductive member form a loop, the first nonlinear element is configured to be coupled with the first conductive member, and the second nonlinear element is configured to be coupled with the second conductive member.

* * * * *